United States Patent
Lin et al.

(10) Patent No.: US 12,482,744 B2
(45) Date of Patent: Nov. 25, 2025

(54) SUBTRACTIVELY PATTERNED INTERCONNECT STRUCTURES FOR INTEGRATED CIRCUITS

(71) Applicant: Intel Corporation, Santa Clara, CA (US)

(72) Inventors: Kevin Lin, Beaverton, OR (US); Noriyuki Sato, Hillsboro, OR (US); Tristan Tronic, Aloha, OR (US); Michael Christenson, Beaverton, OR (US); Christopher Jezewski, Portland, OR (US); Jiun-Ruey Chen, Hillsboro, OR (US); James M. Blackwell, Portland, OR (US); Matthew Metz, Portland, OR (US); Miriam Reshotko, Portland, OR (US); Nafees Kabir, Hillsboro, OR (US); Jeffery Bielefeld, Forest Grove, OR (US); Manish Chandhok, Beaverton, OR (US); Hui Jae Yoo, Hillsboro, OR (US); Elijah Karpov, Portland, OR (US); Carl Naylor, Portland, OR (US); Ramanan Chebiam, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/668,038

(22) Filed: May 17, 2024

(65) Prior Publication Data

US 2024/0304543 A1    Sep. 12, 2024

Related U.S. Application Data

(63) Continuation of application No. 17/841,551, filed on Jun. 15, 2022, now Pat. No. 12,027,458, which is a
(Continued)

(51) Int. Cl.
*H01L 23/522* (2006.01)
*H01L 21/3213* (2006.01)
(Continued)

(52) U.S. Cl.
CPC .... *H01L 23/5226* (2013.01); *H01L 21/32139* (2013.01); *H01L 21/76819* (2013.01);
(Continued)

(58) Field of Classification Search
CPC .......... H01L 23/5226; H01L 21/32139; H01L 21/76819; H01L 21/7682; H01L 21/76843; H01L 23/5283; H01L 23/53209
See application file for complete search history.

(56) References Cited

U.S. PATENT DOCUMENTS

| 6,448,591 B1 | 9/2002 | Juengling |
| 6,509,274 B1 | 1/2003 | Guo et al. |

(Continued)

FOREIGN PATENT DOCUMENTS

| EP | 0195977 | 10/1986 |
| EP | 0288802 | 11/1988 |

(Continued)

OTHER PUBLICATIONS

Office Action from Taiwanese Patent Application No. 110134854 notified Jan. 7, 2025, 14 pgs.

(Continued)

*Primary Examiner* — Karen Kusumakar
(74) *Attorney, Agent, or Firm* — Essential Patents Group, LLP

(57) ABSTRACT

IC interconnect structures including subtractively patterned features. Feature ends may be defined through multiple patterning of multiple cap materials for reduced misregistration. Subtractively patterned features may be lines integrated with damascene vias or with subtractively patterned
(Continued)

vias, or may be vias integrated with damascene lines or with subtractively patterned lines. Subtractively patterned vias may be deposited as part of a planar metal layer and defined currently with interconnect lines. Subtractively patterned features may be integrated with air gap isolation structures. Subtractively patterned features may be include a barrier material on the bottom, top, or sidewall. A bottom barrier of a subtractively patterned features may be deposited with an area selective technique to be absent from an underlying interconnect feature. A barrier of a subtractively patterned feature may comprise graphene or a chalcogenide of a metal in the feature or in a seed layer.

19 Claims, 55 Drawing Sheets

Related U.S. Application Data continuation of application No. 17/087,519, filed on Nov. 2, 2020, now Pat. No. 11,444,024.

(51) Int. Cl.
  H01L 21/768    (2006.01)
  H01L 23/528    (2006.01)
  H01L 23/532    (2006.01)

(52) U.S. Cl.
  CPC .... H01L 21/7682 (2013.01); H01L 21/76843 (2013.01); H01L 23/5283 (2013.01); H01L 23/53209 (2013.01)

(56) References Cited

U.S. PATENT DOCUMENTS

| | | | |
|---|---|---|---|
| 6,926,590 B1 | 8/2005 | Chang et al. | |
| 6,972,985 B2 | 12/2005 | Rinerson et al. | |
| 8,432,040 B2 | 4/2013 | Yu et al. | |
| 8,848,424 B2 | 9/2014 | Ikeda et al. | |
| 8,975,138 B2 | 3/2015 | Chandhok et al. | |
| 10,825,515 B1 | 11/2020 | Kim | |
| 11,205,618 B2 | 12/2021 | Yang et al. | |
| 11,239,156 B2 | 2/2022 | Karpov et al. | |
| 11,444,024 B2 | 9/2022 | Lin et al. | |
| 2001/0054769 A1 | 12/2001 | Raaijmakers et al. | |
| 2002/0155693 A1 | 10/2002 | Hong et al. | |
| 2002/0182855 A1 | 12/2002 | Agarwala et al. | |
| 2004/0152330 A1 | 8/2004 | Yu et al. | |
| 2005/0153544 A1 | 7/2005 | Suh et al. | |
| 2005/0191846 A1 | 9/2005 | Cheung et al. | |
| 2006/0286797 A1 | 12/2006 | Zhang et al. | |
| 2007/0020923 A1 | 1/2007 | Kraus et al. | |
| 2008/0132057 A1 | 6/2008 | Feustel et al. | |
| 2013/0069238 A1 | 3/2013 | Usami et al. | |
| 2015/0056800 A1 | 2/2015 | Mebarki et al. | |
| 2016/0233159 A1 | 8/2016 | Song et al. | |
| 2017/0338148 A1 | 11/2017 | Shusterman et al. | |
| 2017/0372960 A1 | 12/2017 | Mebarki et al. | |
| 2019/0006230 A1 | 1/2019 | Kuo et al. | |
| 2019/0304836 A1 | 10/2019 | Kikuchi et al. | |
| 2019/0304902 A1 | 10/2019 | Subramanian et al. | |
| 2020/0105592 A1 | 4/2020 | Kuo et al. | |
| 2020/0118872 A1 | 4/2020 | Chen et al. | |
| 2020/0168500 A1 | 5/2020 | Lazzarino et al. | |
| 2021/0082829 A1* | 3/2021 | Yang | H01L 21/76867 |
| 2021/0143085 A1 | 5/2021 | Cheng et al. | |
| 2021/0398996 A1 | 12/2021 | Parekh | |
| 2022/0139772 A1 | 5/2022 | Jezewski et al. | |
| 2022/0139823 A1 | 5/2022 | Lin et al. | |

FOREIGN PATENT DOCUMENTS

| | | |
|---|---|---|
| EP | 3671821 | 6/2020 |
| EP | 3945556 | 2/2022 |
| JP | 2005012016 | 1/2005 |
| WO | 2001015220 | 3/2001 |

OTHER PUBLICATIONS

International Preliminary Report on Patentability from PCT/US2021/051146 notified May 11, 2023, 8 pgs.

International Search Report and Written Opinion from PCT/US2021/051146 notified Jan. 7, 2022, 14 pgs.

Non-Final Office Action from U.S. Appl. No. 17/087,519 notified Feb. 15, 2022, 15 pgs.

Non-Final Office Action from U.S. Appl. No. 17/841,551 notified Nov. 22, 2023, 9 pgs.

Notice of Allowance from U.S. Appl. No. 17/087,519 notified May 25, 2022, 8 pgs.

Notice of Allowance from U.S. Appl. No. 17/087,519 notified Nov. 1, 2021, 9 pgs.

Notice of Allowance from U.S. Appl. No. 17/841,551 notified Feb. 29, 2024, 8 pgs.

Lin, Kevin L., et al., "Staggered Metallization with Air gaps for Independently Tuned Interconnect Resistance and Capacitance", 2020 IEEE, 4 pgs.

Merkx, Marc J. M., et al., "Area-Selective Atomic Layer Deposition of TIN Using Aromatic Inhibitor Molecules for Metal/Dielectric Selectivity", Chemistry of Materials, 2020, 8 pgs.

* cited by examiner

SUBTRACTIVELY PATTERNED INTERCONNECT STRUCTURES FOR INTEGRATED CIRCUITS

CLAIM OF PRIORITY

This application is a continuation of, and claims the benefit of priority to, U.S. patent application Ser. No. 17/841,551, filed on Jun. 15, 2022 and titled "SUBTRACTIVELY PATTERNED INTERCONNECT STRUCTURES FOR INTEGRATED CIRCUITS," which is a continuation of, and claims priority to, U.S. patent application Ser. No. 17/087,519, filed on Nov. 2, 2020 and titled "SUBTRACTIVELY PATTERNED INTERCONNECT STRUCTURES FOR INTEGRATED CIRCUITS," now U.S. Pat. No. 11,444,024 issued on Sep. 13, 2022, which are incorporated by reference in entirety.

BACKGROUND

Demand for higher performance integrated circuits (ICs) in electronic device applications has motivated increasingly dense transistor architectures. Interconnect parasitics become a greater challenge as the density of interconnect structures keeps pace with transistor density. For example, the resistance-capacitance (RC) delay associated with interconnects of an IC increases with the density of the interconnects.

FIG. 1A illustrates a conventional interconnect structure that includes a metal line 101 within a lower interconnect level. A transverse width of a top of metal line 101 has a design lateral critical dimension CD1. One or more dielectric materials 102 is over metal line 101, and a via opening 103 has been subtractively patterned (e.g., etched) through dielectric material 102 in the z-dimension to expose a portion of metal line 101. As shown, the etch of dielectric materials 102 generally forms a tapered via sidewall so that the lateral critical dimension CD3 at the via top is larger than critical dimension CD2 at the via bottom. In the illustrated dual-damascene structure, via opening 103 is overlapped by a trench 106. As for via opening 103, trench 106 typically also has some positive sidewall slope angle α from the 90° vertical ideal such that a top CD of trench 106 is larger than a bottom critical dimension CD4.

As further illustrated in FIG. 1B, via 103 and trench 106 have been filled with one or more metals to form a metal line 108 and via 109 within a second interconnect level. Metal line 108 extends in the x-y dimension of the second interconnect level with the line metal also filling in via opening 103 so that the first and second interconnect levels are electrically connected. With damascene metallization technology, fill metal 107 (e.g., Cu) is deposited (e.g. electrochemically plated). In duel-damascene techniques, both a via opening and an overlying trench are etched into dielectric materials 102 and then filled with metal concurrently. Via opening and/or trench aspect ratios (e.g., depth:width) increase with greater device density. To combat excessive aspect ratios, via openings and trenches may be patterned and filled separately according to a single-damascene technique.

In the illustrated example, a diffusion barrier material lines surfaces of trench 106 and via 103. A barrier material portion 105A is in contact with a via sidewall of dielectric materials 102, and a barrier material portion 105B is on a bottom of via 103. Barrier material portion 105C is similarly in contact with a trench sidewall of dielectric materials 102, and a barrier material portion 105D is on a bottom of trench 106. The barrier material is to prevent diffusion/migration of a fill metal 107 out of the interconnect structure, as any loss of fill metal 107 is generally catastrophic to an integrated circuit. Barrier material typically has significantly higher electrical resistance than fill metal 107, so as structural dimensions scale, the barrier material threatens to become a greater portion of an interconnect structure, leading to higher interconnect resistances. Barrier material portion 105B, being at the interconnection with line 101, is particularly disadvantageous because there is little need for a diffusion barrier in this specific location and electrical resistance between via 103 and line 101 may be significantly increased by barrier material portion 105B.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been retained among the figures to indicate corresponding or analogous elements having substantially the same attributes. In the figures.

DETAILED DESCRIPTION OF EXEMPLARY EMBODIMENTS

Figure 1A:
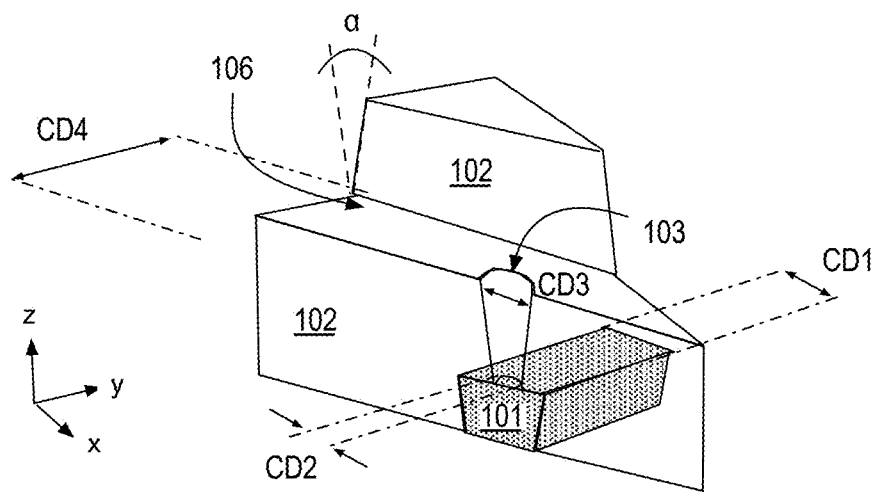
FIGS. 1A and 1B illustrate isometric cross-sectional views of an IC interconnect structure, in accordance with convention.
Figure 1B:
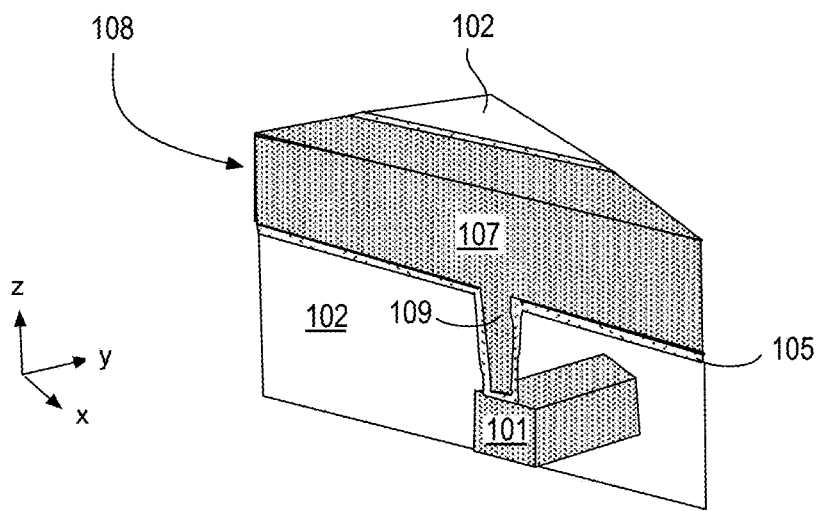

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described below are examples of integrated circuit interconnect structures that include subtractively patterned interconnect features. A subtractively patterned interconnect feature may be a line, a via, or as further described below, both a line and a via. Multiple patterning operations and material compositions may be utilized to subtractively define the interconnect features in a manner that significantly reduces misregistration or edge placement errors associated with ends of the features relative to another structural feature of an IC, such as an underlying device terminal or an interconnect via or line of a lower interconnect level, to which the subtractively patterned interconnect feature is to be interconnected. As used herein, misregistration is a lateral offset between where an edge of a patterned feature is positioned relative to an edge of an underlying IC feature. The underlying IC feature need not have been used as an actual reference feature to which subtractively patterned interconnect features were aligned, but the lateral offset between the underlying IC feature and the subtractively patterned interconnect features is nevertheless a manifestation of separate lithographic patterning operations. The lateral offset associated with misregistration may be separated into orthogonal (e.g., x-dimension and y-dimension) components. As described further below, the use of multiple patterning operations and/or material compositions in the definition interconnect features within one interconnect level may reduce the magnitude of misregistration and result in the misregistration of one subset of the interconnect features being independent of the misregistration of another subset of the interconnect features.

In some embodiments, as described further below, subtractive interconnect feature patterning is integrated with a damascene via process or damascene trench/line process to arrive at an interconnect structure that may have different via and line compositions and/or may otherwise leverage advantages of both damascene metal planarization and subtractive metal patterning techniques.

Following a subtractive patterning of interconnect features, one or more sidewall barrier materials may be deposited over exposed feature surfaces in embodiments where a barrier material and/or etch stop material is beneficial for IC performance or facilitates the further fabrication of additional, upper level, interconnect structures. A bottom barrier material and/or adhesion material may also be incorporated into a subtractive feature patterning process, for example by first depositing the barrier/adhesion material and then depositing one or more layers of metal onto the barrier/adhesion material. The bottom barrier/adhesion material may then be subtractively patterned in conjunction with the metal layers(s) as part of an interconnect line, for example. Alternatively, for embodiments where the bottom barrier/adhesion material is a dielectric, the bottom barrier/adhesion material may be incorporated into the interlayer dielectric (ILD) material of an IC interconnect structure.

In some embodiments, a bottom barrier material may be deposited with an area selective deposition technique with a growth area being on dielectric material and metal surfaces being non-growth areas. For example, in some embodiments a bottom barrier material may be formed everywhere an interconnect line extends over dielectric material, but avoided at the interface between interconnect lines and vias. Detrimental effects of the bottom barrier material on via resistance may therefore be reduced, for example.

In some embodiments, an interconnect feature, or a barrier material on the interconnect feature, may be doped or otherwise chemically passivated, for example through the introduction of a chalcogen into the interconnect feature or into a seed layer on a surface of the interconnect feature. The chalcogen doping and/or metal chalcogenide formation may enhance barrier performance for a given barrier thickness. Such doping or chemical passivation, may be advantageously introduced directly to free surfaces of an interconnect feature (line or via), further leveraging subtractive patterning to generate a higher performance interconnect structure. Subtractive interconnect feature patterning may also be leveraged to incorporate graphene into an interconnect structure, for example, as a line sidewall barrier material, or as a cap material over an interconnect line.

Subtractively patterned interconnect fabrication may, in some embodiments, be integrated with air gap fabrication technology, for example, to introduce voids between adjacent interconnect features (e.g., lines), and reduce parasitic interconnect capacitance. Such air gaps may be confined to between interconnect lines with interconnect vias remaining embedded within ILD material. Barrier and/or adhesion material may encapsulate interconnect lines to limit their interaction with an adjacent air gap.

Figure 2A:
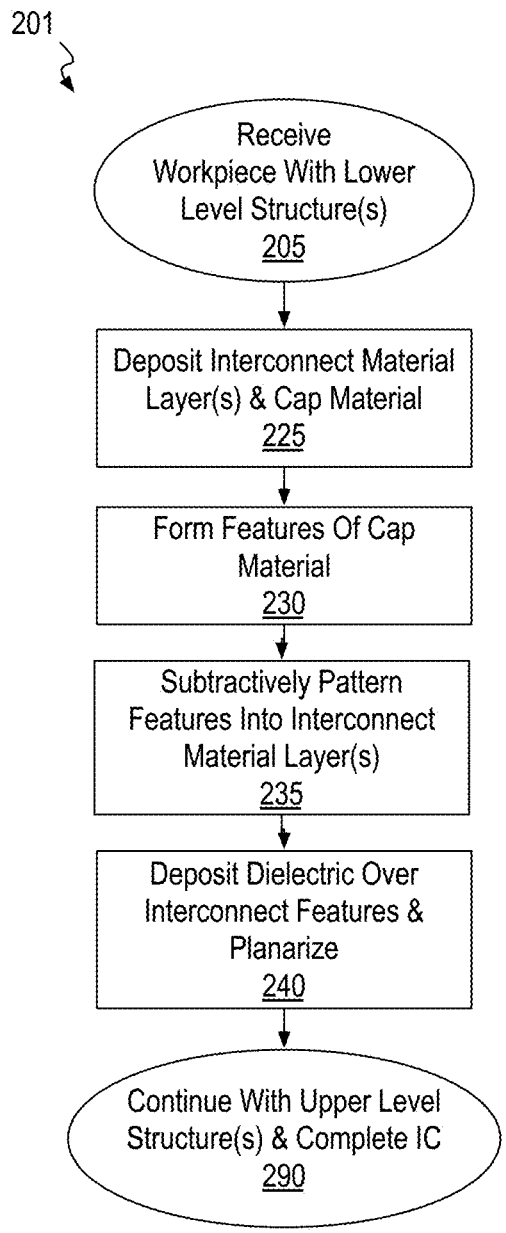
FIG. 2A is a flow diagram illustrating methods of forming an IC interconnect structure, in accordance with some embodiments.

FIG. 2A is a flow chart of methods 201 for fabricating integrated circuit interconnect structures, in accordance with some embodiments. Methods 201 begin at input 205 where a workpiece is received. In some embodiments, the workpiece includes a semiconductor wafer, such as a large format (e.g., 300-450 mm) wafer. The wafer may include a Group IV semiconductor material layer (e.g., Si, Ge, SiGe, GeSn, etc.), a Group III-V semiconductor material layer, or a Group II-VI semiconductor material layer, for example. The workpiece may include one or more device layers including a semiconductor material layer, and may also have one or more interconnect levels interconnecting devices (e.g. transistors) of the device layer(s). As received at input 205, the working surface of the workpiece may comprise any dielectric material(s) suitable as interlayer dielectric material (ILD). The dielectric material(s) may be directly over semiconductor device structures (e.g., gate, source and drain terminals of a transistor), or over any number of lower-level interconnect structures that are coupled to semiconductor device structures.

Methods 201 continue at block 225 where one or more conductive interconnect material layer(s) is deposited on the over the lower level structure(s) and surrounding dielectric. At least one of the interconnect material layers deposited at block 225 is to be subtractively patterned into interconnect features of one interconnect level. Those features may be either vias that provide a vertical conductive pathway through an interconnect level and/or between levels, or lines that provide a lateral or horizontal conductive pathway within an interconnect level. In exemplary embodiments where the workpiece surface is substantially planar at input 205, interconnect material layers deposited at block 225 will remain substantially planar and may have a highly uniform layer thickness. In some embodiments, only one conductive material layer is deposited at block 225. In other embodiments, a stack of material layers is deposited at block 225. For example, a bottom barrier and/or adhesion material layer may be deposited, and then a conductive interconnect material layer is deposited on the bottom barrier and/or adhesion material layer. In some exemplary embodiments, one or more cap materials are deposited over a conductive interconnect material layer. As described further below, the cap material(s) may facilitate subtractive patterning of the conductive interconnect material and/or may facilitate interconnection of the conductive interconnect material with an upper interconnect level. The cap material(s) may also function as a barrier material on a top of interconnect features. In some embodiments, the cap material(s) are a dielectric, and in other embodiments the cap material(s) are a metal, other electrical conductor, or a semiconductor. As described further below, cap material deposited at block 225 may be sacrificial material, or may be retained as permanent component of an IC interconnect structure.

Methods 201 continue at block 230 where interconnect features are subtractively patterned into the cap material and/or interconnect material that was deposited at block 225. Any form of subtractive patterning may be practiced at block 230, as embodiments are not limited in this context. For some embodiments, a mask pattern is formed through one or more photolithographic operations. For example, an extreme UV (EUV) or e-beam lithography process may be practiced to print lines (i.e., a grating) in a photoresist, such as, but not limited to, a chain-scission photoresist. The printed lines may then serve as a line mask pattern, according to which at least the cap material may be etched. In other embodiments, a directed self-assembly (DSA) patterning process may be practiced at block 225. For example, a di-block co-polymer may be applied to a surface of the workpiece and surface chemistry may dictate a phase separation of the co-polymer, one of which is developed away to arrive at the line mask pattern. Although a grating pattern is advantageous in many respects, any other feature pattern may be defined at block 230.

Once a mask pattern has been formed, any etch process known to be suitable for the composition of the cap material may be practiced at block 230 to subtractively pattern features into at least the cap material. In some exemplary embodiments, only the cap material is subtractively etched at block 230, for example with an etch process that is selective to the cap material that removes the cap material preferentially over the underlying layer(s). An etch process practiced at block 230 may, for example stop on an underlying metal layer. Notably, block 230 may include more than one patterning process. In some embodiments, for example as described further below, a multiple-patterning process may be practiced at block 230. As also described further below, in some double patterning embodiments, more than one cap material may be deposited at block 225, and each cap material may be separately patterned, for example with multiple etch process performed at block 230 that are each selective for one cap material relative to other cap material(s). As described further below, such a multiple patterning process may significantly reduce feature edge placement error relative to practicing a single patterning process at block 230.

Methods 201 continue at block 235 where features are patterned into the interconnect material layer, for example according to the feature pattern formed in the cap material. Patterning of the interconnect material layer may be accomplished through reactive ion etching (RIE), for example using a capacitively coupled plasma source (CCP), an inductively coupled plasma source (ICP), or an electron cyclotron resonance (ECR) plasma source. Any chemistry known to be suitable for the composition of the interconnect material layer may be energized by the plasma source. In exemplary embodiments one or more of $O_2$, $Cl_2$, $Br_2$, $CF_4$, $C_2F_6$, $C_4F_8$, $H_2$, $CH_4$, $CH_3CH_3$, $CH_3OH$, $CH_3CH_2OH$, Ar, He, or Xe are employed to etch through (i.e. remove) portions the line material layer not protected by the cap material. For some metals more difficult to subtractively pattern, such as Cu, a highly physical milling process may also be practiced, for examples with an ion beam etching (IBE) source where Ar or He ions are accelerated into the workpiece surface with high kinetic energies in order to sputter away exposed metal.

Methods 201 continue at block 240 where a dielectric material is deposited over the subtractively patterned conductive features. At block 240, dielectric material may be deposited to be in physical contact with sidewalls of the conductive features. The dielectric material may completely backfill spaces between adjacent conductive features. For example, a flowable dielectric may be deposited that planarizes, or at least partially fills in gaps between the conductive vias and/or lines from bottom-up to a desired height. The flowable dielectric may be, for example, a low-k material. Alternatively, or in addition, a dielectric material may be deposited over a workpiece by CVD. Dielectric materials may be planarized with a suitable CMP process. These techniques in combination maybe useful to fill a lower portion of cavities between interconnect features with low-k spin-on material while an upper portion can be filled with harder CVD dielectrics more suitable for CMP. In some embodiments, a dielectric material conformally deposited may not completely backfill spaces between adjacent interconnect features, and may instead follow and/or increase the topography of the interconnect features. Dielectric material may also be deposited non-conformally at block 240, for example to form voids or air gaps between adjacent interconnect lines, as described further below. Notably, multiple deposition processes may be practiced at block 240, and/or multiple dielectric materials deposited over the interconnect features. Where multiple deposition processes are practiced, multiple layers of dielectric material of different chemical compositions may be present, for example as described further elsewhere herein. In some embodiments, for example, a first encapsulation dielectric may be deposited conformally to be in direct physical contact with the interconnect features while a second occluding dielectric may be deposited non-conformally to bridge over voids or air gaps between adjacent interconnect features.

Methods 201 complete at output 290 where any upper level structure may be fabricated to complete an IC. Such an upper level structure may include an additional level of vias, for example. In some embodiments, that upper level vias are fabricated substantially as described above. An upper level structure may further include an additional level of interconnect features. In some embodiments, the upper level interconnect features are fabricated substantially as described above. In other embodiments, upper-level interconnect lines and vias may be fabricated individually with a single damascene technique, or concurrently with a dual-damascene technique. In still other embodiments, the upper-level structure includes no additional interconnect line levels and the IC interconnect structure is merely encapsulated in accordance with any techniques known to be suitable for an IC die.

Figure 2B:
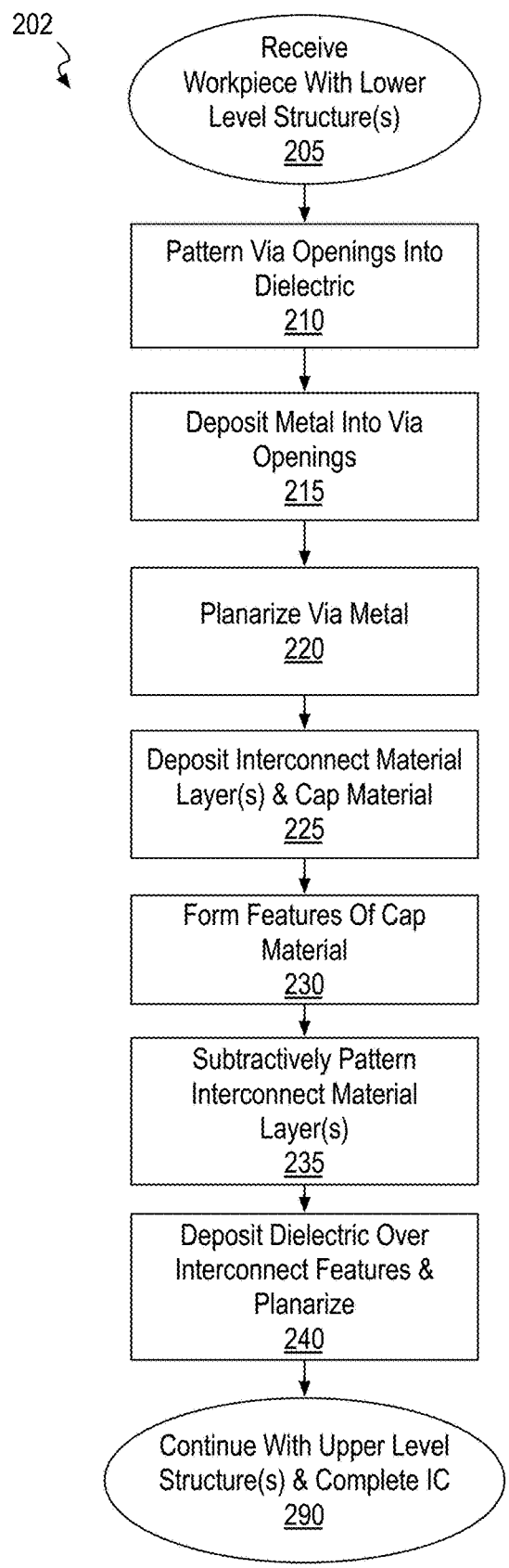
FIG. 2B is a flow diagram illustrating methods of forming IC interconnect lines, in accordance with some embodiments of the methods illustrated in FIG. 2A.
Figure 2C:
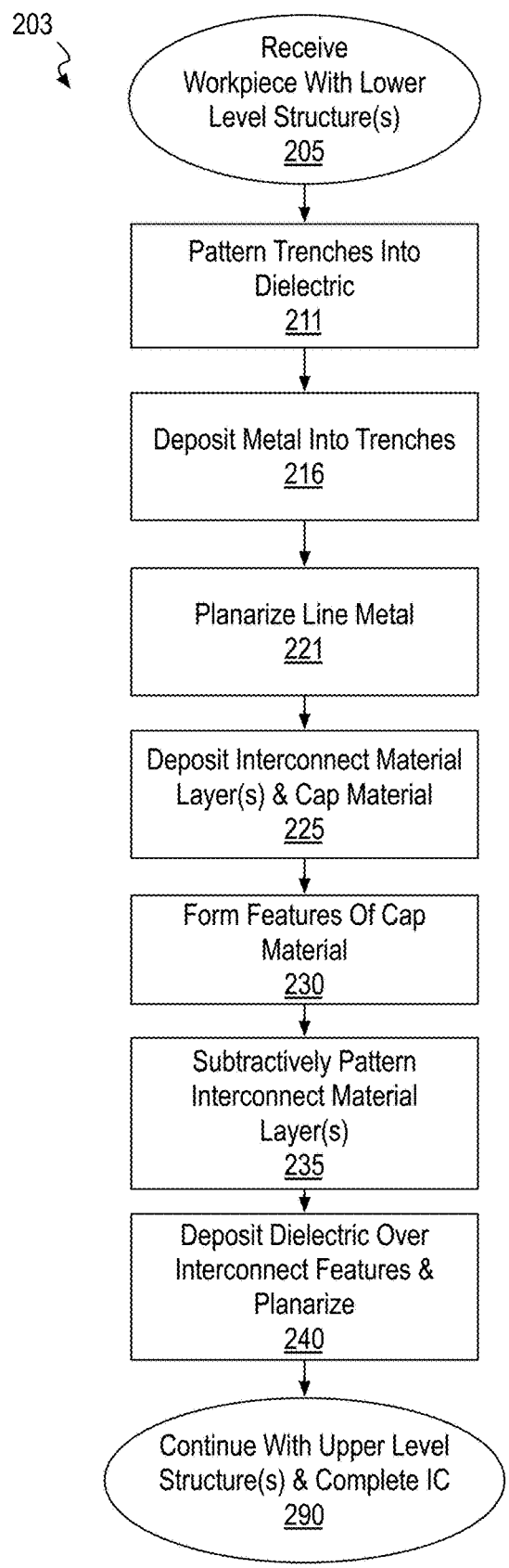
FIG. 2C is a flow diagram illustrating methods of forming IC interconnect via, in accordance with some embodiments of the methods illustrated in FIG. 2A.

As noted above, methods 201 are applicable to both subtractive patterning of interconnect lines and subtractive patterning of interconnect vias. FIG. 2B is a flow chart of methods 202 for fabricating integrated circuit interconnect structures, in accordance with some embodiments of methods 201 where interconnect lines are subtractively patterned. FIG. 2C is a flow chart of methods 203 for fabricating integrated circuit interconnect structures, in accordance with some embodiments of methods 201 where interconnect vias are subtractively patterned. FIG. 3A-3D illustrate cross-sectional views of an interconnect structure evolving as methods 202 or 203 are practiced.

Methods 202 (FIG. 2B) and methods 203 (FIG. 2C) separate the fabrication of interconnect vias and interconnect lines. In methods 202, a lower-level interconnect via is fabricated with a single-damascene technique, and an upper-level interconnect line is subtractively patterned, for example from a metal layer that is deposited over the damascene vias. In methods 203, a lower-level interconnect line is fabricated with a single-damascene technique, and an upper-level interconnect via is subtractively patterned, for example from a metal layer that is deposited over the damascene lines. Alternatively, the subtractive line and via patterning described in methods 202 and 203 may be combined together to pattern lines and vias in succession with purely subtractive processes. For such combinations, an interconnect structure would include no damascene via or damascene line.

In reference to both FIGS. 2B and 2C, methods 202 and 203 each begin at input 205 where the workpiece is received. The workpiece may be a semiconductor wafer, such as any of those described above and may again include one or more device layers comprising a semiconductor material layer. The workpiece may also have one or more interconnect levels interconnecting devices (e.g. transistors) of the device layer(s).

Methods 202 (FIG. 2B) continue at block 210 where via openings are subtractively patterned (e.g., etched) into one or more of the dielectric materials on the workpiece while methods 203 (FIG. 2C) continue at block 211 where trenches are etched into one or more of the dielectric materials. At each of blocks 210 and 211, any single-step or multi-step anisotropic reactive ion etch (RIE) process (e.g., based on a CxFy plasma chemistry) may be practiced to form via openings or trenches, as embodiments are not limited in this respect.

Figure 3A:
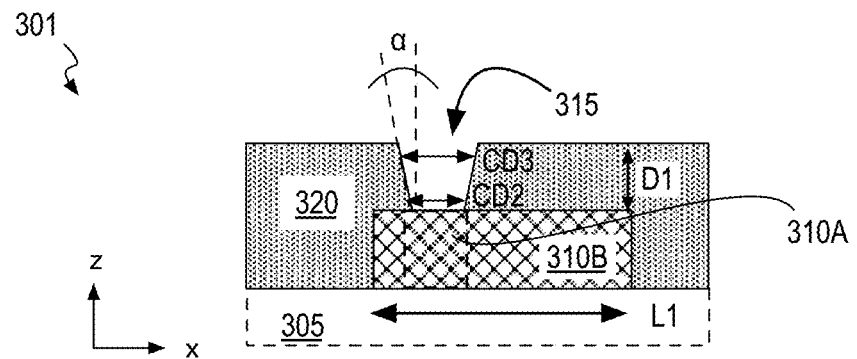
FIGS. 3A, 3B, 3C, and 3D illustrate cross-sectional views of an IC interconnect structure evolving as selected blocks of the methods illustrated in FIG. 2A are practiced, in accordance with some embodiments.

In the example illustrated in FIG. 3A, an interconnect structure 301 includes a via opening or trench 315 extending through a dielectric material 320. Dielectric material 320, for example, may be a low-k dielectric material (e.g., SiOC) having a relative permittivity below 3.5. In other examples, dielectric material 320 may be any of SiO, SiON, hydrogen silsesquioxane, methyl silsesquioxane, polyimide, polynorbornenes, benzocyclobutene, or the like. Dielectric material 320 may be deposited as a flowable oxide or spin-on material, for example, and have a substantially planar top surface.

Via opening or trench 315 may have any depth DI as a function of the dielectric material thickness, but in some exemplary embodiments is 10 nm-50 nm from an underlying conductive feature to a top co-planar with an overlying higher interconnect level (not depicted). In some embodiments, the underlying conductive feature is a transistor gate electrode or sour/drain terminal contact metal. In other embodiments, the underlying conductive feature is an interconnect via 310A (illustrated in dashed line) or an interconnect line 310B. A via opening may expose an underlying via or an underlying interconnect line while a trench typically exposes an underlying interconnect via. Interconnect via 310A or interconnect line 310B may be a damascene via line, for example. If longitudinal length L1 is significantly (e.g., 4×, or more) larger than a transverse width (e.g., in y-dimension of FIG. 3A), then the interconnect feature is a line 310B. An interconnect via 310A is best characterized as having a lateral dimension (e.g., CD2) that is nearly the same in both an x and y dimension over a plane of the workpiece. Interconnect via 310A may be circular or rectilinear, but if rectilinear it will have a lateral length in one planar dimension that is less than 4× the lateral length in the orthogonal planar dimension.

The underlying conductive feature may have any composition, with some interconnect line or via examples including a transition metal such as, but not limited to one or more of copper (Cu), tungsten (W), titanium (Ti), cobalt (Co), ruthenium (Ru), molybdenum (Mo), aluminum (Al), iridium (Ir), rhodium (Rh) or platinum (Pt). In some examples, interconnect via 310A or line 310B is formed, at least in part, by electrolytic plating. Interconnect via 310A or line 310B may then include a fill metal of predominantly Cu (e.g., a Cu-rich alloy). In other embodiments, interconnect via 310A or line 310B is deposited, at least in part, by chemical vapor deposition (CVD), atomic layer deposition (ALD), or physical vapor deposition (PVD). Interconnect via 310A or line 310B may then include a fill metal of any of Cu, W, Ru, Co, Mo, W, Ir, Rh, Pt, for example. Although not illustrated in FIG. 3A, interconnect via 310A or line 310B may include one or more barrier and/or adhesion material layers. Hence, interconnect via 310A or line 310B may not be a homogeneous structure of single chemical composition. Instead, interconnect via 310A or line 310B may comprise a fill metal, and, depending on the properties of that fill metal, the fill metal may be surrounded by a liner of barrier material that can retard outmigration of the fill metal into dielectric material 320. An adhesion layer may also be present, for example where either a barrier material or the fill metal has a low adhesion to an underlying dielectric material or barrier material. In some examples where interconnect via 310A or line 310B includes a fill metal of predominantly Cu, interconnect via 310A or line 310B further includes a barrier material comprising a metallic compound, such as, but not limited to, TaN. The composition of adhesion materials may also vary, with Ti and TiN being two examples. A capping layer may also be present, for example where either a barrier material layer and/or an etch stop material layer is over the film metal. The capping layer composition may be a metallic compound (e.g., Ta, TaN, etc.) or a dielectric material (e.g., SiO, SiON, SiN, etc.)

Similar to the underlying interconnect feature, via opening or trench 315 may be identified as a trench if it has a longitudinal length (e.g., in the y-dimension of FIG. 3A) significantly (e.g., at least 4×) larger than a transverse width (e.g., in the x-dimension of FIG. 3A), or a via opening if lateral lengths (e.g., in the x and y dimensions of FIG. 3A) are more similar. As further illustrated in FIG. 3A, the etch profile of via opening or trench 315 may be tapered, or sloped so as to deviate from normal to the plane of the workpiece by an angle $\alpha$, which may be 1-20°, for example. Via opening or trench 315 therefore has a top diameter CD3 larger than a bottom diameter CD2. Slope angle $\alpha$ may vary over a vertical height of the via, being slightly reentrant, for example.

Interconnect structure 301 is over a portion of an underlying substrate 305 that includes a device layer. The device layer is illustrated in dashed line to emphasize it is not part of the interconnect structure 301 and instead is shown in FIG. 3A to give context to interconnect structure 301. A plurality of devices may be within the device layer. In exemplary embodiments, the devices are metal-oxide-semiconductor field effect transistor (MOSFET) structures. However, the devices may also be other transistor types, such as, but not limited to other FET architectures, or bipolar junction transistors. The devices may also be other devices that include one or more semiconductor junctions (e.g., diodes, etc.).

Returning to FIG. 2B, methods 202 continue at block 215 where via material is deposited into the via openings that were formed at block 210. Methods 203 (FIG. 2C) likewise continue at block 216 where line metal is deposited in the trenches that were formed at block 211. The interconnect via or line material may comprise one or more conductive material and may include, for example, a barrier and/or adhesion material and a fill material. These materials may be any of those described above for interconnect via 310A or line 310B, for example. In some embodiments, an electrolytic plating process is practiced at block 215 to fill via openings or trenches with at least one metal, such as, but not limited to copper. Following the conductor fill, methods 202 continue at bock 220 where the via material is planarized, for example to be substantially coplanar with a surrounding dielectric material. Methods 203 similarly continue at block 221 where line material is planarized, for example to be substantially coplanar with a surrounding dielectric material. Any chemical mechanical planarization (CMP) process or dry (plasma) etchback process may be practiced at blocks 220 or 221, for example.

Methods 202 (FIG. 2B) and methods 203 (FIG. 2C) then each proceed to block 225 where one or more interconnect material layer(s) are deposited on the interconnect vias or lines, and surrounding dielectric. As noted above, at block 225 one or more cap materials may be advantageously deposited over a conductive material layer(s). For methods 202 (FIG. 2B) at least one of the interconnect material layers deposited at block 225 is to be subtractively patterned into interconnect lines. For methods 203 (FIG. 2C) at least one of the interconnect material layers deposited at block 225 is to be subtractively patterned into interconnect vias.

Methods 202 (FIG. 2B) and 203 (FIG. 2C) continue at block 230 where features are subtractively patterned into the cap material that was deposited at block 225. For methods 202, the features are lines. For methods 203, the features patterned into the cap material are vias. Any form of subtractive patterning may be practiced at block 230 as embodiments are not limited in this context. For some embodiments, a mask pattern is formed through one or more photolithographic operations. For example, an extreme UV (EUV) or e-beam lithography process may be practiced to print lines of a grating in a photoresist, such as, but not limited to, a chain-scission photoresist. The printed lines may then serve as a line mask pattern, according to which at least the cap material may be etched. In other embodiments, a directed self-assembly (DSA) patterning process may be practiced at block 230. For example, a di-block co-polymer may be applied to a surface of the workpiece and surface chemistry may dictate a phase separation of the co-polymer, one of which is developed away to arrive at the line mask pattern.

Once an interconnect feature mask has been formed, any etch process known to be suitable for the composition of the cap material(s) may be practiced at block 230 to subtractively pattern the feature pattern into at least the cap material. In some exemplary embodiments, only the cap material is subtractively etched at block 230, for example with an etch process that is selective to the cap material that removes the cap material preferentially over the underlying layer(s). As noted above, block 230 may include more than one patterning process. In some embodiments described further below, a multiple-patterning process is practiced at block 230. As also described further below, in some double patterning embodiments, more than one cap material may be deposited at block 225, and each cap material may be separately patterned, for example with multiple etch process that are selective for one cap material relative to the other cap material(s). As described further below, such a multiple patterning process may significantly reduce line edge placement error relative to practicing a single patterning process at block 230. Such a multiple patterning process may be practiced for either interconnect line or via patterning.

As also described further below, one or more additional mask pattern(s) may be further employed to bifurcate the lines formed in the interconnect material. In some examples, a second grating mask oriented non-parallel (e.g., substantially orthogonal) to the first grating mask is patterned and translated into the interconnect material lines, forming line end spaces between co-linear segments of the lines. The dimensions of these line end spaces may be adjusted depending on whether the lines are to be bifurcated into rows of co-linear lines, or rows of co-linear vias.

Figure 3B:
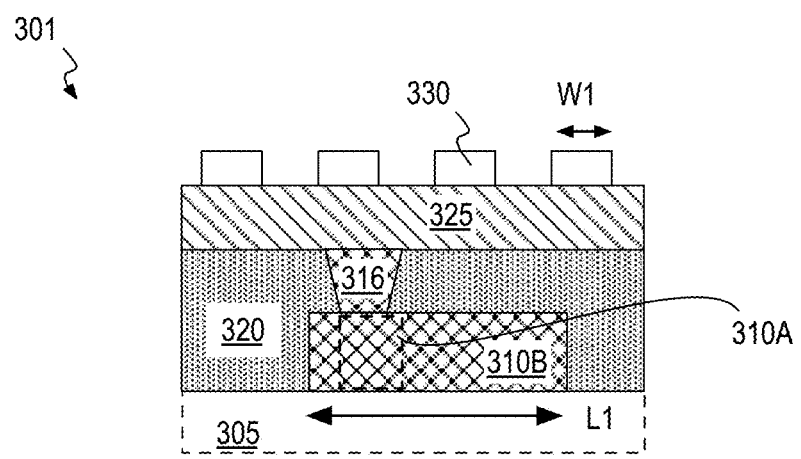

As shown in the example illustrated in FIG. 3B, interconnect structure 301 further includes interconnect feature 316. For embodiments of methods 202, interconnect feature 316 is a via in contact with interconnect line 310B. For embodiments of methods 203, interconnect feature 316 is a line extending into/out of the page, and in contact with interconnect via 310A. Feature 316 may have any composition, with some examples including at least one of Ru, Co, Mo, W, Ir, Rh, Pt, Al or Cu. In some examples, interconnect feature 316 comprises a fill metal of predominantly Cu (e.g., a Cu-rich alloy) deposited, at least in part, by electrolytic plating. In other embodiments, fill metal is deposited, at least in part, by chemical vapor deposition (CVD), atomic layer deposition (ALD), or physical vapor deposition (PVD), and feature 316 may include a fill metal of any of Al, Cu, W, Ru, Co, Mo, W, Ir, Rh, Pt, for example. Interconnect feature 316 may have the same composition as underlying feature 310. For example, where interconnect via 310A or line 310B has a fill metal, interconnect feature 316 may also include that same fill metal. In some embodiments, both feature 316 and interconnect via 310A/line 310B includes a fill metal that is predominantly Cu (e.g., a Cu-rich alloy). In other embodiments, feature 316 includes a fill metal that is predominantly Cu, while interconnect via 310A/line 310B is other than predominantly Cu. Hence, interconnect feature 316 and interconnect via 310A/line 310B, may have substantially the same composition, but need not necessarily have the same composition.

Although not illustrated in FIG. 3B, interconnect feature 316 may also include one or more barrier and/or adhesion material layers. Hence, interconnect feature 316 may not be a homogeneous structure of single chemical composition. Instead, depending on the properties of the fill metal, the fill metal may be surrounded by a liner of barrier material that can retard outmigration of the fill metal into dielectric material(s) 320. An adhesion layer may also be present, for example where either a barrier material or the fill metal has a low adhesion to an underlying material. In some examples where interconnect feature 316 includes a fill metal of predominantly Cu, interconnect feature 316 further includes a barrier material comprising a metallic compound, such as, but not limited to, TaN. The composition of adhesion materials may also vary, with Ti and TiN being two examples.

As further illustrated in FIG. 3B, a substantially planar conductive interconnect material layer 325 is in direct physical contact with both interconnect feature 316 and the surrounding dielectric material 320. Interconnect material layer 325 may have any thickness (i.e., along z-dimension) as embodiments are not limited in this respect. In some exemplary embodiments, interconnect material layer 325 has a thickness of 10-50 nm, or more. Whereas interconnect feature 316 can be any composition compatible with a damascene metal fill and polish fabrication technique, interconnect material layer 325 is to be subtractive patterned rather than polished back. Interconnect material layer 325 may therefore have any composition suitable for being subtractively patterned, for example through chemical etch and/or physical milling processes that offer sufficient rates of material removal. In some embodiments, interconnect material layer 325 may be predominantly a transition metal, such as, but not limited to, Cu, W, Ru, Co, Mo, W, Ir, Rh, Pt. Interconnect material layer 325 may further have a different composition than interconnect feature 316. For example, where interconnect feature 316 comprises a fill metal of Cu alloy, interconnect material layer 325 may be a metal other than copper. However, in some embodiments interconnect material layer 325 may have substantially the same composition as interconnect feature 316, for example with both feature 316 and interconnect material layer 325 being predominantly a copper alloy. Interconnect material layer 325 may also comprise other materials, such as, but not limited to, carbon nanotubes.

Interconnect material layer 325 is illustrated in FIG. 3B as being homogenous. However, a barrier material and/or an adhesion material layer may also be present, for example between interconnect material layer 325 and dielectric material 320. In some examples where interconnect material layer 325 is predominantly Cu, a barrier material comprising one or more metals (e.g., Ta, W, Ti, Al, Zn, Mn) and one or more of silicon (e.g., silicides), oxygen (e.g., metal oxides and silicates), nitrogen (e.g., metal nitrides such as TaN, WN) carbon (e.g., metal carbides and carbonitrides such as TaCN, WCN, TiCN), and/or a chalcogen dopant (e.g., Cu:S or CuS2) may be between interconnect material layer 325 and dielectric material 320. An adhesion layer, such as, but not limited to, Ti or TiN, may also be present between interconnect material layer 325 and dielectric material 320 (e.g., between a barrier layer and the dielectric material).

Features of cap material 330 over interconnect material layer 325 are further illustrated in FIG. 3B. For methods 202, the features of cap material 330 are lines, for example extending into/out of the page with a longitudinal length that is substantially orthogonal to longitudinal length L1 (e.g., y-dimension). The lines of cap material 330 have a transverse width W1 (e.g., x-dimension). Transverse width W1 may vary with implementation, for example from 10-100 nm. In exemplary embodiments, transverse width W1 is significantly less than the longitudinal length of the lines of cap material 330. For methods 203, the features of cap material 330 have via dimensions, for example with transverse width of approximately W1 in both x and y dimensions. Although the features of cap material 330 are depicted with ideal profiles having substantially vertical (e.g., z-dimension) sidewalls, it is appreciated that features of cap material 330 may instead have less idealized profiles, for example with tapered sidewall slopes and a top width being slightly smaller than a bottom width, which is typical for a subtractively patterned feature. Features of cap material 330 may have any thickness, but in some advantageous embodiments has a thickness less than 20 nm, and advantageously no more than 10 nm (e.g., 1-8 nm, etc.).

In some exemplary embodiments, features of cap material 330 comprise a dielectric material. The dielectric material may be a low-k dielectric material, for example having a relative permittivity less than about 3.5. The dielectric material may also be a conventional dielectric material a somewhat higher relative permittivity in the range of 3.5-9. The dielectric material may also be a high-k dielectric material having an even higher relative permittivity, for example exceeding 9.5. In some specific examples, cap material 330 is any of SiOC, hydrogen silsesquioxane, methyl silsesquioxane, polyimide, polynorbornene, benzocyclobutene SiN, SiO, SiON, HfO2, ZrO, or Al2O3, for example.

In other exemplary embodiments, features of cap material 330 comprise a conductor, or semiconductor material. For such embodiments, features of cap material 330 have a different composition than interconnect material layer 325. In some embodiments, features of cap material 330 are at least predominantly a metal. For embodiments where interconnect material layer 325 is also at least predominantly metal, features of cap material 330 are a metal of a different composition than interconnect material layer 325. For example, features of cap material 330 may include one or more of Cu, W, Ru, Co, Mo, W, Ir, Rh, Pt, for example. Features of cap material 330 may further include one or more of silicon (e.g., silicides), oxygen (e.g., metal oxides and silicates), nitrogen (e.g., metal nitrides such as TaN, WN) carbon (e.g., metal carbides and carbonitrides such as TaCN, WCN, TiCN), and/or a chalcogen dopant (e.g., Cu:S, CuS2). Depending on the chemical content, the metallic compound may vary from a conductor to a semiconductor.

For some embodiments where a barrier material is between interconnect material layer 325 and dielectric material 320, features of cap material 330 have a different composition than the barrier material. For other embodiments where a barrier material is between interconnect material layer 325 and dielectric material 320, features of cap material 330 have substantially the same composition as the barrier material. Features of cap material 330 may also be of a conductive material comprising other than a metal, including instead graphene, for example. For graphene embodiments, features of cap material 330 may comprise one or more monolayers of polycrystalline graphene. Because of the minimal thickness, for example corresponding to only 1-2 monolayers of material, such a cap material feature may be referred to as two-dimensional (2D). Although in the illustrated example, all features of cap material 330 have substantially the same composition (as represented by their same field lines), in other embodiments further described below different features of cap material 330 of differing composition may be formed over different regions of the workpiece.

Figure 3C:
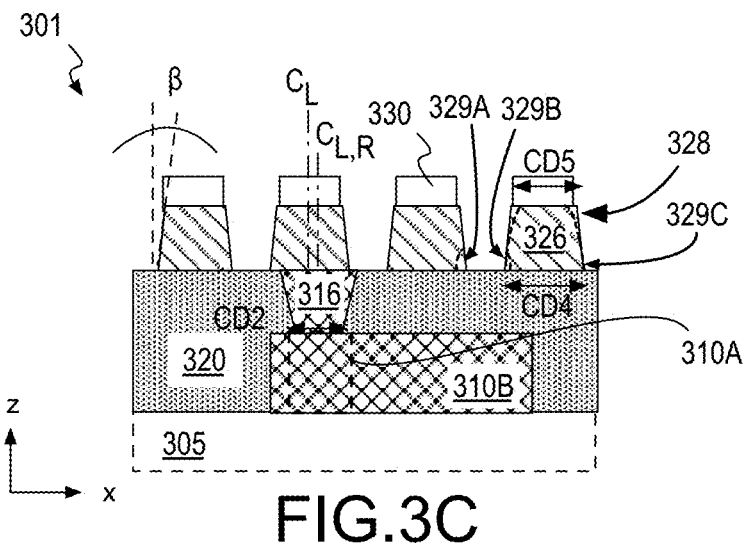
Figure 3D:
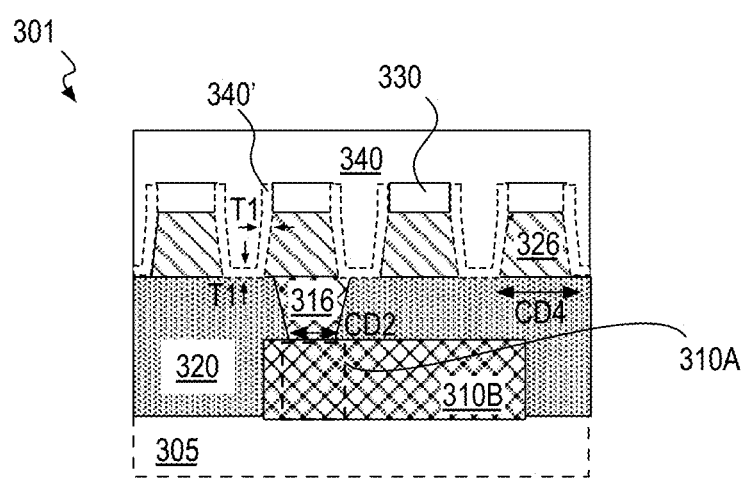

In the example further illustrated in FIG. 3C, interconnect structure 301 includes interconnect features 326 that have been subtractively patterned by removing portions of interconnect material 325 to expose a portion of dielectric material 320 between adjacent ones of the interconnect features 326. For embodiments where dielectric material 320 comprises a stack of dielectric material layers, one or more of the dielectric layers may be etched during an overetch of interconnect features 326. Interconnect features 326 may again be lines or vias, depending on whether methods 202 or 203 are practiced, with their cross-sectional profiles illustrated in FIG. 3C being substantially the same. Regardless, interconnect features 326 are interconnected to the underlying interconnect via 310A or line 310B through intervening interconnect feature 316 that may either be a line or a via, respectively.

In some embodiments, interconnect features 326 have a sloped sidewall profile indicative of subtractive patterning. Whereas the profile of interconnect feature 316 has a negative tapered slope angle α, the profile of interconnect features 326 has a positive slope angle β such that interconnect features 326 have a top transverse width CD5 that is smaller than a bottom transverse width CD4. The reverse tapers of the underlying interconnect feature 316 and overlying interconnect feature 326 is therefore indicative of a hybrid damascene-subtractive patterning process in accordance with some embodiments herein. Although feature sidewall slope angle ß may vary, in some examples it is 2-20° off normal from an x-y plane of substrate 305. Another attribute of interconnect features 326 indicative of their subtractive patterning is a rounded or chamfered top corner 328 (dashed line) associated with physical erosion during a subtractive etch. Even where a subtractive patterning process achieves a nearly ideal 90° (vertical) conductive line sidewall, a rounded or chamfered top corner 328 is different from a damascene line profile that is sharp as a result of a top surface polish. Another attribute of interconnect features 326 indicative of their subtractive patterning is a notch at the base of features 326 where such features are narrowly spaced. The notch may be a result of charging during an ion-based etch process such that there is an asymmetry in the size of the notch, for example with notch 329A on one side of a space between adjacent features 326 being larger than notch 329B on the other side of the space between adjacent features 326. A notch 329C on a side of features 326 that is not closely spaced with other features will be significantly smaller, if not completely absent as drawn in FIG. 3C.

As further illustrated in FIG. 3C, a transverse centerline ($C_L$) of conductive features 326 (e.g., within the x-dimension) may be laterally offset or misregistered from a reference centerline ($C_{L,R}$) of features 316. This lateral offset between interconnect features 326 and an underlying interconnect feature is indicative of interconnect features 326 having been subtractively patterned separately from the patterning of via opening or trench 315 (FIG. 3A). An amount of over-etch into exposed regions of dielectric material 320 between interconnect features 326 is also indicative of the practice of methods in accordance with embodiments herein.

Returning to FIG. 2B and FIG. 2C, methods 202 and 203 continue at block 240 where one or more dielectric materials is deposited over the subtractively pattern interconnect feature, for example substantially as described above in the context of methods 201 (FIG. 2A). In the example further illustrated in FIG. 3D, a planarizing dielectric material 340 is over features of cap material 330, which may retained as a permanent component of interconnect structure 301 as an option that is dependent upon whether interconnect features are 326 are lines or via, and also dependent upon whether features of cap material 330 are dielectric material or conductive material that would be suitable as an interconnect via. As further illustrated in dashed line, a more conformal dielectric material layer 340' may also be present in accordance with some embodiments. Unlike the planarizing dielectric material 340, dielectric material layer 340' has a thickness TI both over a space between adjacent features 326 and adjacent to, or in contact with, a sidewall of features 326. If present, this non-planar, "u," shape of dielectric material layer 340' between to adjacent features 326 is indicative of dielectric material layer 340' having been conformally deposited (e.g., by ALD) after subtractive patterning of interconnect features 326. Even where thickness TI of dielectric material layer 340' is nearly half the space between features 326, a seem within dielectric material layer 340' evidences its deposition after subtractive patterning of interconnect features 326. Each of the dielectric materials 340 and 340' may have a different composition than features of cap material 330, or not. In some examples, dielectric material 340 includes one or more of SiOC, hydrogen silsesquioxane, methyl silsesquioxane, polyimide, polynorbornenes, benzocyclobutene SiN, SiO, SiON, $HfO_2$, ZrO, $Al_2O_3$.

Figure 4:
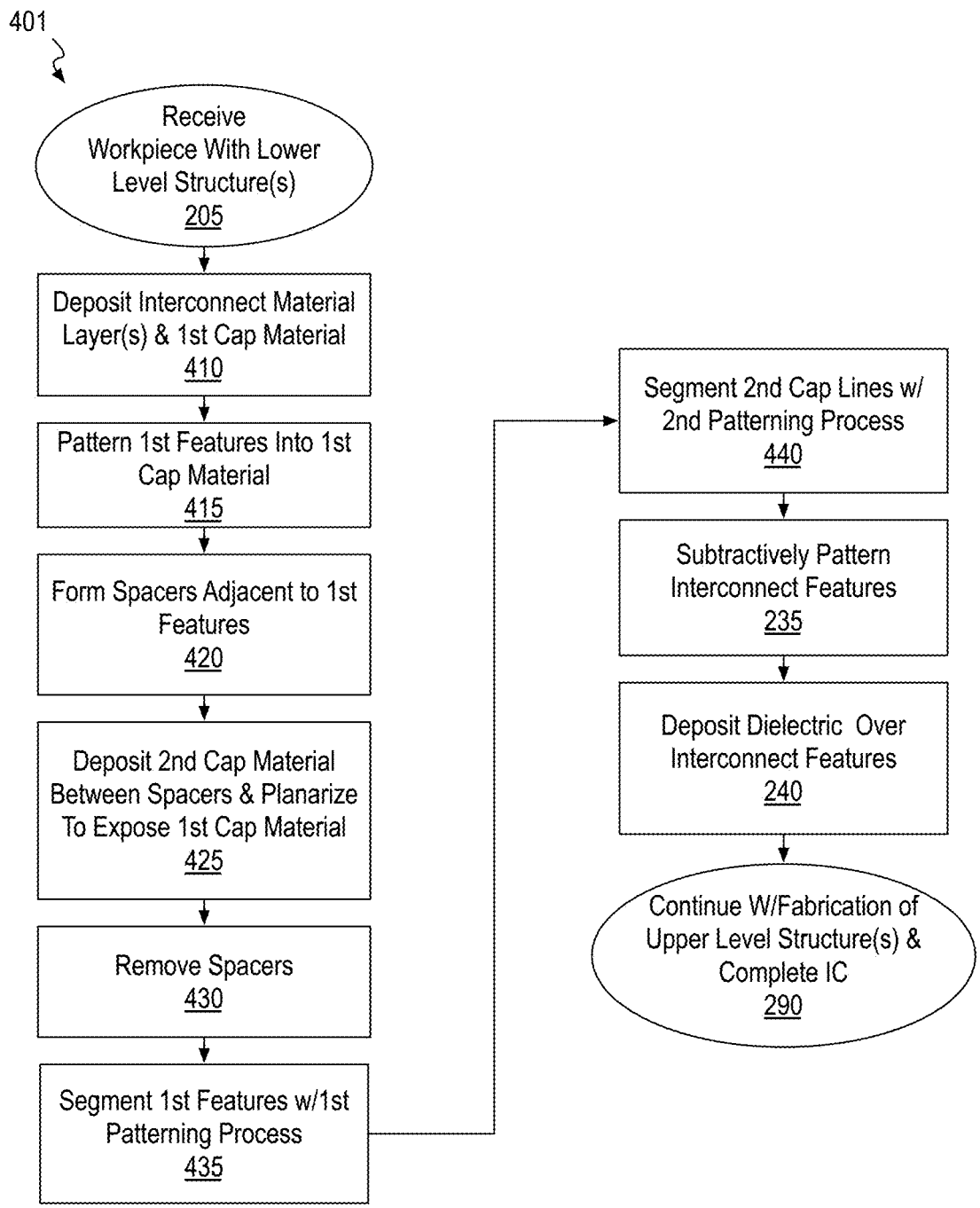
FIG. 4 is a flow diagram illustrating multi-patterning methods for forming interconnect lines, in accordance with some embodiments.

Returning to FIGS. 2B and 2C, methods 202 and 203 complete at output 290 where any upper level structure may be fabricated to complete an IC, substantially as described above for methods 201. As noted above, subtractive interconnect feature patterning may comprise a multiple patterning process in which more than one lithographic expose/develop cycle is performed. FIG. 4 is a flow diagram illustrating a subtractive interconnect feature patterning method 401, in accordance with some multiple patterning embodiments. FIG. 5A-5I illustrate isometric sectional views of an IC interconnect structure 501 evolving as selected blocks of the methods 401 are practiced, in accordance with some embodiments. Methods 401 (FIG. 4) may be practiced as one implementation of methods 202 where lines in a metal layer are fabricated only after ends of the lines are defined with a "plug" pattern. For such embodiments, the placement of the line ends, or end-to-end line spacing that is defined by the plugs relies on a double patterning process. The line end definition may also be distinct from any lithographic process utilized to define longitudinal edges of the interconnect lines.

Methods 401 again begin at block 205 where a workpiece having a lower level structure is received. The workpiece and lower level structure may be substantially as described above in the context of methods 201, for example. In the example further illustrated in FIG. 5A, interconnect structure 501 includes interconnect feature 316 over substrate 305. Although illustrated here as a rectangular interconnect feature having dimensions suitable for an interconnect via, interconnect feature 316 may be any polygon (e.g., circular, elliptical) suitable as a via. As described above, and as denoted by dashed line in FIG. 5A, in alternative embodiments interconnect feature 316 may also be a line. Reference numbers retained from FIG. 3A-3D may have any of the attributes or properties described above. Hence, interconnect feature 316 may be substantially as described above. Substrate 305 may similarly be substantially as described above. Interconnect features below interconnect feature 316 are not illustrated in FIG. 5A and are instead implicitly incorporated within substrate 305. The top surface of interconnect feature 316 is substantially planar with an x-y top surface of dielectric 320.

Methods 401 (FIG. 4) continue at block 410 where one or more interconnect material layer(s) are deposited, and a cap material is deposited over the interconnect material layer(s). The interconnect material layer(s) are to become interconnect features and may have any one or more of the properties introduced above. The cap material deposited over the interconnect material layer(s) at block 410 may similarly have any one or more of the properties introduced above. At block 415, the cap material is patterned into first features using a first patterning process. The first patterning process may include lithographically defining (e.g., exposing and developing) a photoresist. Alternatively, one or more DSA techniques may be practiced.

Figure 5A:
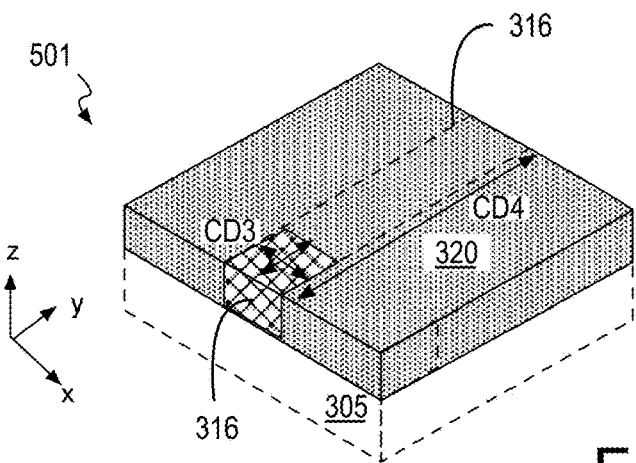
FIGS. 5A, 5B, 5C, 5D, 5E, 5F, 5G, 5H and 5I illustrate isometric sectional views of an IC interconnect structure evolving as selected blocks of the methods illustrated in FIG. 4 are practiced, in accordance with some embodiments.
Figure 5B:
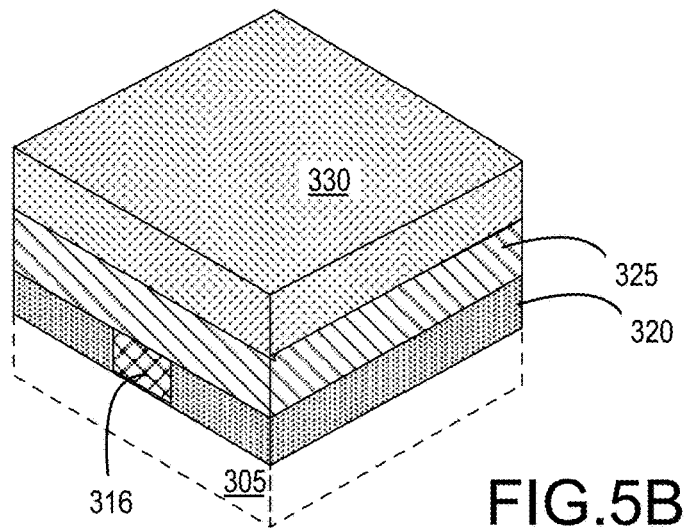
Figure 5C:
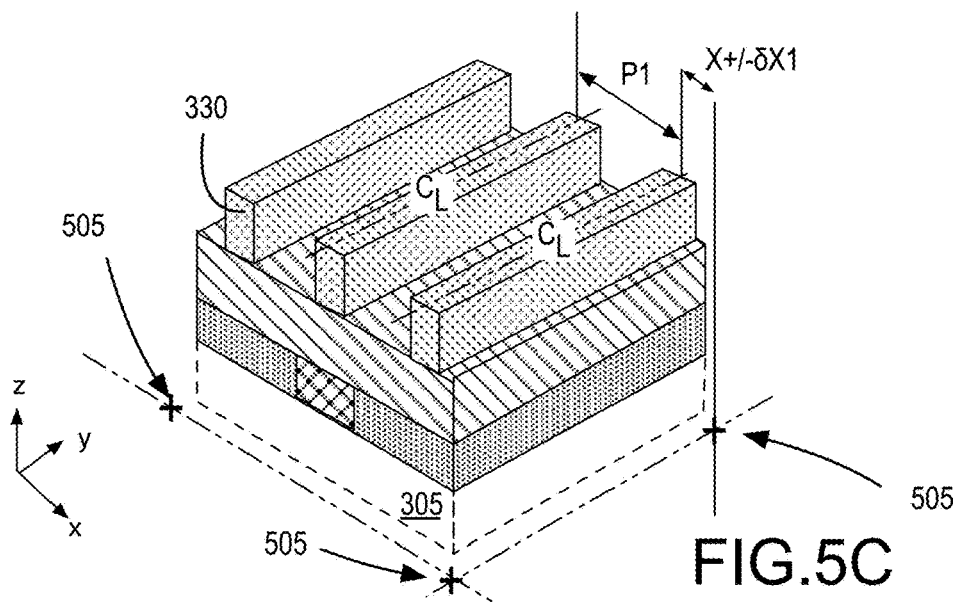
Figure 5D:
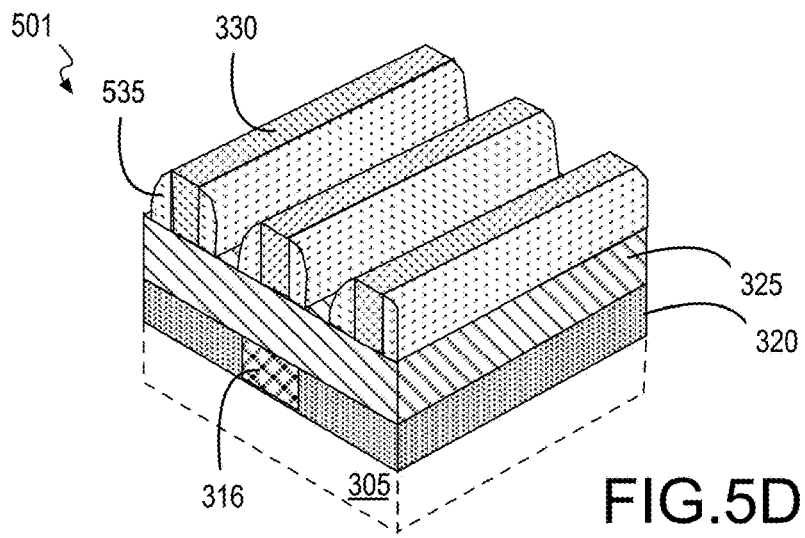

In the example further illustrated in FIG. 5B, interconnect material layer 325 is over, and in physical contact with, interconnect feature 316 and dielectric material 320. Cap material 330 is over, and in physical contact with, substantially the entire area of interconnect material layer 325. As further illustrated in FIG. 5C, cap material 330 is subtractively patterned into first features, and more specifically, substantially parallel lines. The line patterning of cap material 330 may be associated with a non-zero misregistration to reference features 505 that results in some finite amount of line edge placement error between an edge of a line of cap material 330 and an edge of an underlying functional feature of the IC structure, such as, but not limited to, interconnect features 316. As the lines of cap material 330 are substantially a 2D grating with a pitch P1, line edge placement error is essentially in only one dimension. In the illustrated example, a longitudinal center of one line of cap material 330 is illustrated as being laterally spaced apart from substrate reference structure 505 by X with a misregistration in the x-dimension being $\delta X1$. All longitudinal edges or sidewalls of the lines of cap material 330 have this same lateral misregistration of $\delta X1$. For embodiments where substrate reference structure 505 is a feature patterned concurrently with interconnect feature 316, all longitudinal edges or sidewalls of the lines of cap material 330 have this same lateral misregistration of $\delta X1$ relative to interconnect feature 316. For embodiments where substrate reference structure 505 is not concurrently patterned with interconnect feature 316, misregistration between a line of cap material 330 relative to feature 316 is still a function of $\delta X1$ with any misregistration between feature 316 and substrate reference structure 505 accounted for separately. Although the magnitude of $\delta X1$ may vary in practice, because the lines of cap material 330 are not self-aligned to substrate reference structure 505 (or interconnect feature 316), $\delta X1$ has some distribution around a non-zero value.

Returning to FIG. 4, methods 401 continue with a pitch reduction process that includes blocks 420-430. At block 420, spacers are formed adjacent to the first cap material features. Formation of spacers may be according to any technique known to be suitable for the application of pitch reduction. In some embodiments, a spacer material is conformally deposited over the cap material lines. The thickness of the dielectric material is then blanket etched (i.e., without a mask) with a substantially anisotropic etch process to remove the spacer material except along topographic edges, as further illustrated for interconnect structure 501 in FIG. 5D. In exemplary embodiments, spacer 535 has a composition distinct from that of the line of cap material 330. In further embodiments, spacer 535 has composition distinct from that of the conductive interconnect material layer 325. In some embodiments, spacer 535 is a dielectric, for example having any of the compositions described above for dielectric material 320, or cap material 330. In other embodiments, spacer 535 is a metal, for example having any of the compositions described above for interconnect material layer 325.

Returning to FIG. 4, methods 401 continue at block 425 where another cap material is deposited over the second cap material, as well as over and between the spacers formed at block 420. This second cap material is then planarized with a surface of the first cap material. The second cap material deposited at block 425 may similarly have any of the compositions introduced above in the context of the first cap material. Hence, each of the cap materials may have one of the compositions described above for a cap material however the two cap materials are advantageously of two different compositions. As described further below, such "multi-color" cap material embodiments may significantly reduce interconnect feature edge placement errors.

In some embodiments where the first cap material is a dielectric, the second cap material may be a second, different, dielectric material, or may be a metal or semiconductor material. In some other embodiments where the first cap material is a metal, the second cap material may be a second, different, metal, or may be a dielectric or semiconductor. In still other embodiments where the first cap material is a semiconductor, the second cap material may be a second different, semiconductor, or may be a metal or dielectric. Following planarization of the cap materials, the intervening spacers may be removed (e.g., with any etch process that can remove the spacers preferentially over the two cap materials).

Figure 5E:
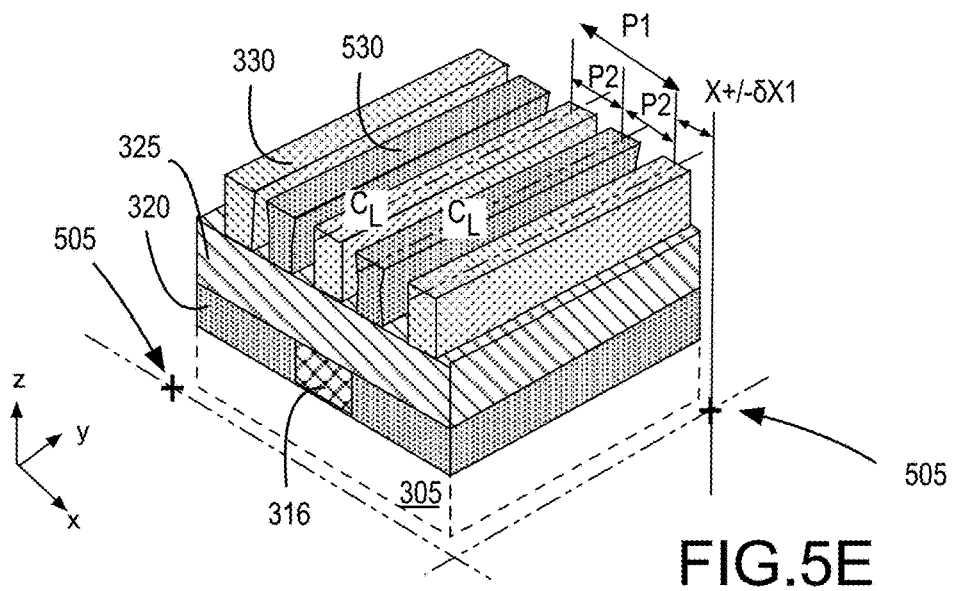

In the example illustrated in FIG. 5E, following the removal of spacers 535, features of a cap material 530 remain interdigitated with features of cap material 330. The two sets of cap material features are spaced apart from each other by a lateral space substantially equal to a lateral width of spacers 535. Within the space between adjacent features of cap material, interconnect material layer 325 is exposed. In the illustrated example where the features patterned into cap material 330 are a first 2D line-space grating of a pitch P1, the features patterned into cap material 530 are also a 2D line-space grating that is substantially parallel with the first 2D line-space grating. The two cap materials are therefore parallel lines of alternating composition and with a smaller (e.g., half) pitch P2. As further illustrated in FIG. 5E, because the lines of cap material 530 are spaced apart from the lines of cap material 330 as a result of only deposition and etch processes, both sets of cap material lines have a centerline (CL) with the same one-dimensional line edge placement error of $\delta X1$ relative to reference substrate structures 505. Hence, there is a line edge placement error of $\delta X1$ between an edge of an underlying functional feature of the IC structure, such as, but not limited to, interconnect feature 316, and an edge of a line of cap material 330, as well as an edge of a line of cap material 530.

Returning to FIG. 4, methods 401 continue at block 435 where one of the cap material features, or lines is segmented, for example by defining line end openings or "plugs" that bifurcate individual ones of the cap material features at various locations. Feature segmentation at block 435 may bifurcate each individual one of the cap material lines into a set, or row, of substantially colinear features. Depending on their length, the colinear features may either lines or vias. Either of the two cap materials formed may be segmented with a masked etch process that is selective to that cap material composition. The etch may be any RIE etch process know to be suitable for the composition, for example.

In exemplary embodiments, plug openings are patterned into a grating etch mask that has been deposited over the cap material features. Any of the lithographic grating plug definition processes previously described by the applicant in prior patent filings, or otherwise known may be employed to define grating plug openings. Portions of cap material exposed within the grating plug etch mask openings are then removed with the selective etch process. Notably, because alternating ones of the cap material lines have distinct compositions, and the cap segmentation etch process performed at block 435 is selective to one of the cap materials relative to the other, any misregistration and/or oversize of a given opening in the segmentation etch mask will not be translated into an immediately adjacent line of the cap material because of that material's resistance to the etch process. Hence, edge placement error in the segmentation etch at block 435 may be limited to one dimension that is along the longitudinal length of the cap material feature.

Figure 5F:
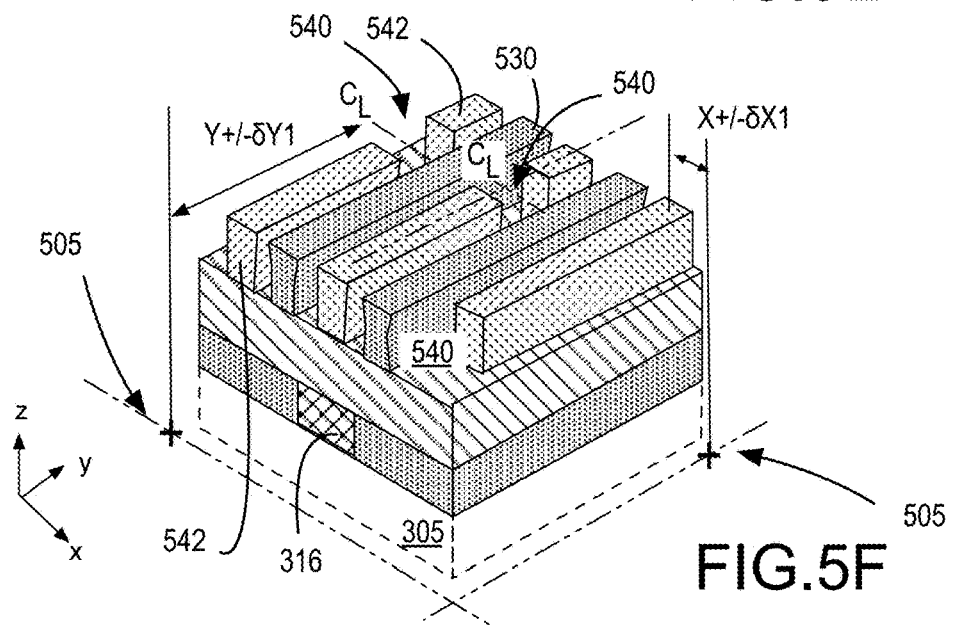

In the example illustrated in FIG. 5F, end spaces 540 are patterned into the features of cap material 330. Each end space 540 bifurcates a feature of cap material 330 into a two colinear features 542. In this example, end space 540 has dimensions and/or a pitch such that features 542 are each lines and therefore end space 540 is more specifically a space between two colinear lines (i.e., a "line" end space). Although only one end space 540 is illustrated for a given feature of cap material 330, there may be any number of end spaces to generate any number of colinear features from each feature of cap material 330. One end space 540 is shown as laterally offset in the y-dimension from reference substrate structures 505 by a distance Y with some edge placement error of $\delta Y1$. Edges defining end space 540 therefore have a misregistration, or lateral offset, of $\delta Y1$ from an edge of an underlying functional feature of the IC structure, such as, but not limited to, interconnect feature 316.

Although the magnitude of $\delta Y1$ will vary in practice, $\delta Y1$ has some distribution around a non-zero value because the end spaces 540 are not self-aligned to underlying features of the IC structure (or substrate reference structures 505). In addition to the spacing between adjacent features of cap material 330, the selectivity of the etch employed to form end spaces 540 ensures that cap material 530 is not also patterned even if it is exposed to the segmentation etch of cap material 330. End spaces 540 will therefore have an edge placement error in the x-dimension relative to an underlying feature of the IC structure (or relative to substrate reference structures 505) that is no greater than $\delta X1$.

Following the first segmentation etch, methods 401 (FIG. 4) continue at block 440 where features of the other cap material are segmented with another patterning process. This additional patterning process is similarly selective to one cap material with the other cap material being resistant to the etch employed to introduce line end spaces into the second cap material. The additional end space openings patterned at block 440 similarly bifurcate individual ones of the cap material features at various locations. Feature segmentation at block 440 may bifurcate each individual one of the cap material lines into another set, or row, of substantially colinear features.

The remaining one of the two cap materials may be segmented with any masked RIE etch process known to be suitable for the composition, for example. In some exemplary embodiments, plug openings are patterned (e.g., with any lithographic expose and develop process) into another etch mask that has been deposited over the cap material features. Portions of cap material exposed within the etch mask openings are then removed with the selective etch process. Again, because alternating ones of the cap material lines have distinct compositions, and the cap segmentation etch process performed at block 440 is selective to the other the cap material(s). Any misregistration and/or oversize of a given opening in this second segmentation etch mask will therefore not be translated into an immediately adjacent feature of alternative cap material. Edge placement error associated with pattern misregistration in the segmentation etch of block 440 may therefore be limited to the one dimension along the longitudinal length of the cap material line.

Figure 5G:
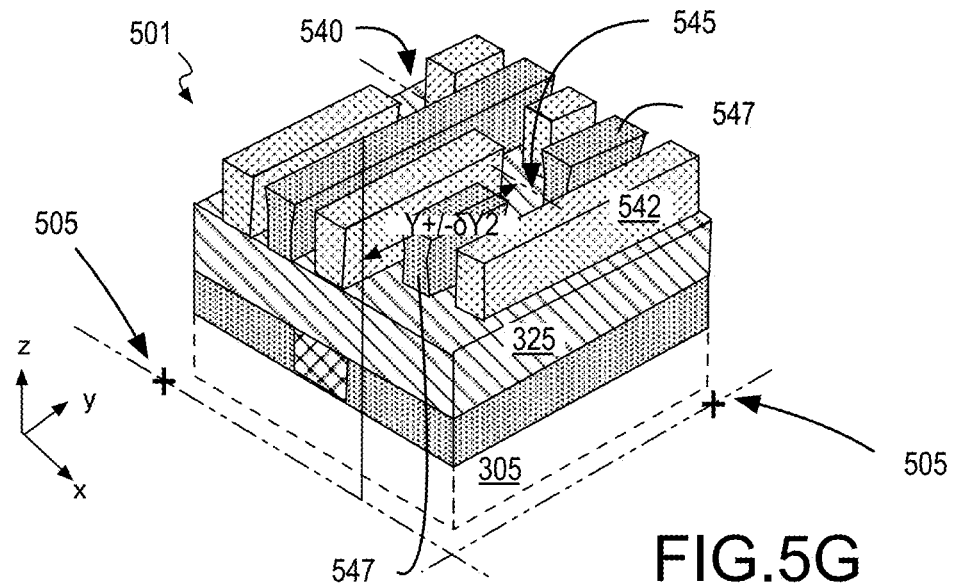

In the example illustrated in FIG. 5G, interconnect structure 501 further includes end spaces 545 patterned into the features cap material 530. Each end space 545 bifurcates a feature of cap material 530 into two colinear features 547. In this example, end space 545 has dimensions and/or a pitch such that features 547 are each lines and therefore end space 545 is more specifically a "line" end space between two colinear lines. Although only one end space 545 is illustrated for a given feature of cap material 530, there may be any number of such end spaces to generate any number of colinear lines from each feature of cap material 530. One end space 545 is shown as laterally offset in the y-dimension from reference substrate structures 505 by another distance Y with some edge placement error of $\delta Y2$.

The magnitude of $\delta Y2$ may vary in practice. However, $\delta Y2$ has some distribution around a non-zero value because the end spaces 545 are not self-aligned to substrate reference structures 505 (or to interconnect feature 316, etc.). Hence, end spaces 540 have a lateral misregistration in the y-dimension that is δY1 (or a function of δY1) relative underlying features of an IC structure (e.g., interconnect feature 316) while end spaces 545 have a lateral misregistration δY2 in the y-dimension relative to the same underlying features of the IC structure. Notably, δY2 is independent of δY1 and therefore the two edge placement errors δY2 and δY1 are different as a result of variation in each of the two separate segmentation etches.

In addition to the spacing between adjacent features of cap material 530, the selectivity of the etch employed to form end spaces 545 ensures that cap material 530 is not also patterned even if a portion of the features 542 is exposed to the segmentation etch. End spaces 545 will therefore again have an edge placement error in the x-dimension no greater than δX1, which is associated with the initial grating pattern.

With the multi-color cap materials segmented into alternating rows of colinear features, methods 401 (FIG. 4) continue at block 235 where the underlying interconnect material layer(s) are etched into interconnect features. Hence, in methods 401, interconnect features are formed subtractively after all edges of the features have been defined in cap material. Any subtractive etch process known to be suitable for the interconnect material may be practiced at block 235. For example, any of the RIE or IBE processes noted above in the context of methods 201 (FIG. 2A), may be practiced in methods 401 (FIG. 4). Methods 401 may then complete with a deposition of one or more dielectric materials over the interconnect features at block 240 followed with the fabrication of any upper level interconnect structures at output 290, for example substantially as described above.

Figure 5H:
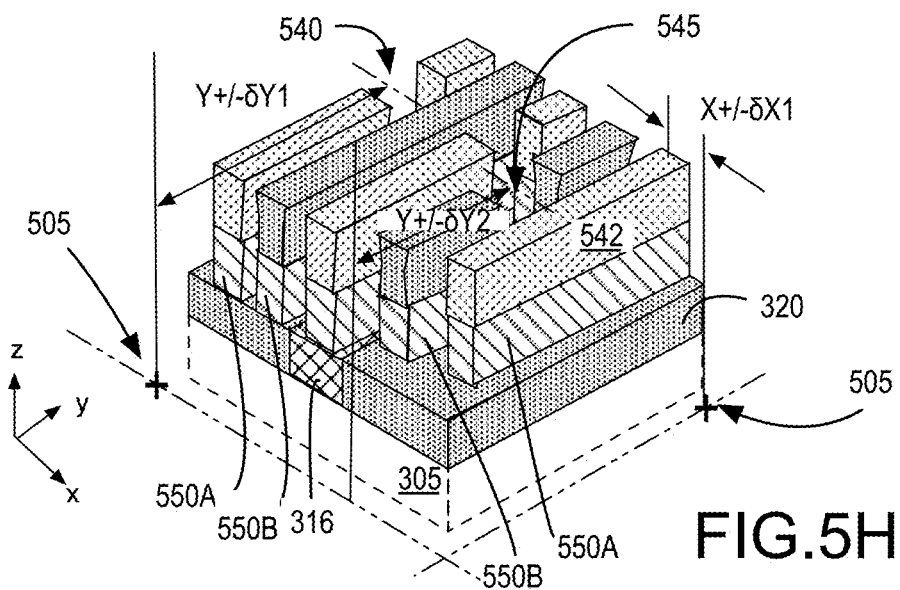

In the example further illustrated in FIG. 5H, interconnect material layer 325 has been etched through to form first rows of colinear interconnect features 550A interdigitated with second rows of colinear interconnect features 550B. Although the composition of interconnect features 550A and 550B are substantially the same (e.g., both being that of material layer 325), interconnect features 550A have lateral dimensions and edge placement error associated with cap material features 542 while interconnect features 550B have lateral dimensions and edge placement error associated with cap material features 547. For example, interconnect features 550A have the edge placement error of δY1 in the Y-dimension, and interconnect features 550B have the edge placement error of δY2 in the Y-dimension relative to some underlying IC feature, such as, but not limited to, interconnect feature 316, or a device terminal, etc. Both interconnect features 550A and 550B have the same edge placement error of δX1 in the X-dimension relative to the underlying IC feature. Any difference in transverse width and/or end spacing between cap material features 542 and 547 will also differentiate interconnect features 550A from interconnect features 550B such that the interconnect features may be best represented as two populations of alternating or interdigitated rows of colinear features.

As further illustrated in FIG. 5H, the etch of interconnect material layer 325 exposes the underlying dielectric material 320. Any portion of interconnect feature 316 that extends beyond the sidewall of one of the interconnect features 550A is also exposed. For some embodiments where interconnect features 550A comprise a material (e.g., metal) of a different composition than that of interconnect feature 316, the subtractive interconnect feature etch may stop on interconnect feature 316 as illustrated so that the exposed surface of interconnect feature 316 remains substantially planar with the exposed surface of dielectric material 320. Alternatively, where the subtractive etch interconnect feature etch has different selectivity over each of dielectric material 320 and interconnect feature 316, the exposed surface of one or the other of dielectric material 320 or interconnect feature 316 may be recessed relative to the other.

Figure 5I:
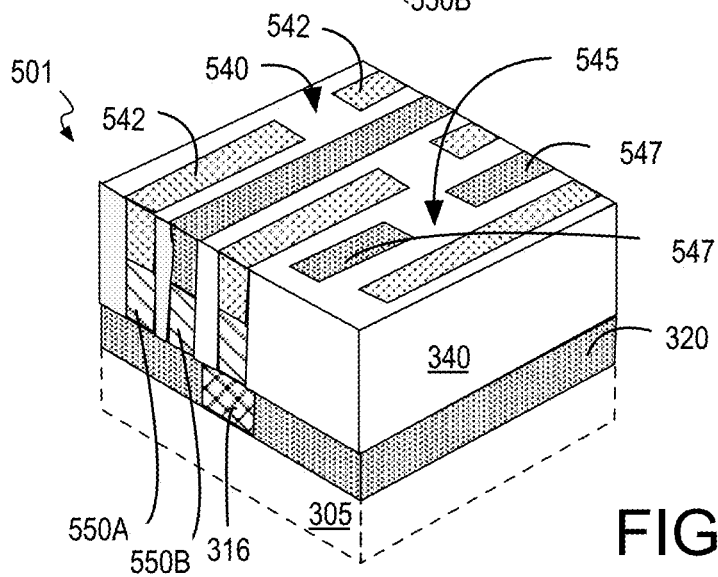

In the example shown in FIG. 5I, interconnect structure 501 further includes dielectric material 340, which substantially backfills end spaces 540 and 545, as well as spaces between adjacent interconnect features 550A and 550B. Dielectric material 340 also occupies spaces between adjacent cap material lines 542, 547. Although not illustrated, a conformal dielectric material layer substantially as described above (e.g., 340' in FIG. 3D) may also be present. Following a planarization process (e.g., CMP), a top surface of dielectric material 340 is substantially planar with a top surface of cap material features 542, 547. As shown, interconnect structure 501 is substantially complete through one level of interconnect line fabrication and further processing may be performed to further fabricate an upper level via and another level interconnect lines, for example. Various components of interconnect structure 501 may also be removed or otherwise altered from the state illustrated in FIG. 5I. For example, some or all of one or both of cap material features 542 and 547 may be removed as sacrificial. Similarly, some or all of dielectric material 340 may be removed (or never deposited), for example where air gap interconnect line insulation is desired.

Figure 5J:
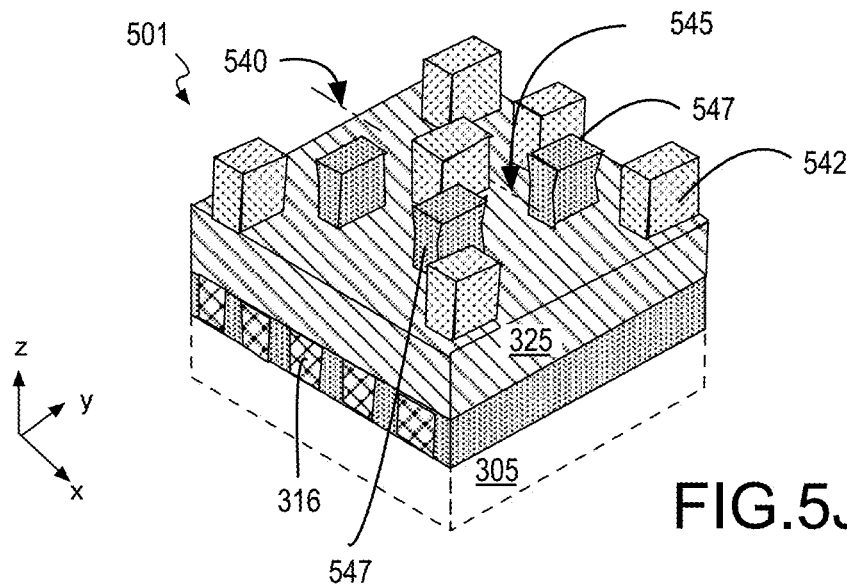
FIGS. 5J, 5K and 5L illustrate isometric section views of an IC interconnect structure evolving as selected blocks of the methods illustrated in FIG. 4 are practiced, in accordance with some alternative embodiments.
Figure 5K:
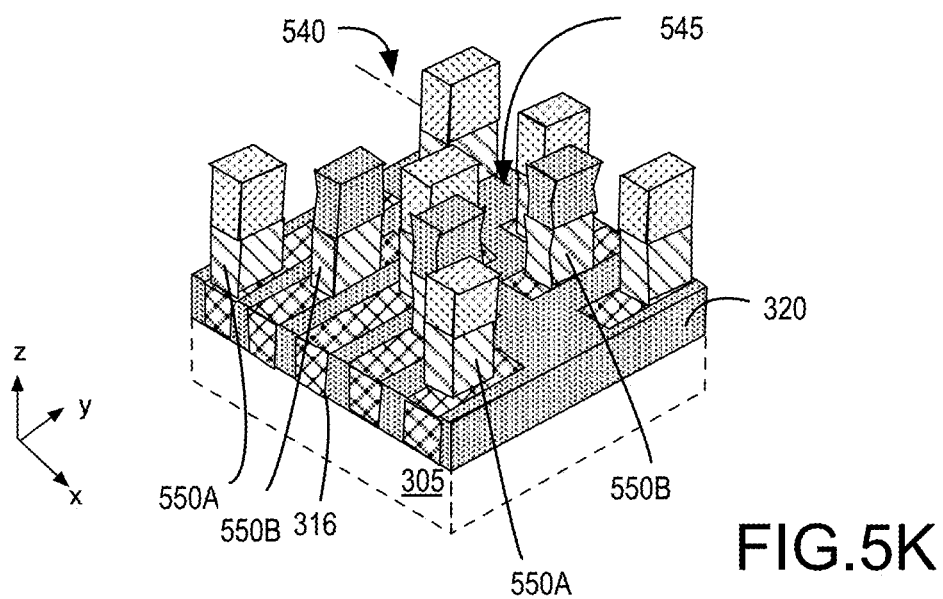

Although FIG. 5A-5I illustrate an implementation of methods 202 wherein interconnect lines are generated as shown in FIG. 5H and FIG. 5I, methods 401 are also applicable to methods 203. FIG. 5J-5K therefore further illustrate isometric sectional views of an IC interconnect structure 501 evolving to instead include subtractively patterned interconnect vias. As shown in FIG. 5J, cap material features 542 and 547 have dimensions and/or pitches suitable as interconnect vias. End spaces 540 and 545 are of relatively larger dimensions associated with a "dark field" via pattern. Notably however, the structure illustrated in FIG. 5J may be generated in substantially the same manner as illustrated in FIG. 5A-5F with the interconnect structure shown in FIG. 5J have many similarities with the interconnect structure shown in FIG. 5G. Whereas a grating plug mask process may be employed to define end spaces 540 and 545 suitable for an interconnect line pattern, the cap material features 542 and 547 as illustrated in FIG. 5J may be readily formed as a summation of intersecting non-parallel grating mask patterns. For example, one or more grating mask oriented substantially orthogonal to a grating mask employed to define cap material lines (e.g., substantially as shown in FIG. 5E) may mask the end space etch of the cap material lines such that cap material features 542 and 547 can remain only where the grating masks overlapped etch other. Openings or discontinuities within at least one of the grating masks renders cap material features 542 and 547 more sparse, being only at some of the intersections of the orthogonal grating patterns.

FIG. 5K further illustrates subtractive via patterning, which may proceed substantially as described above so that interconnect features 550A and 550B are interconnect vias, again having characteristics of two feature populations indicative of their different patterning processes. As further illustrated in FIG. 5L, before or after deposition of dielectric material 340, cap material features 542 and 547 are removed, for example with a planarization process or any suitable selective etch process, leaving interconnect features 550A and 550B exposed as conductive vias.

Figure 6:
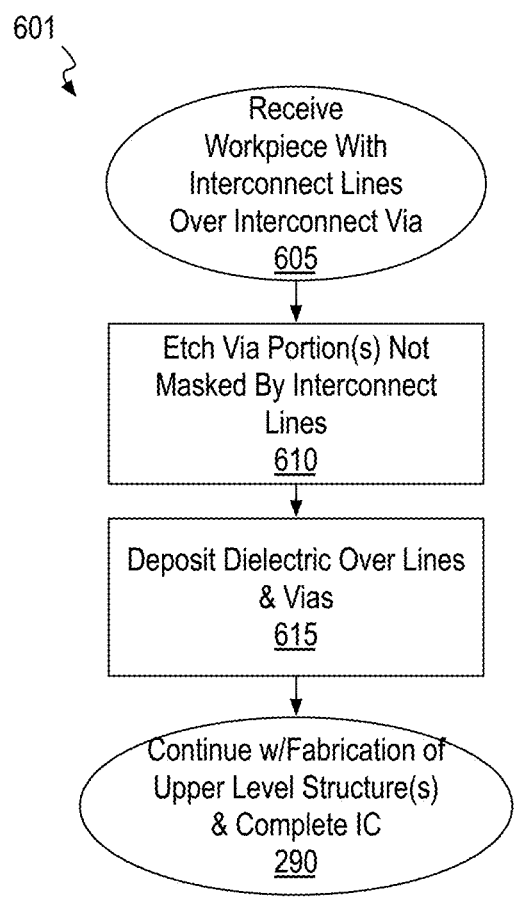
FIG. 6 is a flow diagram illustrating via patterning according to an overlying interconnect line pattern, in accordance with some embodiments.
Figure 7A:
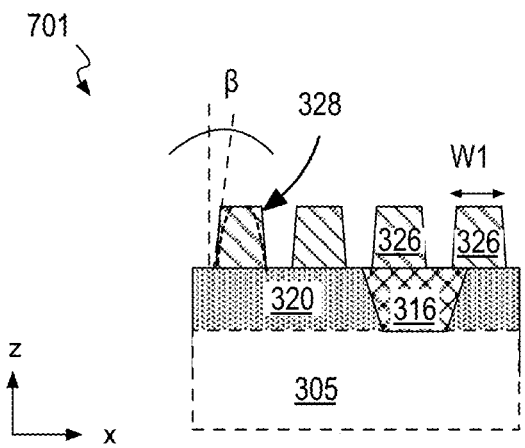
FIGS. 7A, 7B and 7C illustrate cross-sectional views of an interconnect structure 701 evolving as the methods illustrated in FIG. 6 are practiced, in accordance with some embodiments.
Figure 7B:
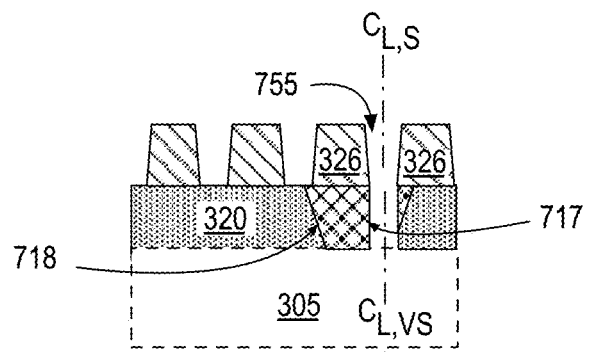
Figure 7C:
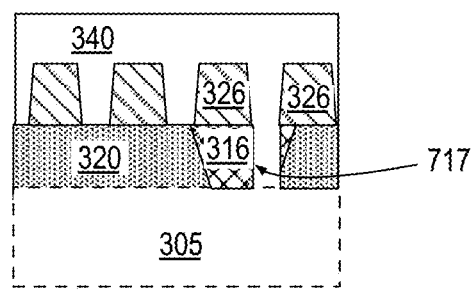

In some embodiments, IC interconnect fabrication includes multiple via patterning operations and at least one of the patterning operations is performed subsequent to the formation of overlying interconnect lines. Such patterning of a lower-level via after the patterning of an upper-level interconnect line may leverage subtractive interconnect feature patterning to increase fabrication margins against electrical shorting of an IC interconnect structure. FIG. 6 is a flow diagram illustrating methods 601 for patterning a via according to an overlying interconnect line pattern. FIG. 7A-7C are cross-sectional views of an interconnect structure 701 evolving as methods 601 are practiced, in accordance with some embodiments.

Referring first to FIG. 6, methods 601 begin at input 605 where a workpiece having interconnect lines over a via is received. In some embodiments, the workpiece includes a semiconductor wafer, such as any of those described above for input 205. The workpiece may include one or more device layers including a semiconductor material layer, and may also have one or more interconnect levels interconnecting devices (e.g. transistors) of the device layer(s). As received at input 205, the working surface of the workpiece comprises an exposed interconnect line pattern. Exposed interconnect lines may have been subtractively patterned, for example substantially as described above in the context of methods 201 and/or 401. One or more dielectric material(s) may be under the interconnect lines and one or more interconnect vias may extend through the dielectric material(s) in physical contact with a lower-level interconnect line or device terminal, etc.

In the example illustrated in FIG. 7A, an interconnect structure 701 includes interconnect features 326 over interconnect feature 316. In this example interconnect features 326 are lines. Interconnect features 326 may otherwise have any of the attributes described above. For example, interconnect features 326 may have sidewall slope ß and/or corner chamfering 328 indicative of a subtractive patterning process. Interconnect features 326 are over both dielectric 320 and interconnect feature 316. In this example interconnect feature 316 is a via having a lateral diameter (e.g., in the x-dimension) significantly greater than transverse (line) width W1. As such, a plurality of interconnect lines is in direct physical contact with and interconnect via, which electrically connects (i.e., shorts) them together. Such electrical shorting may be undesirable for proper function of an IC including interconnect structure 701.

Returning to FIG. 6, methods 601 continue at block 610 where any exposed via portion that is not masked by an overlying interconnect line is etched. The via etch practiced at block 610 may be any RIE or IBE process suitable for the composition of the via. Hence, depending on the compositions of the interconnect lines and vias, block 610 may be implemented as part of subtractive interconnect feature patterning. For example, during an over etch of interconnect lines, exposed portions of an underlying via may be recessed and/or completely removed (etched away). The interconnect line overetch may be substantially the same etch process employed to patterning the interconnect lines, for example where both the via and the interconnect lines have the same composition. Alternatively, the interconnect line overetch may be a distinct etch process corresponding to a distinct via composition.

In the example further illustrated in FIG. 7B, interconnect feature 316 is bifurcated by an etched space 755 which removes a portion of interconnect feature 316 straddling two adjacent interconnect features 326. In this example, an entire depth (thickness) of interconnect feature 316 is cleared, exposing the underlying substrate 305. Any liners (e.g., barrier and/or adhesion material) may also be removed if they are also sufficiently conductive to functionally short together adjacent interconnect features 326. This subtractive interconnect etch therefore electrically isolates adjacent interconnect features 326, eliminating the short through the underlying interconnect feature 316. Although an anisotropic etch is illustrated, a non-vertical (i.e., tapered) sidewall 717 may result from the subtractive via etch. For example, at least some portion of feature sidewall 717 may have a wine-glass profile and/or undercut a sidewall of interconnect features 326 if an isotropic via etch is performed. Notably, sidewall 717 may have a profile that is very distinct from other regions of interconnect feature 316. For example, sidewall 718, which was masked from the subtractive via etch, may retain a taper indicative of a damascene fill process employed to fabricate interconnect feature 316. This asymmetry in sidewall profile is indicative of a multiple patterning process that includes a post-interconnect line subtractive via etch. Furthermore, the perfect alignment of a centerline ($C_{L,VS}$) of via space 755 to a centerline ($C_{L,S}$) of the space between adjacent interconnect features 326 is indicative of a subtractive via etch that was self-aligned to overlying interconnect lines. Although a complete etch is illustrated in FIG. 7B, a partial etch that merely recesses a top surface of an underlying interconnect via below the bottom surface of the interconnect lines may be sufficient to eliminate shorting, particularly where the via etch has a lateral component and a portion of the via may be removed out from under an overlying interconnect line.

Returning to FIG. 6, methods 601 continue at block 615 where one or more dielectric materials are deposited over the exposed line surfaces as well as over the exposed via surfaces. At block 615, any dielectric material suitable as an ILD may be deposited by any technique. In some embodiments, the dielectric material deposited at block 615 is any of those described above in the context of methods 201 and/or 401. Methods 601 then complete at output 290, for example with the fabrication of upper-level structure(s) substantially as described elsewhere herein. For the example further illustrated in FIG. 7C, dielectric 340 is over interconnect features 326, and in direct physical contact with via sidewall 717. Although not illustrated, a conformal dielectric material layer substantially as described above (e.g., 340' in FIG. 3D) may also be present. For embodiments where the composition of dielectric material 340 is different than the composition of dielectric 320, interconnect feature 316 is electrically insulated in part by each of the two dielectric materials 320 and 340.

Figure 8:
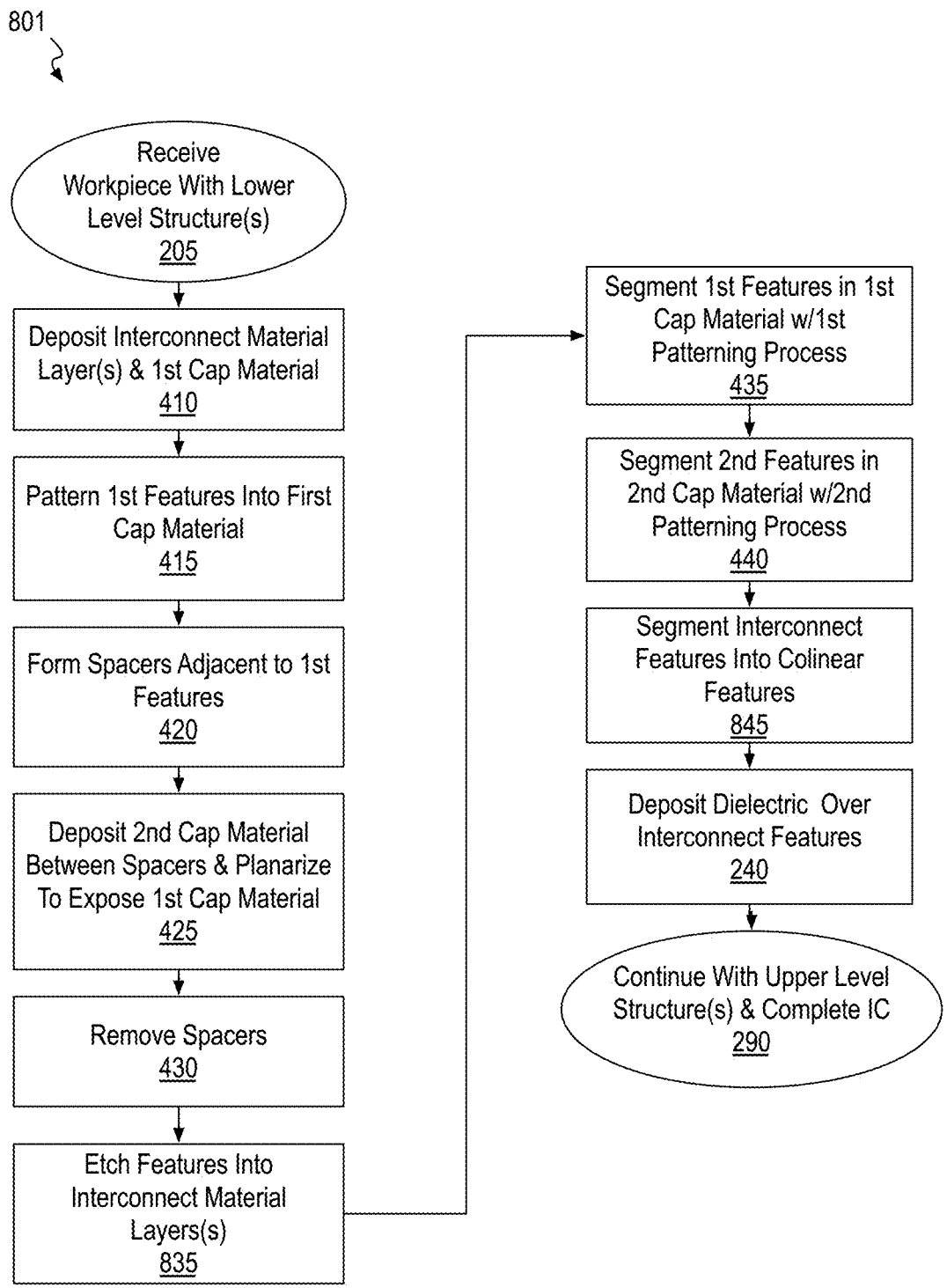
FIG. 8 is a flow diagram illustrating a line patterning, in accordance with some alternative embodiments where interconnect lines are subtractively patterned prior to their segmentation.

As noted above, subtractive interconnect feature patterning may comprise a multiple patterning process where more than one lithographic expose/develop cycle is practiced. FIG. 8 is a flow diagram illustrating a feature patterning method 801, in accordance with some alternative embodiments where interconnect features are subtractively patterned prior to their further segmentation. Hence, methods 801 (FIG. 8) may be practiced as another implementation of methods 201 (e.g., as an alternative to methods 401). For these embodiments as well, placement of the end spaces, or end-to-end feature spacing that segments the interconnect features again relies on a multiple patterning process that leverages multi-color cap materials. FIG. 9A-9J illustrate isometric sectional views of an IC interconnect structure 901 evolving as selected blocks of the methods 801 are practiced, in accordance with some embodiments. FIG. 9A-9J also further illustrate another implementation of subtractive via patterning, and how such a patterning may be integrated with subtractive interconnect feature patterning.

Methods 801 begin at block 205 where a workpiece having a lower level structure is received. The workpiece and lower level structure may be substantially as described above in the context of methods 201 or 401, for example. In the example further illustrated in FIG. 9A, interconnect structure 501 includes interconnect feature 316 over substrate 305. Reference numbers retained from FIG. 3A-3D and/or FIG. 5A-5I may have any of the attributes or properties described above. Hence, interconnect feature 316 and substrate 305 may each be substantially as described above. For clarity, interconnect features below interconnect feature 316 are not illustrated in FIG. 9A and are instead implicitly incorporated within substrate 305. A top surface of interconnect feature 316 is substantially planar with an x-y top surface of dielectric 320.

In further reference to FIG. 8, methods 801 proceed to block 410 where one or more interconnect material layers are deposited, for example over the lower interconnect feature and dielectric material surfaces of the workpiece. Any of the interconnect line material layers described above for methods 401 (FIG. 4) may be similarly deposited in the practice of methods 801. A cap material, such as any of those described above, may be deposited over the interconnect line material layers to arrive at the structure further illustrated in FIG. 9B.

Continuing with methods 801 (FIG. 8) at block 415, features may be patterned into the cap material. Any suitable masking and etch process, such as any of those described above in the context of methods 401 (FIG. 4), may be practiced at block 415. In the exemplary structure illustrated in FIG. 9C, a 2D grating of lines of cap material 330 having a pitch P1 are over interconnect material layer 325.

Similar to methods 401, methods 801 (FIG. 8) proceed with a feature pitch reduction sequence including blocks 420, 430 and 435 where spacers are formed adjacent to the patterned cap features, and another cap material deposited into regions between the spacers. As described above, after the spacers are removed two sets of cap material features having a reduced feature pitch remain over the interconnect material layer(s). In the exemplary embodiments illustrated in FIGS. 9D and 9E, lines of cap material 330 are interleaved with lines of cap material 530. The lines of cap material 330 and 530 are each one subset of a 2D grating having feature pitch P2.

Methods 801 (FIG. 8) continue at block 835 where features are subtractively patterned into the interconnect material layer(s). The lines of cap material may be employed as etch masks for any etch process known to be suitable for the composition of the interconnect material layer(s.) In exemplary embodiments where the interconnect material layer(s) include a metal layer, an RIE or IBE process is practiced at block 835 to remove the interconnect material not protected by the cap material. In some advantageous embodiments where the interconnect material is a metal that can chemically etched, the etch process at block 835 is selective to the metal relative to both of the cap materials. For example, where the cap materials are both dielectric materials, an etch process comprising Cl or Br may be employed to pattern some metals preferentially over dielectric cap materials.

Figure 9A:
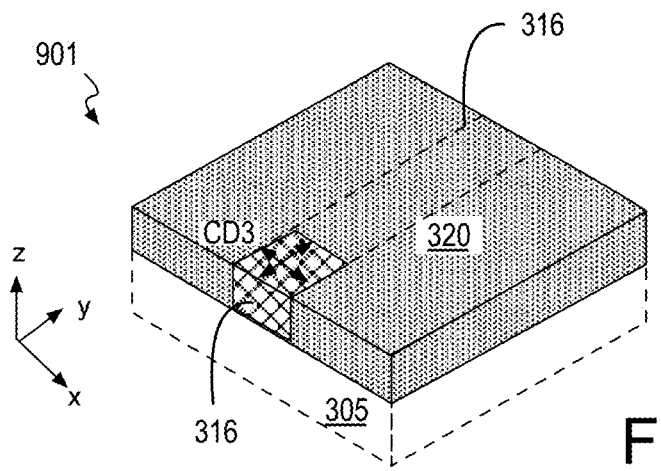
FIGS. 9A, 9B, 9C, 9D, 9E, 9F, 9G, 9H, 9I and 9J illustrate isometric sectional views of an IC interconnect structure evolving as the methods illustrated in FIG. 8 are practiced, in accordance with some embodiments.
Figure 9B:
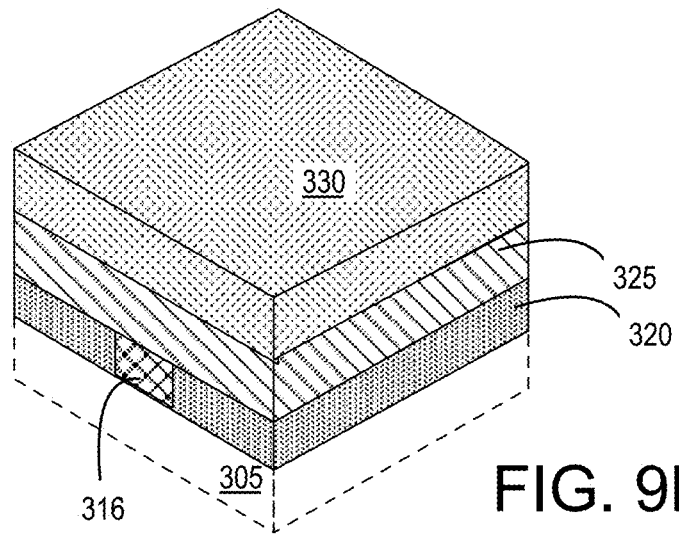
Figure 9C:
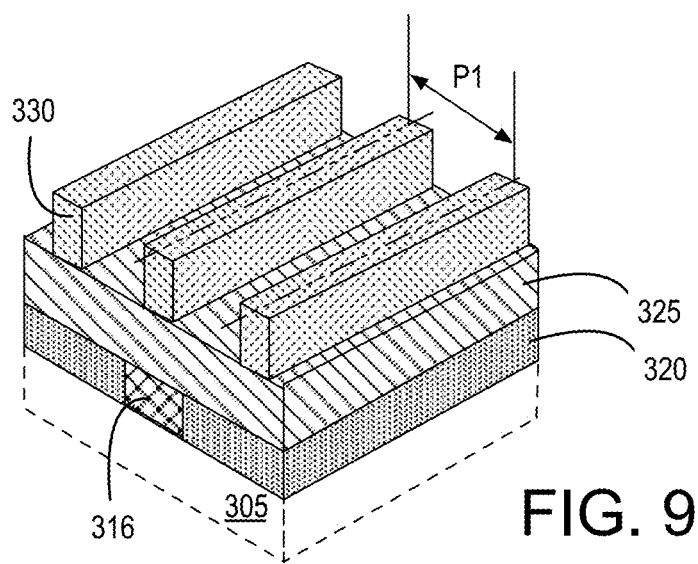
Figure 9D:
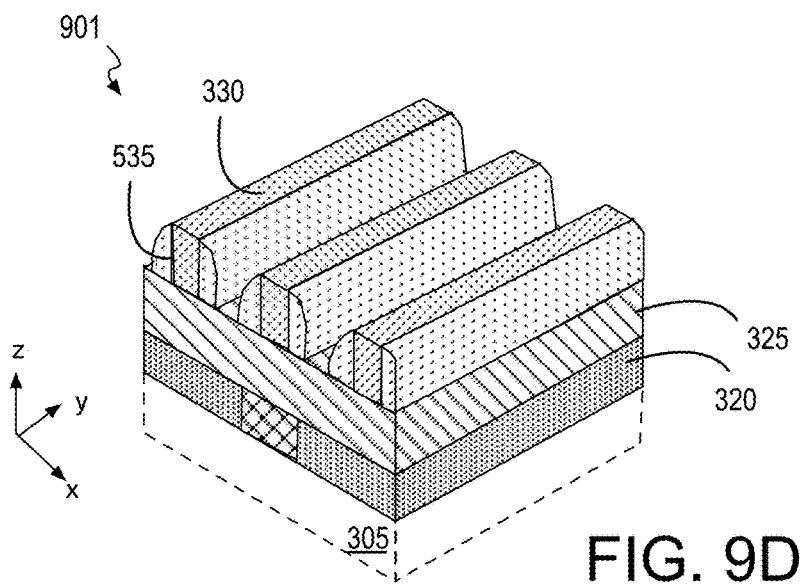
Figure 9E:
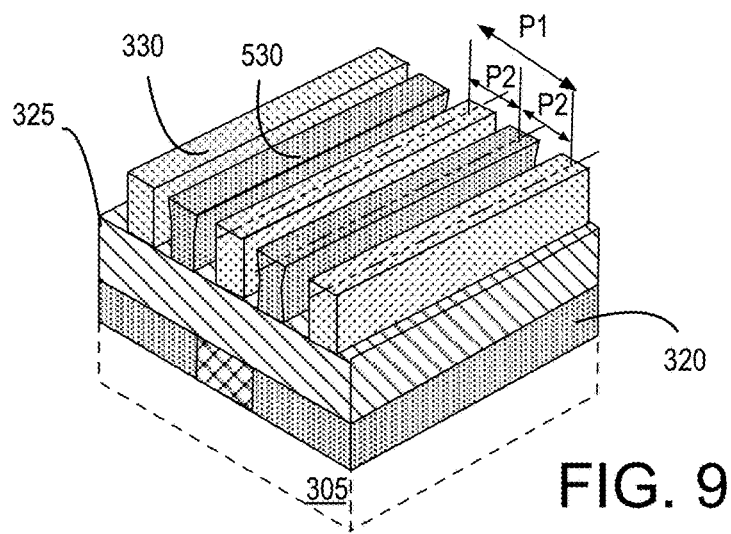
Figure 9F:
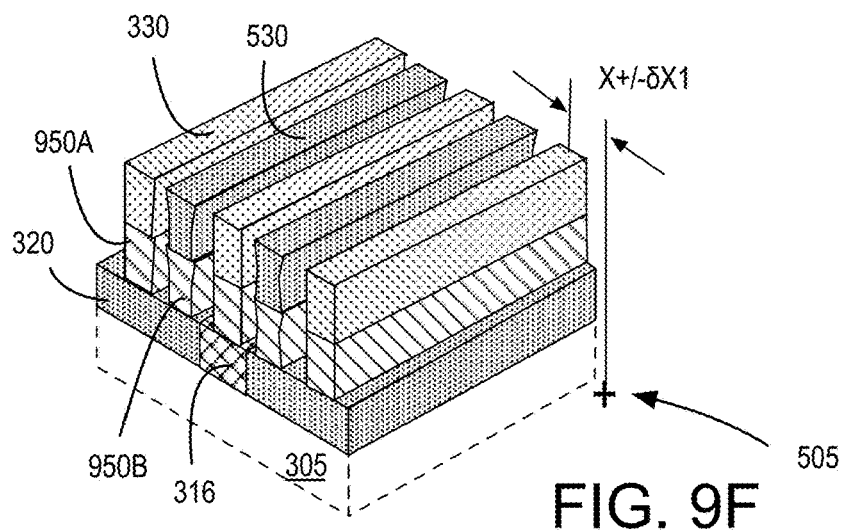

In the example illustrated in FIG. 9F, the 2D grating that was patterned into cap materials 330 and 530 is translated into 2D interconnect grating lines 950A and 950B. As shown, the entire thickness of interconnect material layer(s) 325 is etched through to expose portions of dielectric material 320 between adjacent interconnect grating lines 950A and 950B. Although the composition of interconnect grating lines 950A and 950B are substantially the same (e.g., that of interconnect material layer 325), interconnect grating lines 950A have a transverse width associated with cap material lines 542 while interconnect grating lines 950B have a transverse width associated with cap material lines 547. However, both interconnect grating lines 950A and 950B have the same line edge placement error of $\delta X1$ in the X-dimension relative to reference substrate structures 505.

With a 2D grating patterned into the interconnect material layer(s), methods 801 (FIG. 8) continue with segmentation of the 2D interconnect grating into rows of colinear interconnect features. The segmentation may proceed, for example, first at block 435 where first cap material features (e.g., alternate grating lines) are segmented with a first masked subtractive etch that is advantageously selective to the composition of one of the cap materials. At block 440, the other cap material features (e.g., alternate grating lines) are segmented with another masked subtractive etch that is advantageously selective to the other of the cap materials. After the multi-color cap materials are both segmented, a summation of the segmentation patterns may be translated concurrently into the 2D interconnect grating lines with a second etch of the interconnect line material performed at block 845. Methods 801 then continue with block 240 where a dielectric is deposited over the interconnect lines (if desired), followed by the formation of one or more upper level interconnect structures at output 290 to complete the IC structure.

Figure 9G:
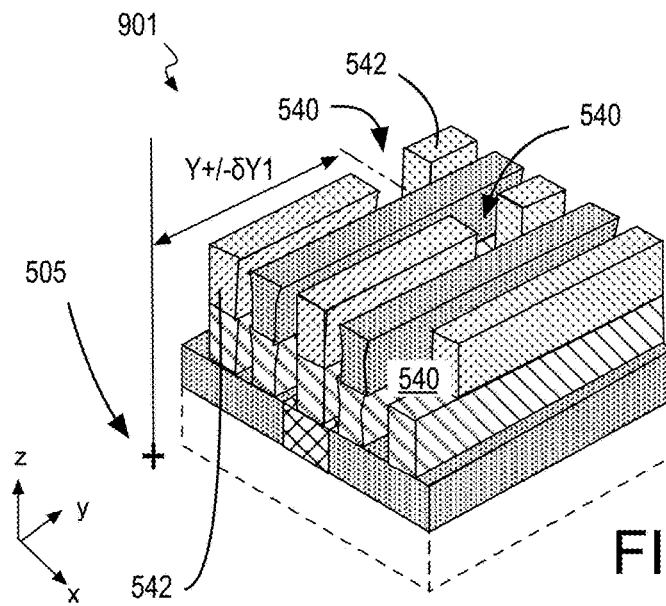
Figure 9H:
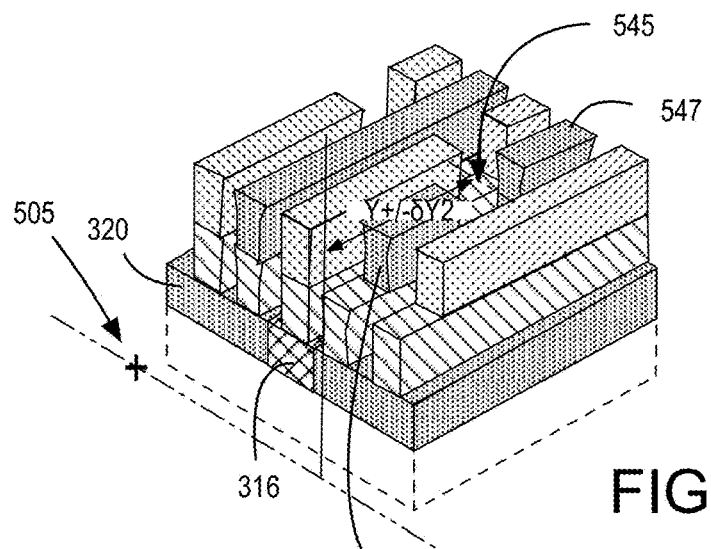

In the example shown in FIG. 9G, interconnect structure 901 includes end spaces 540 which bifurcate a first cap material line into a plurality of colinear cap material features 542. As described above, any suitable etch mask material may be applied over interconnect structure 901, and the mask material patterned with line end openings, for example with a photolithographic exposure and develop process. Any portion of one of the cap materials exposed by the line end openings in the mask pattern may then be removed with an etch process that is selective to one of the cap materials, for example to form end spaces 540. As noted above, end spaces 540 have an edge placement of $\delta Y1$. As further shown in FIG. 9H, after another masked etch of the cap material, interconnect structure 901 further includes end spaces 545 which bifurcate each of the cap material lines into a plurality of colinear cap material features 547. As described above, any suitable etch mask material may be applied over interconnect structure 901, and the mask material patterned with end openings, for example with another photolithographic exposure and develop process. Any portion of one of the cap materials exposed by the end openings in the mask pattern may then be removed with an etch process that is selective to one of the cap materials, for example to form end spaces 545. As noted above, end spaces 545 have an edge placement of $\delta Y2$.

Figure 9I:
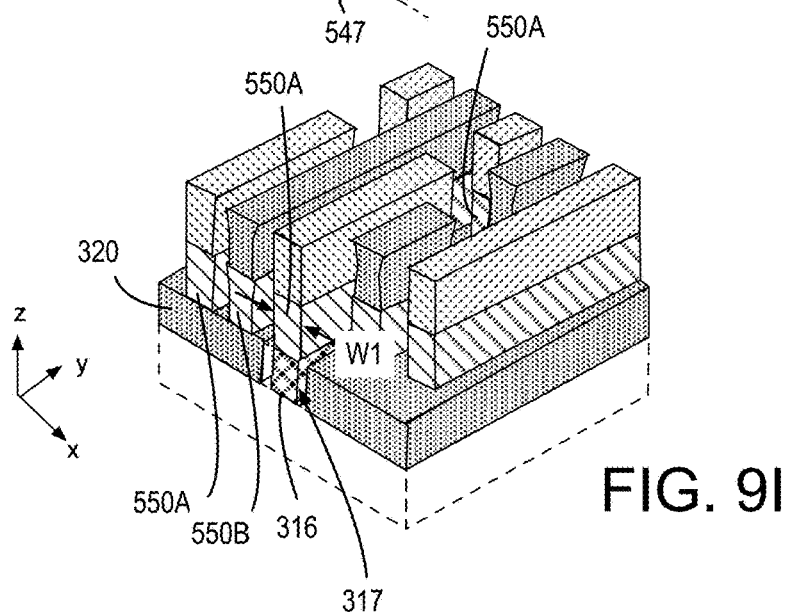

FIG. 9I further illustrates interconnect structure 901 following a second etch of the interconnect material, which translates the end spaces 540 and 545 into the interconnect line grating to form rows of colinear interconnect features 550A and 550B. As noted above, rows of colinear interconnect features 550A are interdigitated with rows of colinear interconnect features 550B. Although the composition of interconnect features 550A and 550B are substantially the same (e.g., that of interconnect material layer 325), interconnect features 550A have lateral dimensions and edge placement error associated with cap material features 542 while interconnect features 550B have lateral dimensions and edge placement error (i.e., misregistration) associated with cap material features 547. For example, interconnect features 550A have the edge placement error of δY1 in the Y-dimension and interconnect features 550B have the edge placement error of δY2 in the Y-dimension. Both interconnect features 550A and 550B have the same edge placement error of δX1 in the X-dimension. Any difference in transverse width and/or end spacing between cap material features 542 and 547 will also differentiate a row of colinear interconnect features 550A from a row of colinear interconnect features 550B such that the subtractively patterned interconnect features may be best represented as two populations of alternating or interdigitated rows of colinear features.

FIG. 9I further illustrates how the etch of interconnect material layer 325 exposes the underlying dielectric material 320 and "wing" portions of interconnect feature 316 that extend beyond the sidewall of one of the interconnect features 550A are also exposed. As shown, the exposed portions of interconnect feature 316 are etched away, for example according to methods 601 (FIG. 6), so that sidewalls 317 are in substantial alignment with sidewalls of one the overlying colinear interconnect features 550A. The subtractive patterning of interconnect feature 316 is self-aligned to the overlying interconnect feature 550A that is in physical contact with interconnect feature 316. Hence, within a plane of the transverse line width W1, interconnect feature 316 has a diameter substantially equal to width W1. In exemplary embodiments where interconnect feature 316 initially has the diameter CD3 (FIG. 9A), the diameter of interconnect feature 316 will vary from width W1 in a first plane (e.g., z-x plane in FIG. 9I) to the larger diameter CD3 in a second plane orthogonal to the first plane (e.g., z-y plane in FIG. 9I). As further illustrated in FIG. 9I, the subtractive etch of interconnect feature 316 leaves a gap between via sidewall 317 and an adjacent sidewall of dielectric 320 along a longitudinal length of interconnect feature 550A that is substantially equal to diameter CD3.

Figure 9J:
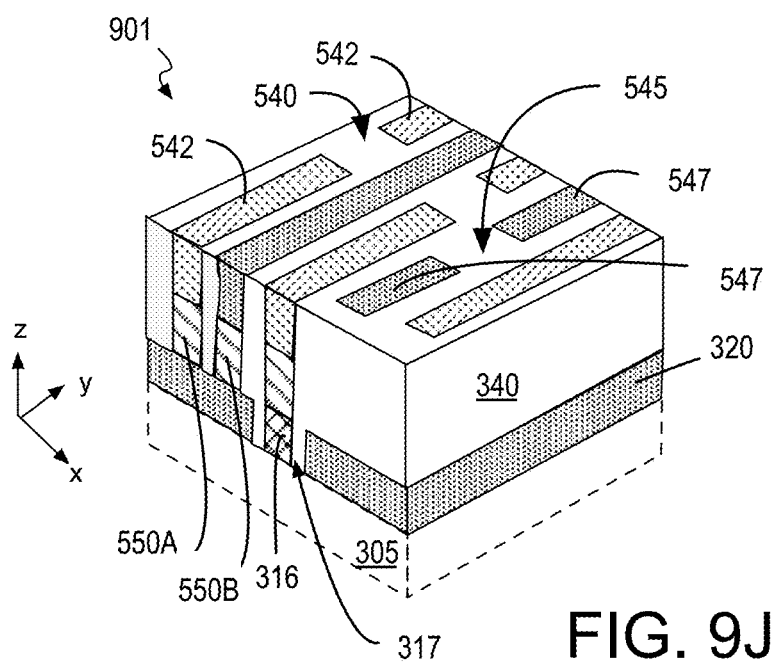

In FIG. 9J, interconnect structure 901 is further illustrated with dielectric material 340 within the end spaces 540, 545 between adjacent colinear interconnect features 550A, between adjacent colinear interconnect features 550B, and between individual rows of interconnect features 550A and individual rows of interconnect features 550B. As further shown, dielectric material 340 is in physical contact with via sidewall 317, within the gap between via sidewall 317 and dielectric material 320. In this example, dielectric material 340 is substantially planar with surfaces of colinear cap material features 542 and 547. Although not illustrated, a conformal dielectric material layer substantially as described above (e.g., 340' in FIG. 3D) may also be present. As shown in FIG. 9J, interconnect structure 901 is substantially complete through one level of interconnect line and lower-level via fabrication. Further processing may be performed to fabricate an upper level via and another level interconnect lines, for example. Various components of interconnect structure 901 may also be removed or otherwise altered from the state illustrated in FIG. 9I during subsequent fabrication processes. For example, some or all of one or both of cap material features 542 and 547 may be removed as sacrificial. Similarly, some or all of dielectric material 340 may be removed (or never deposited), for example where air gap interconnect line insulation is desired.

Figure 5L:
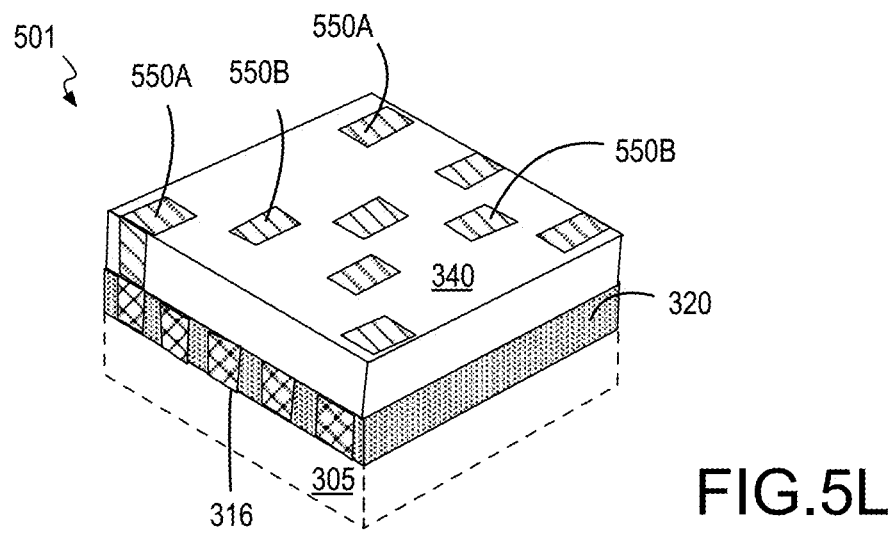

Although FIG. 9A-9I illustrate an implementation of methods 801 where interconnect lines are generated, methods 801 are also applicable to the fabrication of interconnect vias, substantially as described above in the context of methods 401 (e.g. FIG. 5J-5L).

The interconnect feature subtractive patterning techniques described above may be integrated with other aspects of via fabrication beyond subtractive via patterning. In some embodiments, the patterning of interconnect feature end spaces is utilized to define via openings. For example, a subset of the interconnect feature end spaces defined as part of a subtractive line patterning process may be backfilled with conductive material that makes physical contact with ends of the interconnect lines bifurcated by the end spaces. This via may then electrically couple those interconnect lines to lower-level and/or upper-level interconnect structures.

Figure 10:
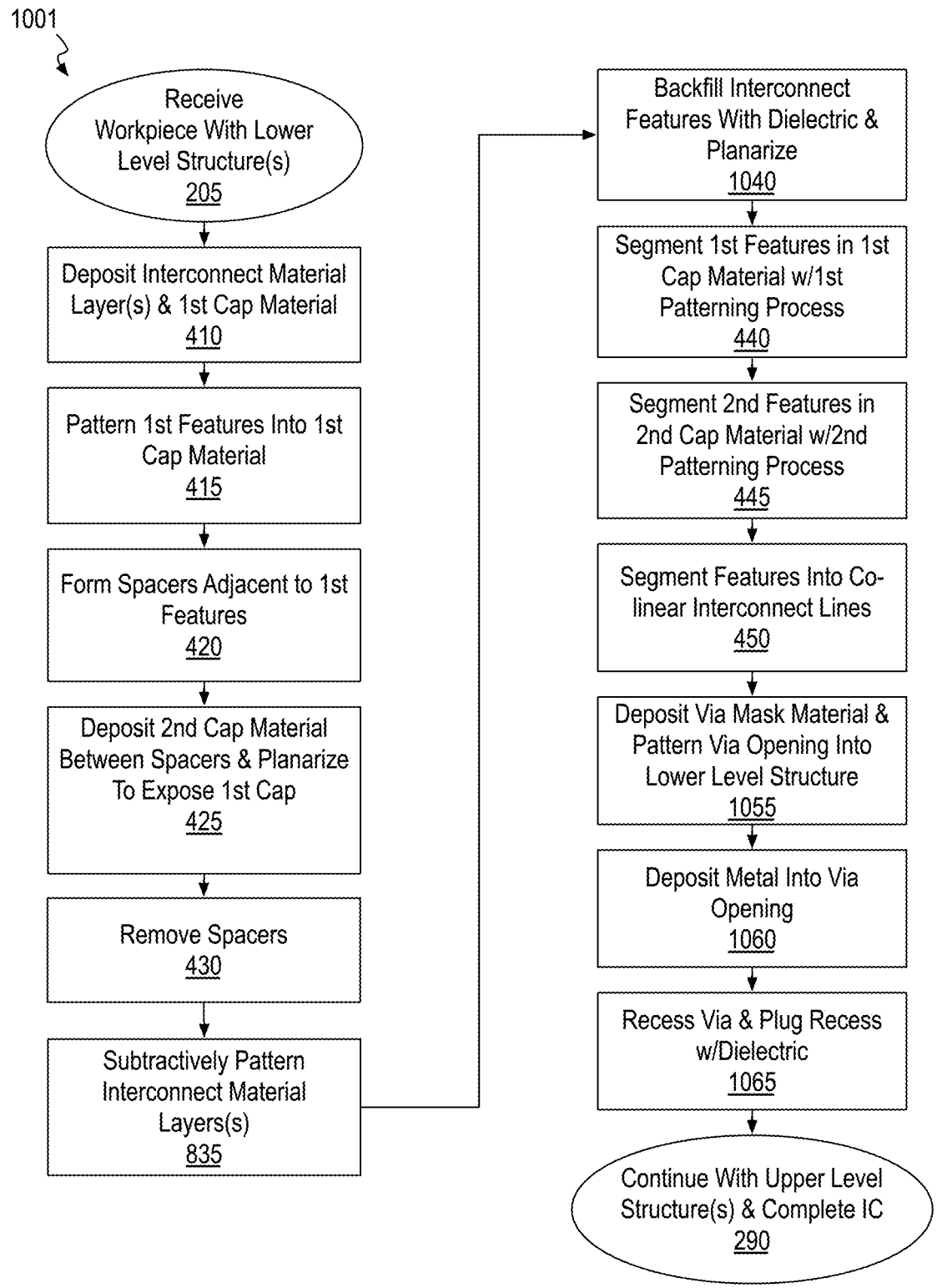
FIG. 10 is a flow diagram illustrating a line patterning method where vias are formed within some line end spaces defined during subtractive interconnect line patterning, in accordance with some embodiments.
Figure 11A:
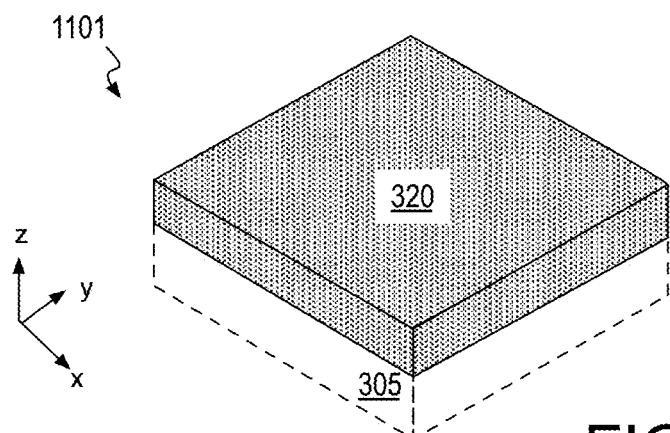
FIGS. 11A, 11B, 11C, 11D, 11E, 11F, 11G, 11H, 11I, 11J, 11K, 11L, 11M, 11N and 11O illustrate isometric sectional views of an IC interconnect structure evolving as the methods illustrated in FIG. 10 are practiced, in accordance with some embodiments.
Figure 11B:
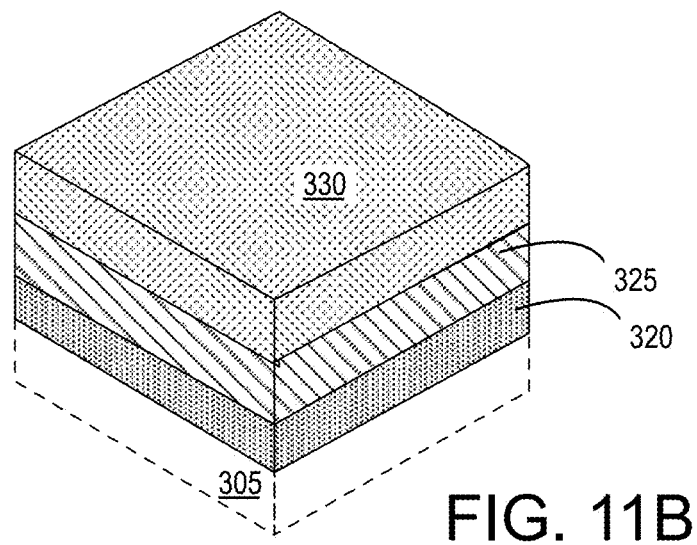
Figure 11C:
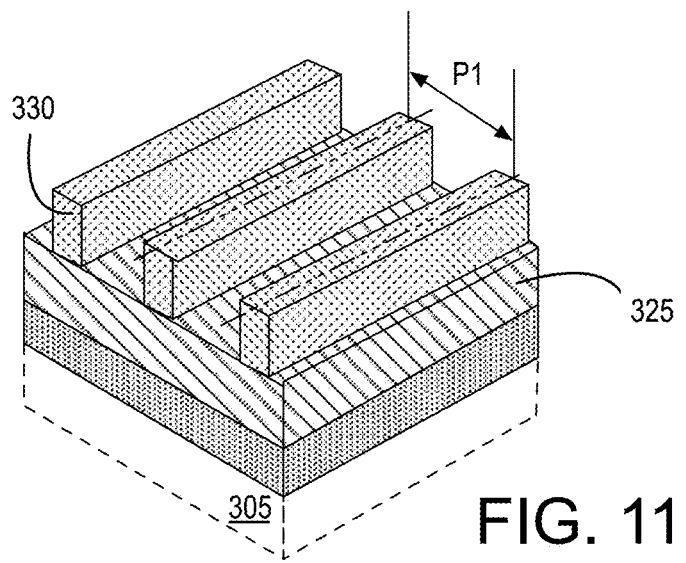
Figure 11D:
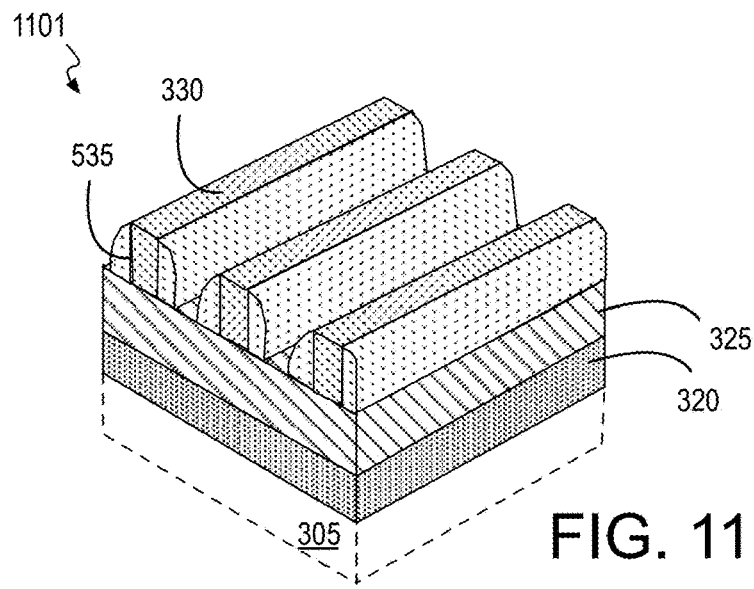
Figure 11E:
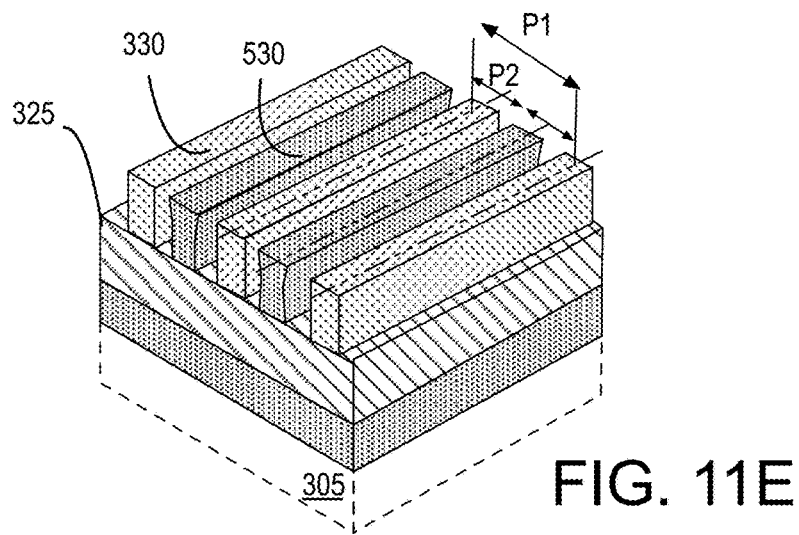

FIG. 10 is a flow diagram illustrating a subtractive interconnect patterning method 1001, in accordance with some alternative embodiments where vias are formed within some of the end spaces defined during subtractive interconnect line patterning. Hence, methods 1001 (FIG. 10) may be practiced as an alternative to methods 201, or in combination with methods 201. For these embodiments as well, placement of the line ends, or end-to-end line spacing again may rely on a multiple patterning process that leverages multi-color cap materials. FIG. 11A-11N illustrate isometric sectional views of an IC interconnect structure 1101 evolving as selected blocks of the methods 1001 are practiced, in accordance with some embodiments.

Methods 1001 again begin at block 205 where a workpiece having a lower level structure is received. The workpiece and lower level structure may be substantially as described above in the context of methods 201,401 or 801, for example. However, in the example further illustrated in FIG. 11A, IC interconnect structure 1101 lacks any lower-level interconnect vias embedded within dielectric material. Instead a lower-level interconnect via will be fabricated after subtractive line patterning.

Returning to FIG. 10, methods 1001 proceed through blocks 410, 415, 420, 430, 435 and 835 substantially as described above in the context of methods 801 (FIG. 8). As further illustrated in FIGS. 11B, 11C, 11D, and 11E, two compositionally distinct cap materials are formed into alternating features. Any suitable masked etch process, such as any of those described above in the context of methods 401 (FIG. 4), may be practiced to generate the 2D grating of lines of cap material 330 interleaved with lines of cap material 530.

Methods 1001 (FIG. 10) continue at block 435 where the features defined in the cap materials are subtractively patterned into the interconnect material layer(s). The features of cap material may be employed as etch masks for any etch process known to be suitable for the composition of the interconnect material layer(s.) In exemplary embodiments where the interconnect material layer(s) include a metal layer, an RIE or IBE process is practiced at block 435 to remove the interconnect material not protected by the lines of cap material. In some advantageous embodiments where the interconnect material is a metal that can be chemically etched, the etch process at block 435 is selective to the metal relative to both of the cap materials.

Figure 11F:
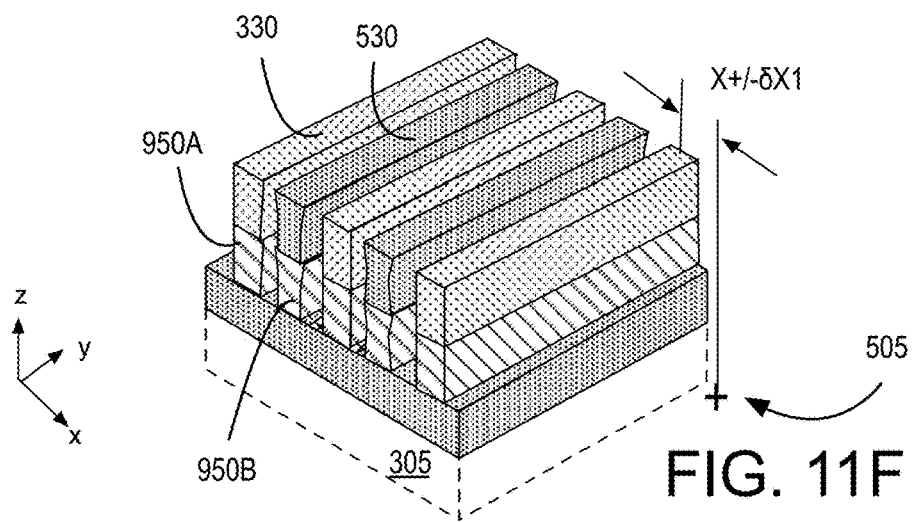

In the example illustrated in FIG. 11F, the 2D grating that was patterned into cap materials 330 and 530 is translated into 2D interconnect grating lines 950A and 950B. As shown, the entire thickness of interconnect material layer(s) 325 is etched through to expose portions of dielectric material 320 between adjacent interconnect grating lines 950A and 950B. Although the composition of interconnect grating lines 950A and 950B are substantially the same, interconnect grating lines 950A have a transverse width associated with features of cap material 330 while interconnect grating lines 950B have a transverse width associated with cap material features 530. However, both interconnect grating lines 950A and 950B have the same edge placement error of δX1 in the X-dimension relative to reference substrate structures 505, and therefore also relative to any particular functional feature of an IC (e.g., underlying interconnect vias, other interconnect lines, device terminals, etc.).

Figure 11G:
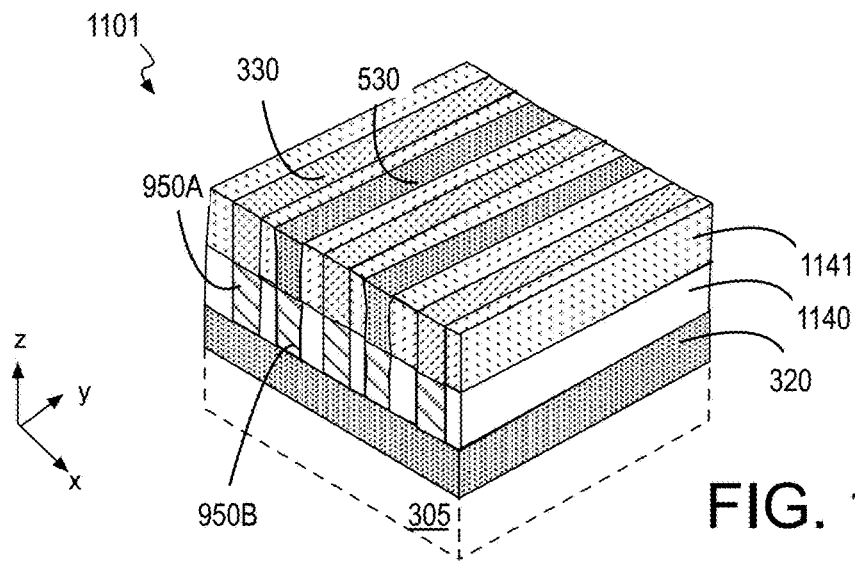

With a 2D grating patterned into the interconnect material layer(s), methods 1001 (FIG. 10) continue with the definition of end spaces. At bock 1040, topography resulting from the interconnect grating line etch may be at least partially backfilled by a deposition of one or more dielectric materials, which may then be planarized with the cap material. Any spin-on or other flowable dielectric deposition technique may be practiced at block 1040. In some embodiments, a non-photosensitive carbonaceous material comprising predominantly carbon (i.e., carbon-based), such as diamond-like carbon (DLC) is deposited. In other embodiments, any of SiO, SiON, hydrogen silsesquioxane, methyl silsesquioxane, polyimide, polynorbornenes, benzocyclobutene may be deposited. In the example further illustrated in FIG. 11G, a dielectric material 1140 is in contact with sidewalls of interconnect grating lines 950A and 950B a carbon hardmask material 1141 is between the lines of cap materials 330 and 530. The structure illustrated in FIG. 11G may be fabricated, for example, with a first flowable dielectric deposition followed by a recess etch that is selective to the dielectric material 1140 (relative to cap materials 330 and 530). The carbon hardmask material 1141 may then be deposited and planarized with a CMP polish stopping upon exposure of cap materials 330 and 530. The planarized multi-color surface illustrated in FIG. 11G is ready for subtractive patterning of line end spaces.

In exemplary embodiments, end spaces are fabricated with a multi-pattern grating-based patterning process. Referring back to FIG. 10, methods 1001 continue at block 440 where lines of one of the cap materials are segmented into colinear features of cap material with a first patterning process. Then, at block 445, lines of the other of the cap materials are segmented into colinear features of cap material with a second patterning process. Following the separate patterning of the two cap materials, the underlying interconnect features may be subtractively patterned at block 450. In methods 1001, the processing performed at blocks 440-450 may be substantially as described above, for example in the context of methods 401 (FIG. 4) or methods 801 (FIG. 8).

Figure 11H:
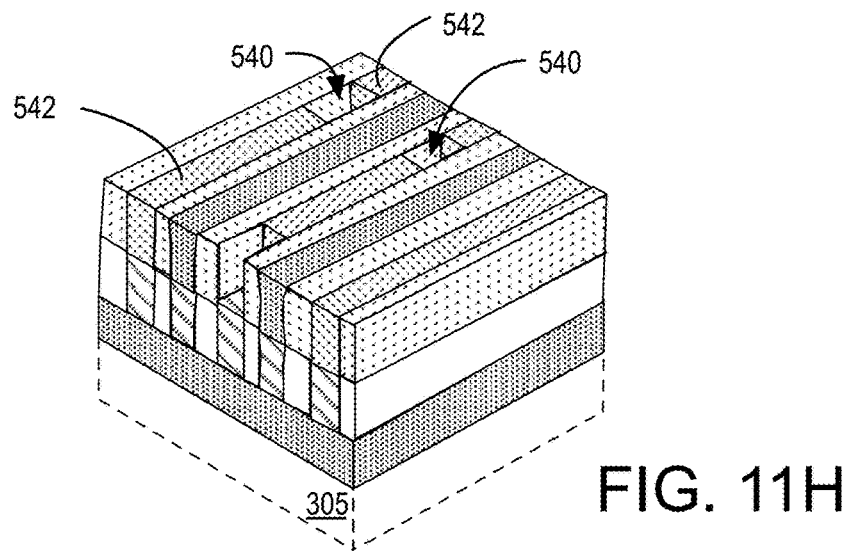
Figure 11I:
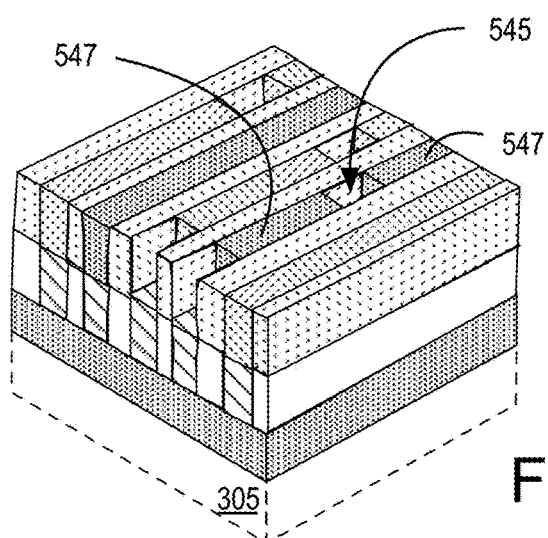
Figure 11J:
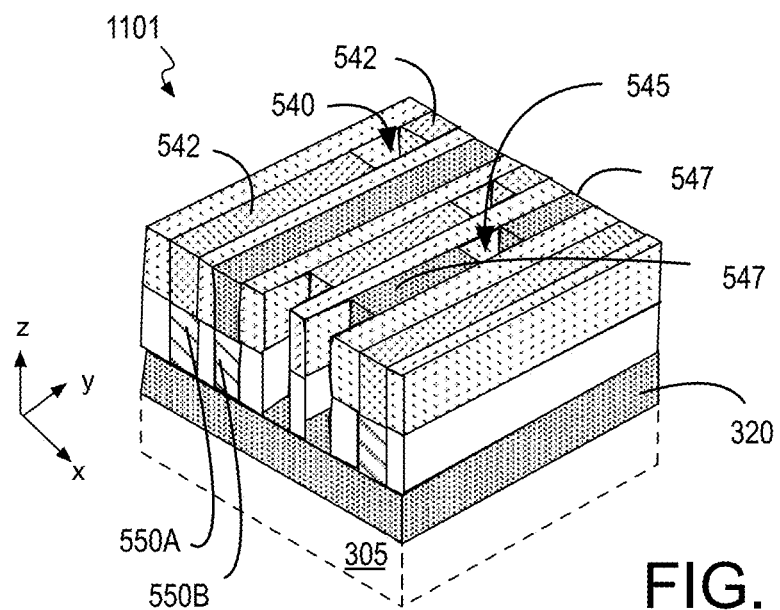

As patterned according to a first masked etch, end spaces 540 between adjacent colinear features 542 are further illustrated in the example shown in FIG. 11H. End spaces 545 between adjacent colinear features 547 patterned according to a second masked etch are further illustrated in the example shown in FIG. 11I. As noted above, selectivity of the two masked etch processes for one or the other of the cap materials 330, 530 may be relied upon to limit edge placement errors to the y-dimension. FIG. 11J further illustrates interconnect structure 901 following a subtractive patterning of interconnect features 550A, 550B. The interconnect material has been removed everywhere interconnect line grating 950A, 950B were exposed by end spaces 540, 545. The interconnect grating line etch therefore segments grating lines into rows of colinear features 550A, 550B, which in this example are colinear lines. Dielectric material 320 is exposed within the end spaces within each row of colinear lines.

Returning to FIG. 10, methods 1001 continue with forming a via in a subset of the end spaces between adjacent colinear interconnect lines. This via essentially refills the end space etched at block 450 with conductive material that will extend out of the plane of the interconnect lines. Depending on the embodiment, the via may be formed to couple the interconnect line(s) to a lower interconnect level, an upper interconnect level, or both lower and upper interconnect levels. Via fabrication proceeds at block 1055 where a via mask material is deposited over the patterned interconnect features, filling the end spaces. The mask material is then patterned to open one or more of the end spaces. If the via is to extend to a lower-level, the dielectric material exposed at a bottom of the end spaces is etched as masked by the surrounding dielectric material(s) and interconnect line ends. The via etch is therefore self-aligned to the subtractively patterning interconnect line pattern. Conductive material is deposited into the unmasked end spaces at block 1060. Any deposition process suitable for a via may be practiced at block 1060, such as, but not limited to electrolytic or electroless plating, CVD/ALD, or PVD.

Figure 11K:
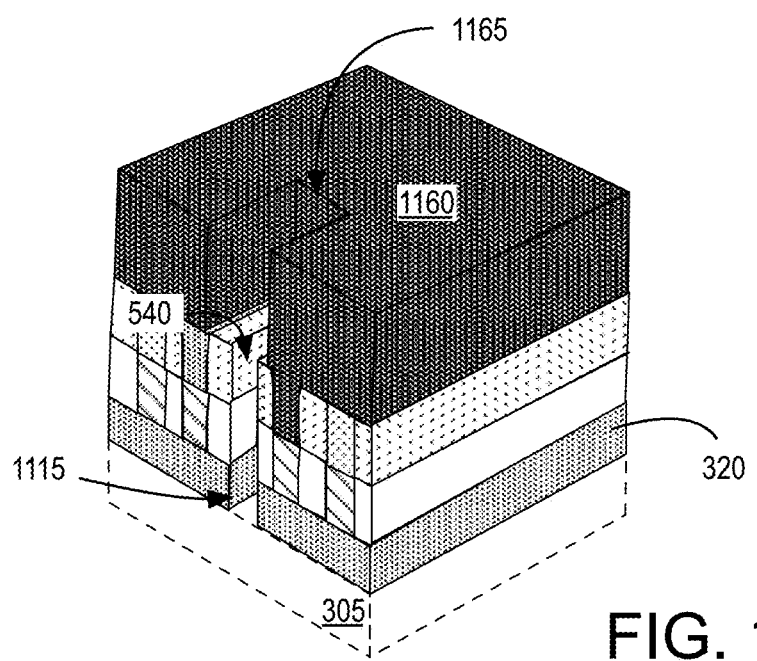
Figure 11L:
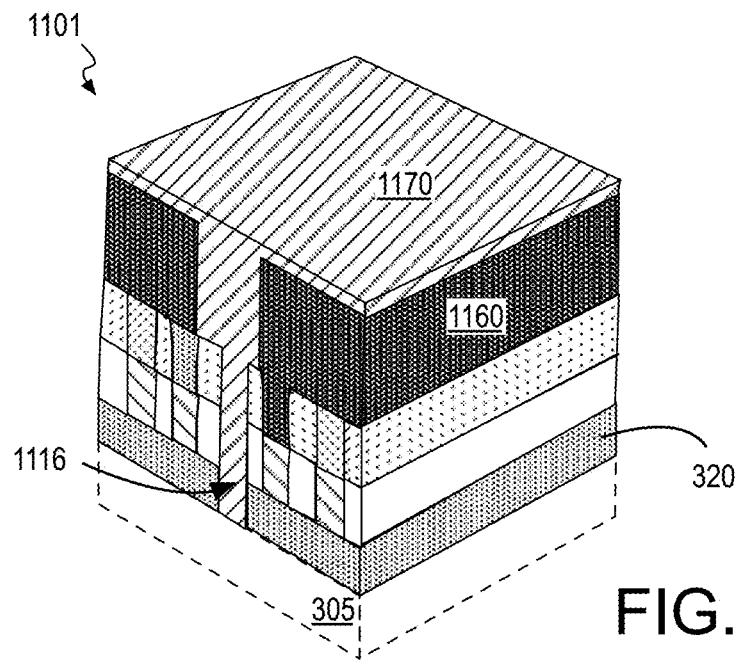

In the example illustrated in FIG. 11K, a via mask material 1160 has an opening 1165 that overlaps one end space 540 where a via opening 1115 has been etched through dielectric material 320, exposing a surface of substrate 305 at a bottom of via opening 1115. As further illustrated in FIG. 11L, via material 1170 has been deposited over via mask material 1160 and into via opening 1115 to form an interconnect via 1116. Although via material 1170 may have any composition, in some exemplary embodiments, via material 1170 comprises at least one of Cu, W, Ru, Co, Mo, W, Ir, Rh, or Pt. In some embodiments, metallization 1170 has a different composition than interconnect features 550A and 550B. For example, metallization comprising predominantly Cu may be electrolytically plated to form via 1116. In another example, metallization comprising predominantly W may be deposited by CVD/ALD.

Figure 11M:
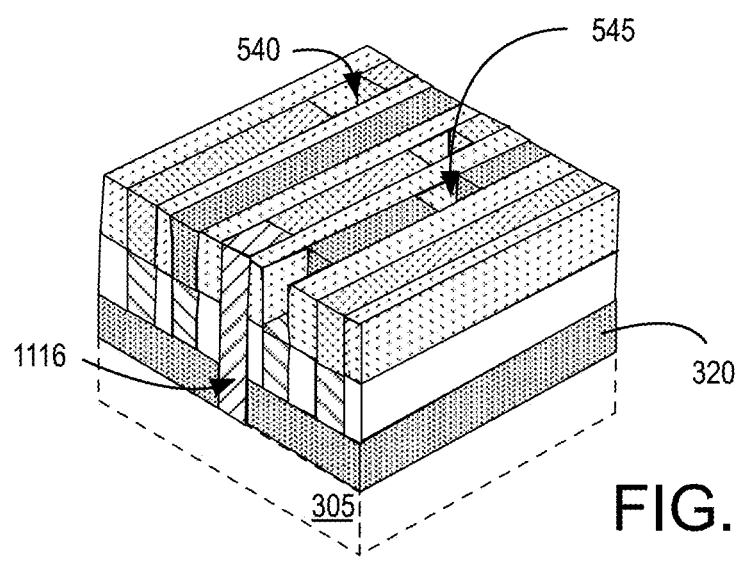
Figure 11N:
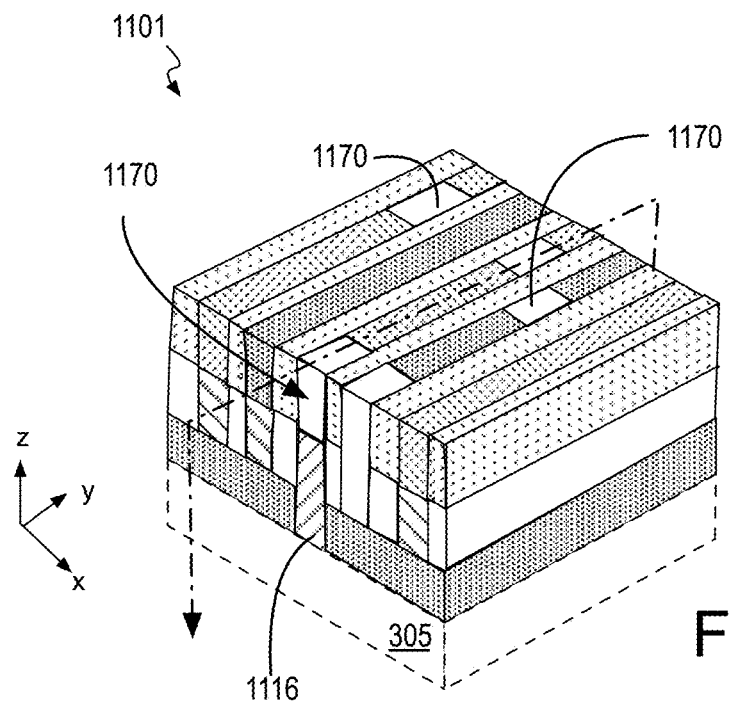

Following metal deposition, a planarization process and/or etch back process may be performed to remove any metallization overburden and/or strip off via mask material 1160. For the example further illustrated in FIG. 11M, interconnect via 1116 extends both above and below the x-y plane of interconnect features 550A, 550B. Therefore, an upper interconnect level may be fabricated in direct contact with interconnect via 1116. Alternatively, for embodiments where an interconnect via is only to couple to lower-level interconnect structures, methods 1001 (FIG. 10) continue at block 1065 where the interconnect via is etched back to form a recess, which is then at least partially backfilled with a dielectric material. Methods 1001 are then substantially complete at output 290 where any upper-level interconnect structures may be fabricated according to any embodiments herein or according to any known techniques.

Figure 11O:
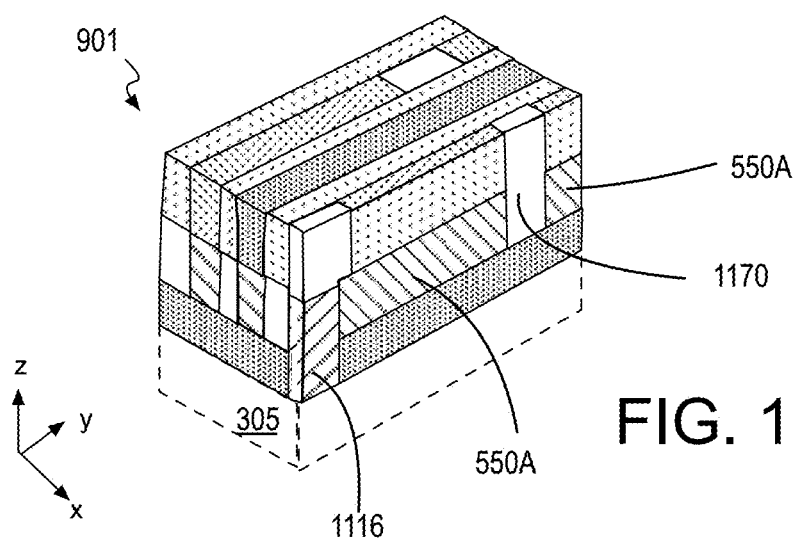

In the example further illustrated in FIG. 11N, a top surface of via 1116 has been recessed by an etch process. A plug dielectric material 1170, which may have any composition suitable as an ILD, is over the top surface of via 1116 and within the line end spaces 540, 545. FIG. 11O illustrates another sectional view of IC interconnect structure 901 taken along the plane denoted by dashed line in FIG. 11N. As shown in FIG. 11O, a sidewall of interconnect via 1116 is in direct contact with an end sidewall of a first colinear interconnect feature 550A. This sidewall contact interface, along with any compositional differences between via 1116 and interconnect features 550A is indicative of a fabrication technique where the via is defined along with end spaces between adjacent colinear interconnect features 550A. As such, via 1116 will have an edge placement error, or misregistration, substantially equal to the edge placement error, or misregistration of the end spaces between one set of colinear features (e.g., 550A). Although not depicted, any via intersecting one of the intervening rows of colinear features (e.g., 550B) is similarly self-aligned to the edge pattern and so will have an edge placement error, or misregistration, substantially equal to that of the end spaces between the second set of colinear features (e.g., 550B).

Figure 12:
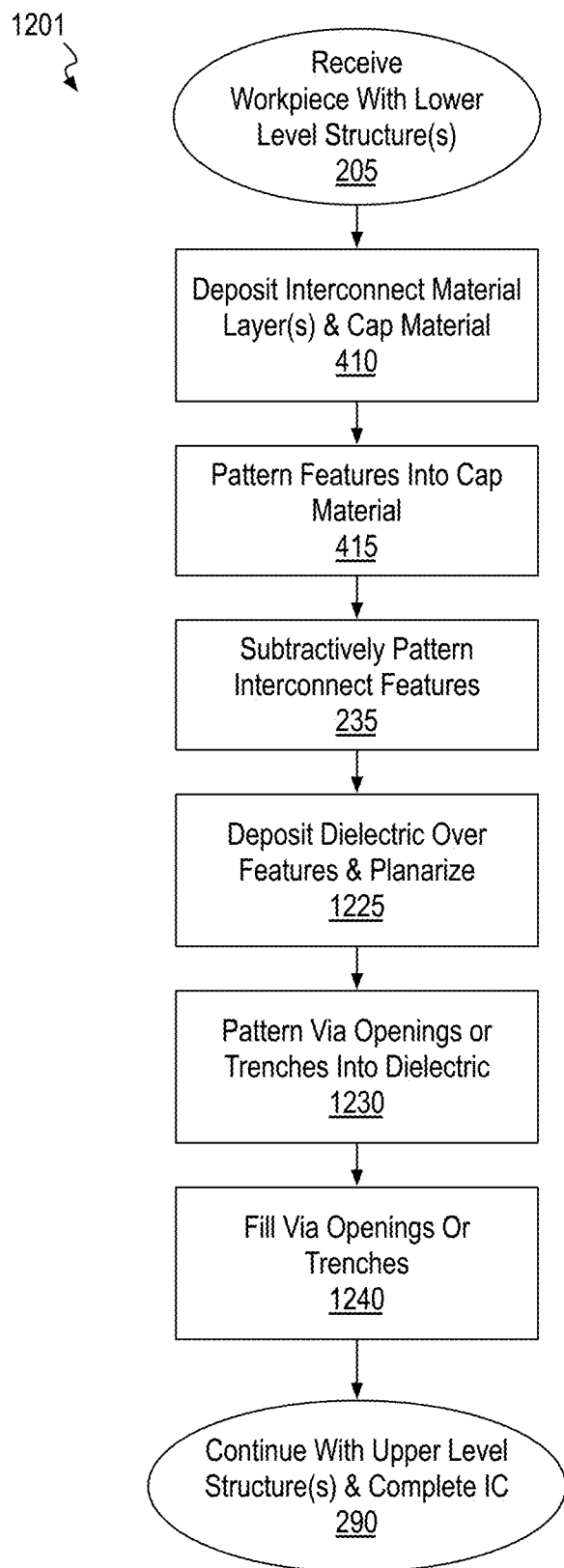
FIG. 12 is a flow diagram illustrating interconnect line patterning and interconnect via fabrication methods 1201, in accordance with some embodiments where vias are subsequently landed on interconnect lines.

Interconnect vias may also land on subtractively patterned lines, rather than intersect end sidewalls of subtractively patterned lines, as described above. Interconnect lines may similarly land on subtractively patterned vias. FIG. 12 is a flow diagram illustrating interconnect fabrication methods 1201, in accordance with some embodiments where via openings or trenches are landed on subtractively patterned interconnect lines or vias, and then filled according to a single-damascene or dual-damascene technique. Hence, just as subtractive patterning of interconnect features may be integrated with damascene fabrication of lower-level interconnect features, subtractive patterning of interconnect features may also be integrated with damascene fabrication of upper-level interconnect features. Methods 1201 may be practiced as an alternative to methods 201 (FIG. 2), or in combination with methods 201, for example. FIG. 13A-13D illustrate cross-sectional views of an IC interconnect structure 1301 evolving as selected blocks of the methods 1201 are practiced, in accordance with some embodiments.

Figure 13A:
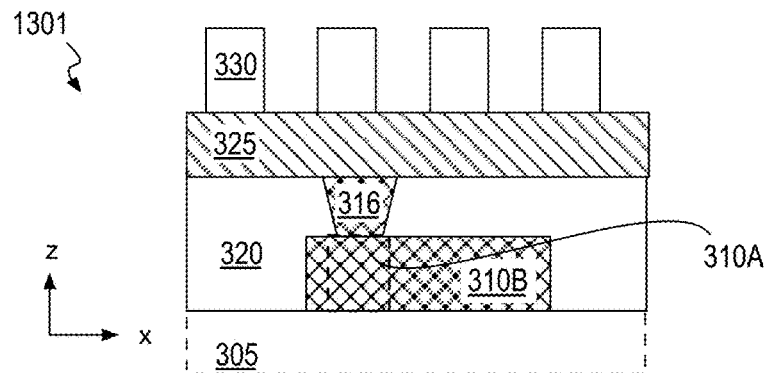
FIGS. 13A, 13B, 13C and 13D illustrate cross-sectional views of an IC interconnect structure 1301 evolving as selected blocks of the methods 1201 are practiced, in accordance with some embodiments.
Figure 13B:
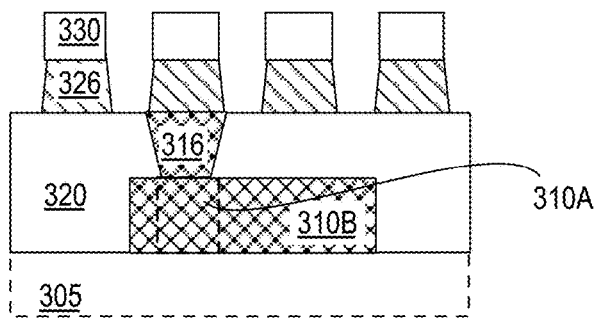

Methods 1201 again begin at block 205 where a workpiece having a lower level structure is received. The workpiece and lower level structure may be substantially as described above in the context of methods 201, 401, 801, or 1001, for example. Methods 1201 similarly continue with block 410 where an interconnect material layer is deposited over the workpiece and one or more cap materials are formed over the interconnect material layer, for example substantially as described above. At block 415, features (e.g., 2D grating lines) are patterned into the cap material(s) and those features are subtractively patterned into the underlying interconnect material layer at bock 235. FIGS. 13A and 13B illustrate one example where interconnect material layer 325 has been etched to form interconnect features 326. The sidewall profile of interconnect features 326 may have any of the features described above (e.g., positive slopes, etc.). Although only one cap material 330 is illustrated, multiple cap materials are also possible, for example substantially as described above.

Returning to FIG. 12, methods 1201 continue with single or dual damascene processing to form upper level interconnect features. For example, at block 1225, any dielectric material suitable as an ILD is deposited by any technique over the subtractively patterned interconnect features, and planarized. At block 1230, via openings or trenches may be subtractively patterned (e.g., etched) into one or more of the dielectric materials on workpiece. Any single-step or multi-step anisotropic reactive ion etch (RIE) process (e.g., based on a CxFy plasma chemistry) may be practiced at block 1230 to form via openings or trenches, as embodiments are not limited in this respect. At block 1240, interconnect via or line material is deposited into the via openings or trenches that were formed at block 1230. Interconnect via or line material may comprise one or more metal and may include, for example, a barrier and/or adhesion material and a fill material. In some embodiments, an electrolytic plating process is practiced at block 1240 to fill via openings or trenches with at least one metal, such as, but not limited to copper. Following the interconnect feature fill, the via or line material is planarized, for example to be substantially coplanar with a surrounding dielectric material to complete fabrication of the damascene interconnect feature. Methods 1201 complete at output 290 where any upper-level interconnect structures may be further fabricated. For example, another single-damascene process may be practiced to form upper-level interconnect lines. Alternatively, upper-level interconnect lines may be fabricated with a subtractive process.

Figures 13C, 13D:
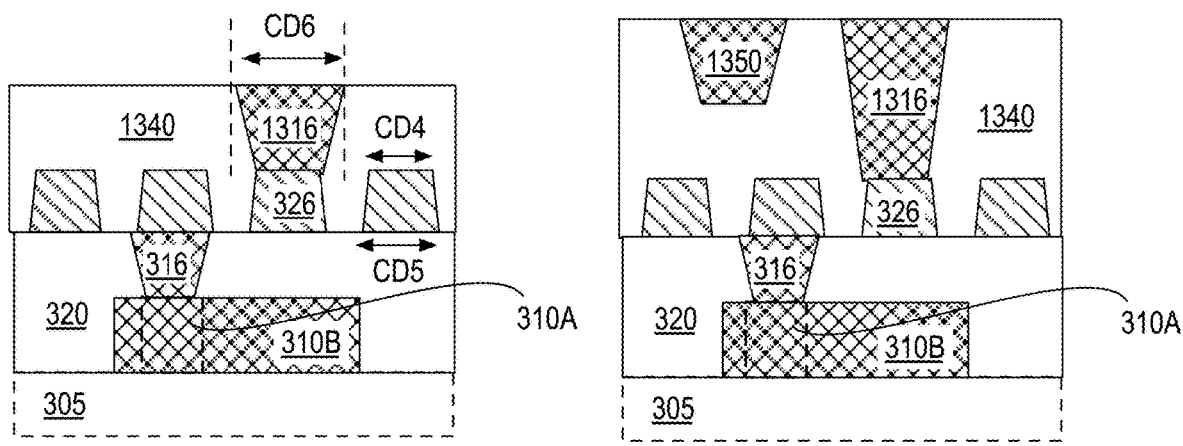

FIG. 13C further illustrates an exemplary single-damascene structure where an upper-level damascene interconnect feature 1316 is in physical contact with subtractively patterned interconnect feature 326. For embodiments where interconnect feature 326 is a line, damascene interconnect feature 1316 is a via. For embodiments where interconnect feature 326 is a via, damascene interconnect feature 1316 is a line. As shown, interconnect feature 326 has the sidewall taper indicative of a subtractive etch process while damascene interconnect feature 1316 has the inverse sidewall taper indicative of a damascene process (e.g., with a top diameter CD6 being larger than the bottom diameter). Damascene interconnect structure 1316 extends through at least a portion of dielectric material 1340, which may be, for example, a low-k dielectric material (e.g., SiOC) having a relative permittivity below 3.5. In other examples, dielectric material 1340 may be any of SiO, SiON, hydrogen silsesquioxane, methyl silsesquioxane, polyimide, polynorbornenes, benzocyclobutene, or the like.

FIG. 13D further illustrates an exemplary dual-damascene structure where damascene interconnect feature 1316 is a via, and an upper-level interconnect line 1350 has is also in dielectric material 1340. Here also, interconnect features 326 have the sidewall taper indicative of a subtractive etch process while damascene interconnect features 1316 and 1350 have the inverse sidewall taper indicative of a damascene process.

As described above, a monolithic IC interconnect structure in accordance with some embodiments herein may include damascene vias. However, IC an interconnect structure in accordance with some other embodiments may instead include a planar slab interconnect via. Similar to a subtractively patterned interconnect line, a planar slab via may comprise one or more layers of conductive material that have been deposited upon a planarized substrate material that lacks any features that the via material must fill. A planar slab via may be subtractively defined along with the subtractive definition of an interconnect line in an interconnect level above or below (or both) the interconnect via such that the slab via is contiguous with, and self-aligned to, a portion of an interconnect line. Accordingly, the via etching and trench etching typical of damascene via processing may be replaced with subtractive patterning of substantially planar conductive material layers. Challenges associated with scaling a via etch and/or a via metal fill to ever higher aspect ratios may thereby be avoided.

Figure 14:
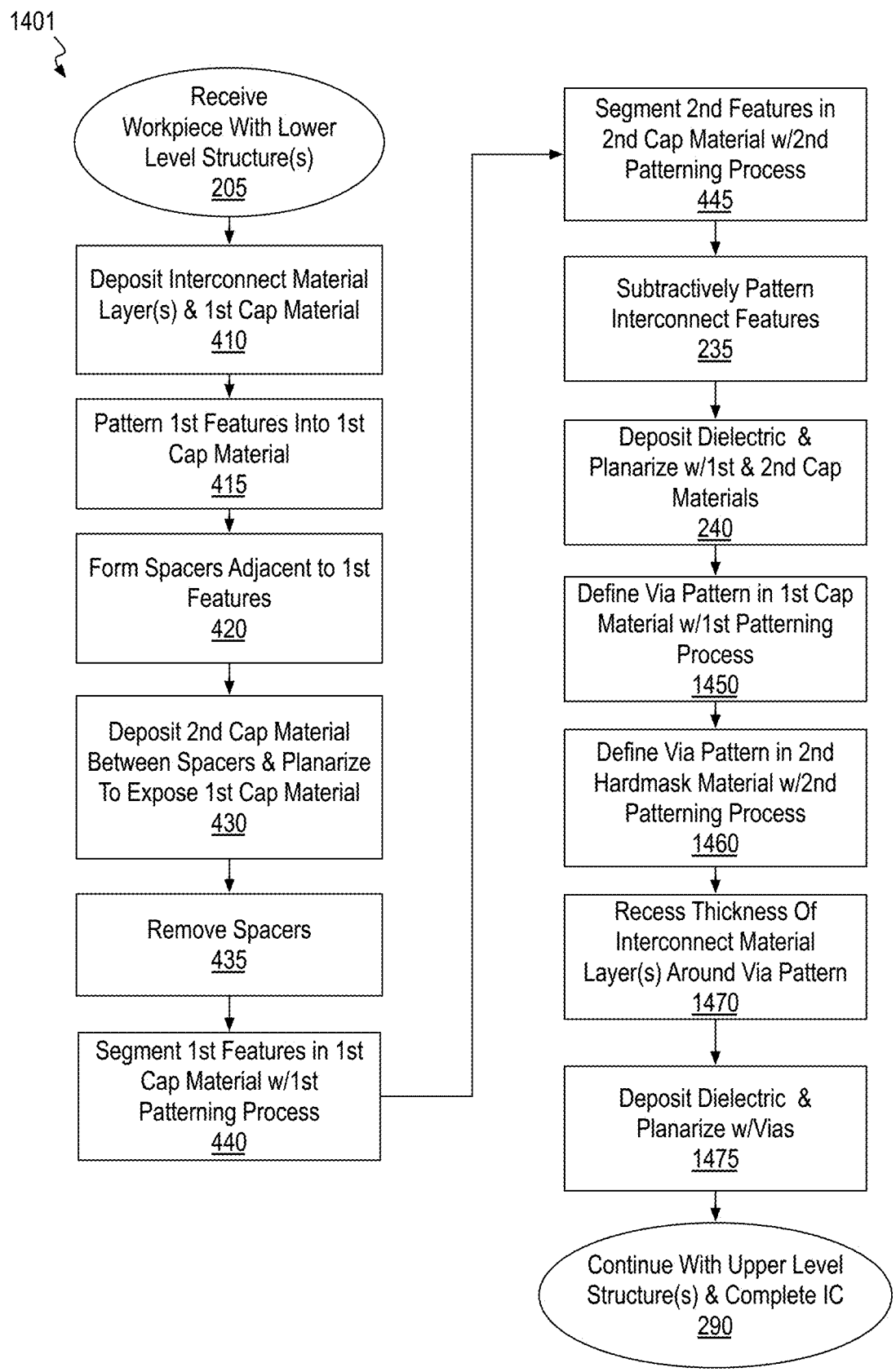
FIG. 14 is a flow diagram illustrating methods for fabricating an IC interconnect structure including subtractively patterned lines and planar slab interconnect vias, in accordance with some embodiments.
Figure 15A:
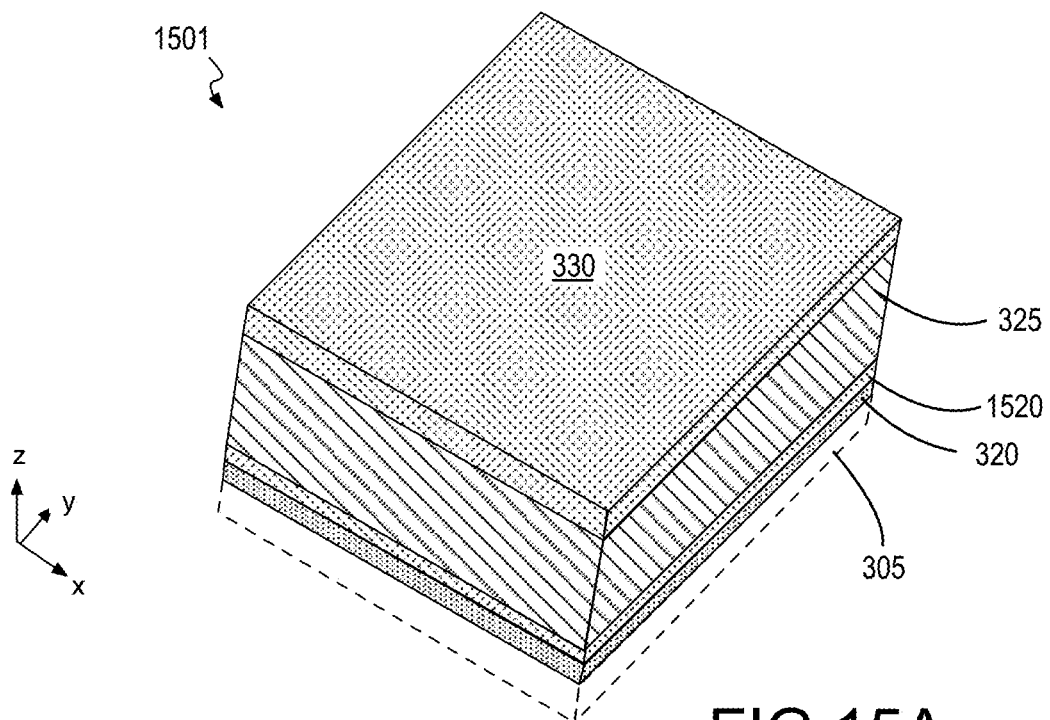
FIGS. 15A, 15B, 15C, 15D, 15E, 15F, 15G, 15H, 15I, 15J, 15K, 15L, 15M and 15N illustrate isometric views of an exemplary IC interconnect structure evolving during the practice of the methods illustrated in FIG. 14, in accordance with some embodiments.
Figure 15B:
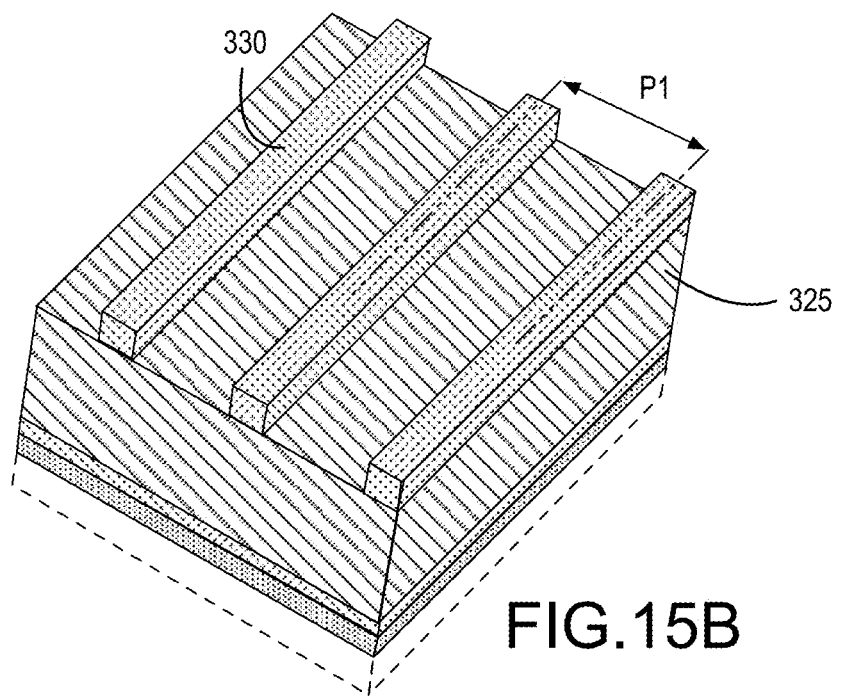
Figure 15C:
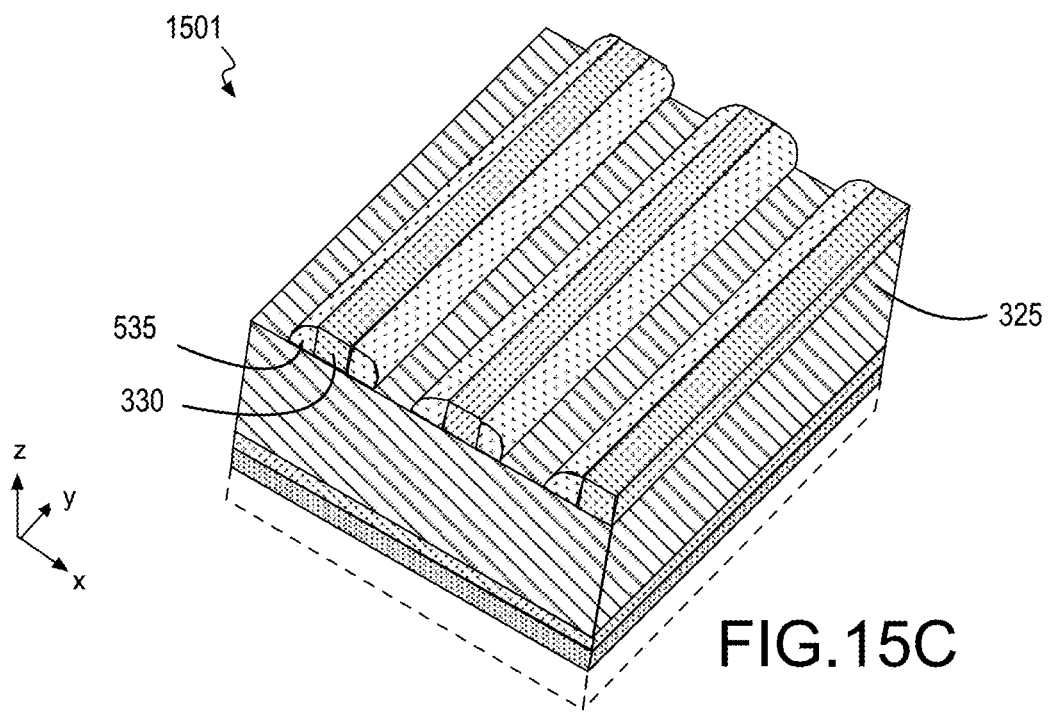
Figure 15D:
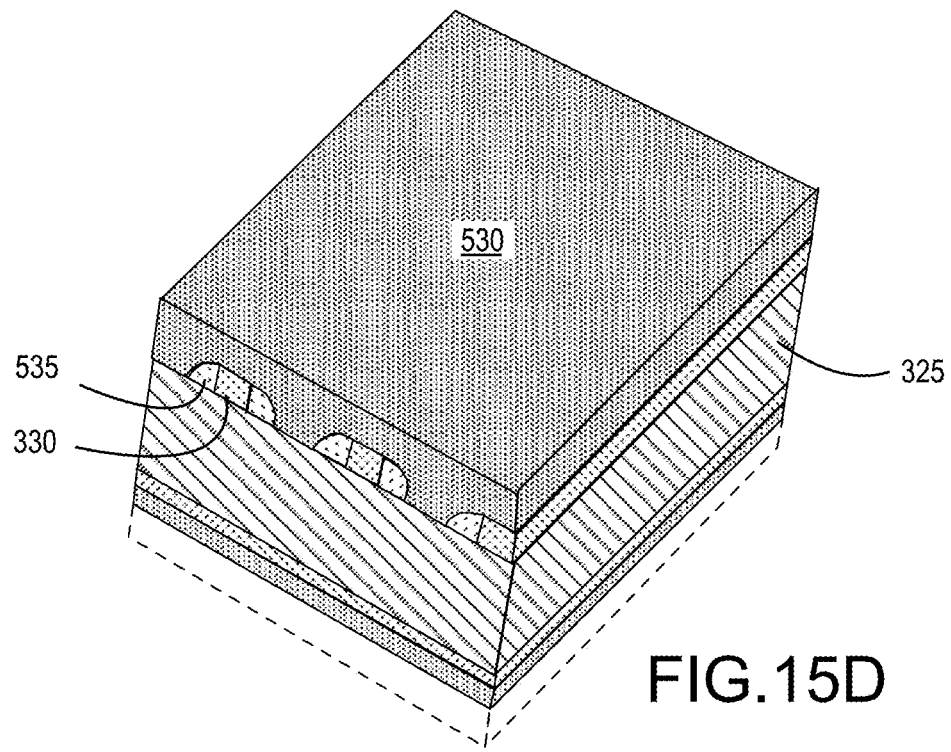
Figure 15E:
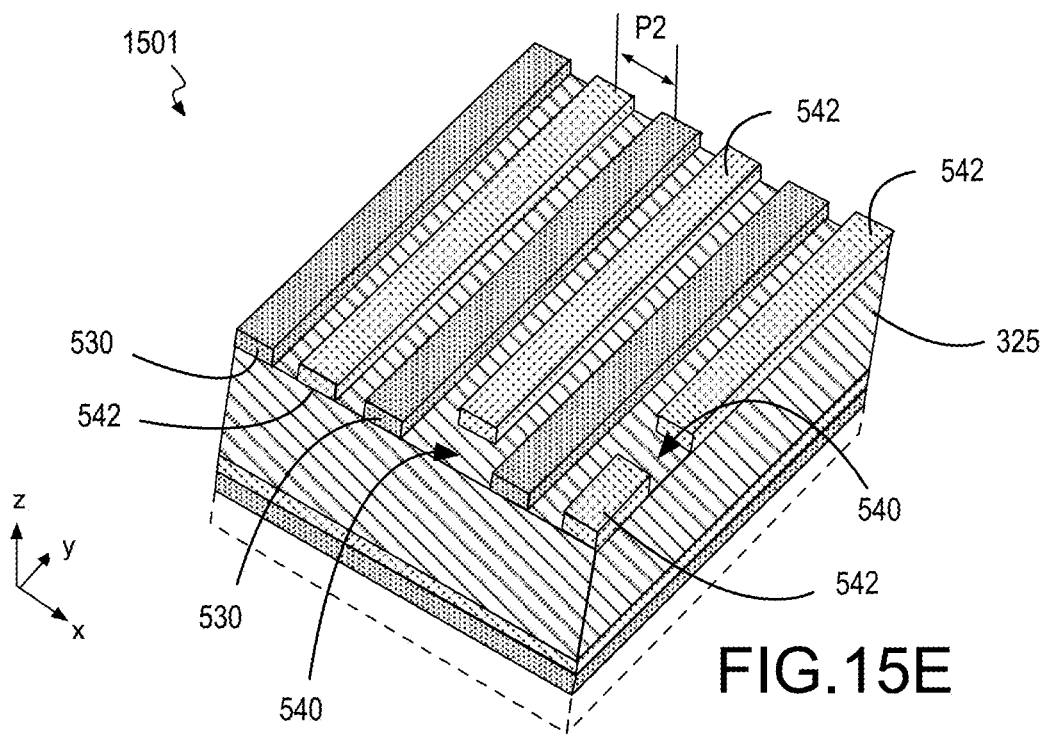
Figure 15F:
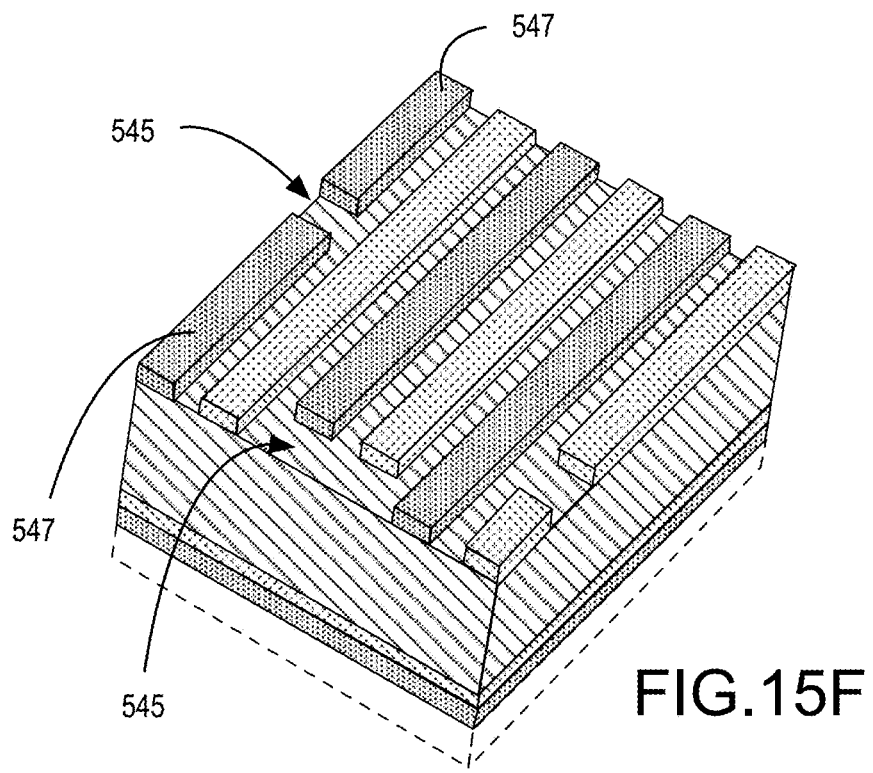
Figure 15G:
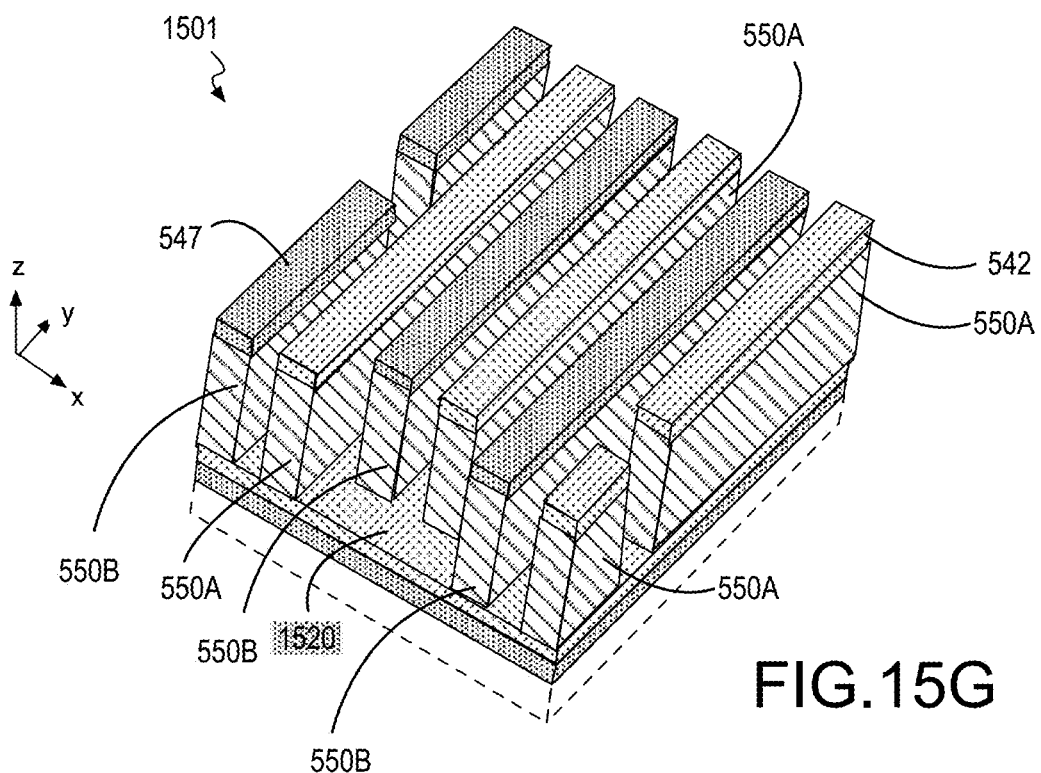
Figure 15H:
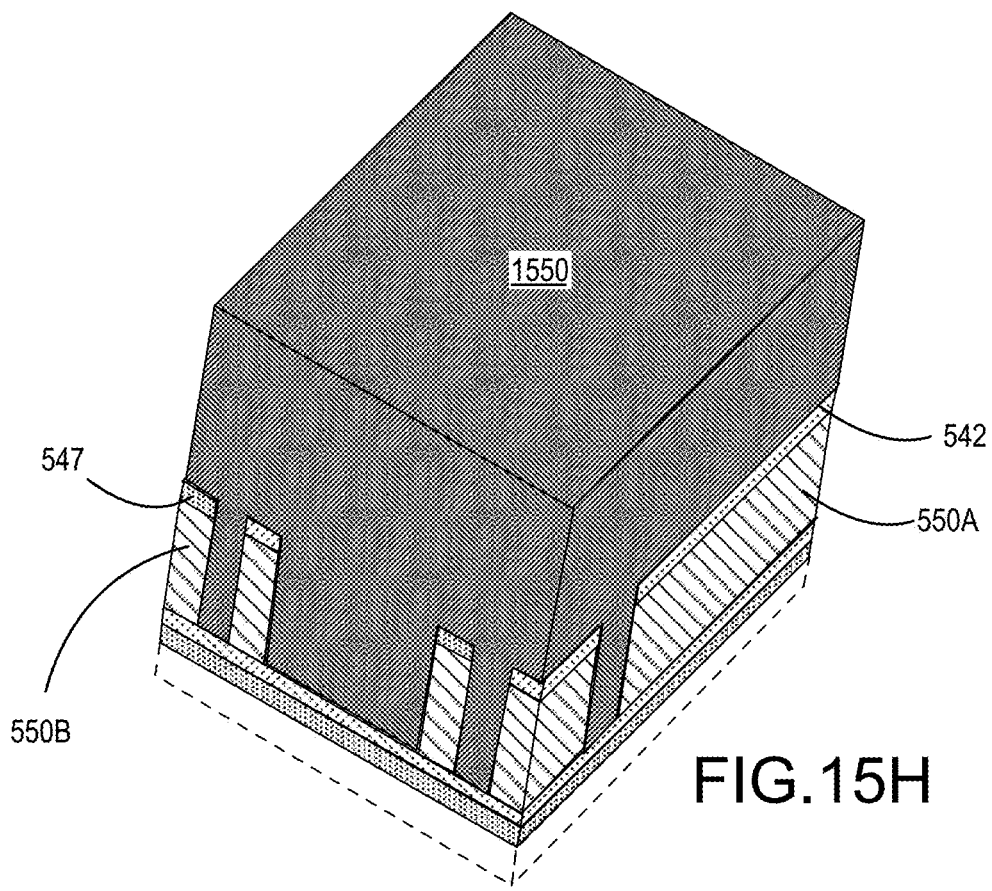

In some planar slab interconnect via embodiments, subtractive via patterning may be integrated with a multi-color cap material that is patterned with two or more subtractive patterning processes. The subtractive interconnect feature patterning techniques described above for multi-colored cap material may therefore be extended to include slab via patterning. FIG. 14 is a flow diagram illustrating methods 1401 for fabricating an IC interconnect structure including subtractively patterned lines and subtractively patterned planar slab interconnect vias, in accordance with some embodiments. FIG. 15A-15N illustrate isometric views of an exemplary IC interconnect structure evolving during the practice of the methods 1401, and are further referenced in the description of methods 1401. Methods 1401 (FIG. 14) may be practiced as an alternative to methods 201 (FIG. 2) or methods 1201 (FIG. 12), for example. Methods 1401 may also be practiced in combination with methods 201 or methods 1201. For example, planar slab via fabrication of upper-level vias may be integrated into subtractive line patterning that is practiced to form interconnect lines over a lower-level damascene via.

Methods 1401 begin at block 205 where a workpiece having a lower level structure is received. The workpiece and lower level structure may be substantially as described above in the context of methods 401, 801, 1001, or 1201, for example. Substantially the same techniques described above may be practiced in methods 1401 for any blocks identified with a same reference number. For example, methods 1401 continue with the deposition of one or more interconnect material layers(s) and a first cap material at block 410. In the context of methods 1401, at least a partial thickness of interconnect material layer(s) deposited at block 410 is to become a slab via. The thickness that is to become a via may be a topmost layer of a multi-layered interconnect line material layer stack, may be a topmost portion of a single layer of interconnect line material, or may be the entire thickness of the interconnect material layer(s) deposited at block 410. For single layered embodiments, the distinction between via material and line material is one of structural topology rather than composition as there may not then be any material interface between the two structures.

Cap material deposited at block 410 may be any of those materials described above for block 410. For example, a dielectric material, a semiconductor material, or a metal may be deposited over (upon) the interconnect line material layer(s). As described further below, the cap material deposited at block 410 is leveraged in the patterning of interconnect features and end spaces to form both interconnect lines and slab vias, or just slab vias. In the example further illustrated in FIG. 15A, interconnect structure 1501 includes cap material 330 over interconnect material 325.

Interconnect material 325 is substantially planar, and in this example, is in contact with an underlying etch stop layer 1520. Etch stop layer 1520 may be any dielectric material, semiconductor material, or conductive material (e.g., graphene). For some embodiments where etch stop layer 1520 comprises a dielectric, the dielectric may have a higher relative permittivity than that of underlying dielectric material 320. In some examples, etch stop layer 1520 is a silicon-based dielectric, for example comprising predominantly Si and at least one of O (e.g., SiOx) or N (e.g., SiNx, SiON), any of which may also be carbon-doped (e.g., carbon-doped nitride). In further embodiments, etch stop layer 1520 further includes a metal, such as one or more of aluminum, hafnium, or zirconium. In some specific examples, etch stop layer 1720 is aluminum oxide or hafnium oxide. Such an etch stop layer may be similarly included in any of the interconnect structures described above (e.g., 301, 501, 701, 901, 1101, 1301). In some other examples, etch stop layer 1520 is a metal nitride (e.g., TaN), carbide or silicide. In still other examples, etch stop layer 1520 is graphene. Etch stop layer 1520 may be included as a more robust material than underlying dielectric material 320, for example where dielectric material 320 is a low-k dielectric. Etch stop layer 1520 may also provide selectivity to the etch process that will be employed to pattern interconnect line material 325. As further described below, etch stop layer 1520 may also be function as an interconnect barrier material, for example where interconnect line material 325 is of a composition that may suffer from diffusion or migration in the absence of such a barrier material. Although not depicted, lower-level interconnect vias may be embedded with in dielectric material 320, for example as described above.

Returning to FIG. 14, methods 1401 continue at block 415, where features (e.g., 2D grating lines) are patterned into the first cap material(s). Any suitable masking and etch process, such as any of those described above, may be practiced at block 415. In the exemplary structure illustrated in FIG. 11C, a 2D grating of lines of cap material 330 have a pitch P1 over interconnect line material 325. Similar to the methods described above, methods 1401 (FIG. 14) proceed with a feature pitch reduction sequence including blocks 420, 430 and 435 where spacers are formed adjacent to the patterned cap features, and a second cap material is deposited into regions between the spacers. As described above, after removal of the sacrificial spacers, two sets of cap material features having a reduced feature pitch remain over the interconnect line material layer(s). In the exemplary embodiments illustrated in FIGS. 15C and 15D, cap material 530 is in contact with interconnect line material 325 between spacers 535. Cap material 530 may then be polished or otherwise recessed back to expose cap material 330 and spacers 535. Spacers 535 may then be removed to leave lines of cap material 330 interleaved with lines of cap material 530. The lines of cap material are each one subset of a 2D grating of reduced feature pitch.

Methods 1401 (FIG. 14) continue at blocks 440 and 445 where a multi-patterning process is practiced to separately segment the two subsets of cap material features, for example substantially described above in the context of methods 401 (FIG. 4). In the example further illustrated in FIG. 15E, a first patterning process defines feature end spaces 540 that segment colinear features 542. In the example further illustrated in FIG. 15F, a second patterning process defines end spaces 545 that segment colinear features 547.

As described above, every end space 540 is laterally offset in the y-dimension from a substrate structure by some line edge placement error (e.g., $\delta Y1$). Although the magnitude of $\delta Y1$ will vary in practice, because the end spaces 540 are not self-aligned to substrate reference structures, $\delta Y1$ has some distribution around a non-zero value. In addition to the spacing between adjacent features of cap material 330, the selectivity of the etch employed to form end spaces 540 ensures that any cap material 530 exposed to the segmentation etch of cap material 330 is not also patterned. End spaces 540 will therefore have an edge placement error in the x-dimension no greater than $\delta X1$, which was determined at block 415 (FIG. 14). End spaces 545 are laterally offset in the y-dimension from reference substrate structures by another distance Y with some other edge placement error (e.g., $\delta Y2$). Although the magnitude of $\delta Y2$ will vary in practice, because the end spaces 545 are not self-aligned to other features of the IC structure, $\delta Y2$ has some distribution around a non-zero value. Hence, end spaces 540 and 545 have different lateral misregistration in the y-dimension relative to an underlying substrate structure as a result of variation in the two separate segmentation etches of the cap features. While not being the same, the misregistration in each is advantageously smaller than what is possible if a single patterning process is employed to concurrently form end spaces 540 and 545 (FIG. 15E-15F).

Returning to FIG. 14, methods 1401 continue at block 235 where interconnect features are subtractively patterned at block 235. Block 235 may entail any of the patterning processes described above (e.g., in context of FIG. 2A). For example, for embodiments where interconnect line material is a metal, a metal RIE or IBE is practiced to translate a summation of the patterns in cap material 330 and 530 into the metal. In exemplary embodiments, the entire thickness of the interconnect line material layer(s) is etched through at block 235 to expose an underlayer. In the example further illustrated in FIG. 15, the etch of interconnect material 325 forms two sets of interdigitated rows of colinear interconnect features 550A and 550B. Etch stop layer 1520 is exposed, but not completely etched through. For such embodiments, etch stop layer 1520 is advantageously a dielectric material that will not short together interconnect features 550A and/or 550B. Such a dielectric material may further function as a line barrier material, but need not. If etch stop layer 1520 is conductive, it may also be subtractively patterned, for example during an overetch.

With rows of colinear interconnect features fabricated, methods 1401 (FIG. 14) continue at block 240. A dielectric material is deposited over the interconnect features and the dielectric material planarized to expose again the cap materials. Any of the dielectric materials described above in the context of block 240 may be deposited. For the example further illustrated in FIG. 15H, dielectric material 1550 may have a composition that is suitable for being retained in interconnect structure 1501 as an ILD, or suitable for being subsequently removed as a sacrificial material. In some specific examples, a silicon-based oxide (e.g., $SiO_x$) is deposited. In other embodiments, a carbon-based material (e.g., DLC) is deposited.

Returning to FIG. 14, methods 1401 continue with the further definition of the cap materials into a via pattern. In exemplary embodiments, vias are defined through another multi-patterning process that includes a patterning of one of the cap materials at block 1450, and a patterning of the other of the cap materials at block 1460. Aside from the polygons defined at blocks 1450 and 1460, the subtractive patterning processes practiced may be substantially the same as those performed at blocks 440 and 445 to define the initial feature end spaces. The patterning at blocks 1450 and 1460 further reduces the longitudinal lengths of the colinear cap material features.

Figure 15I:
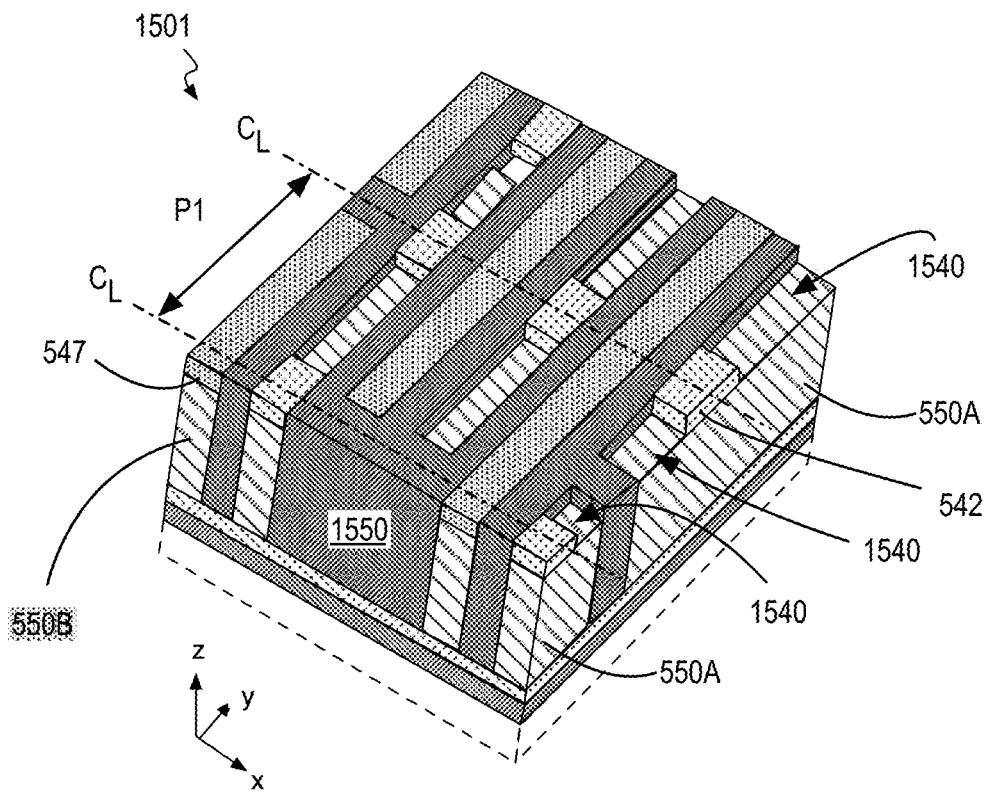
Figure 15J:
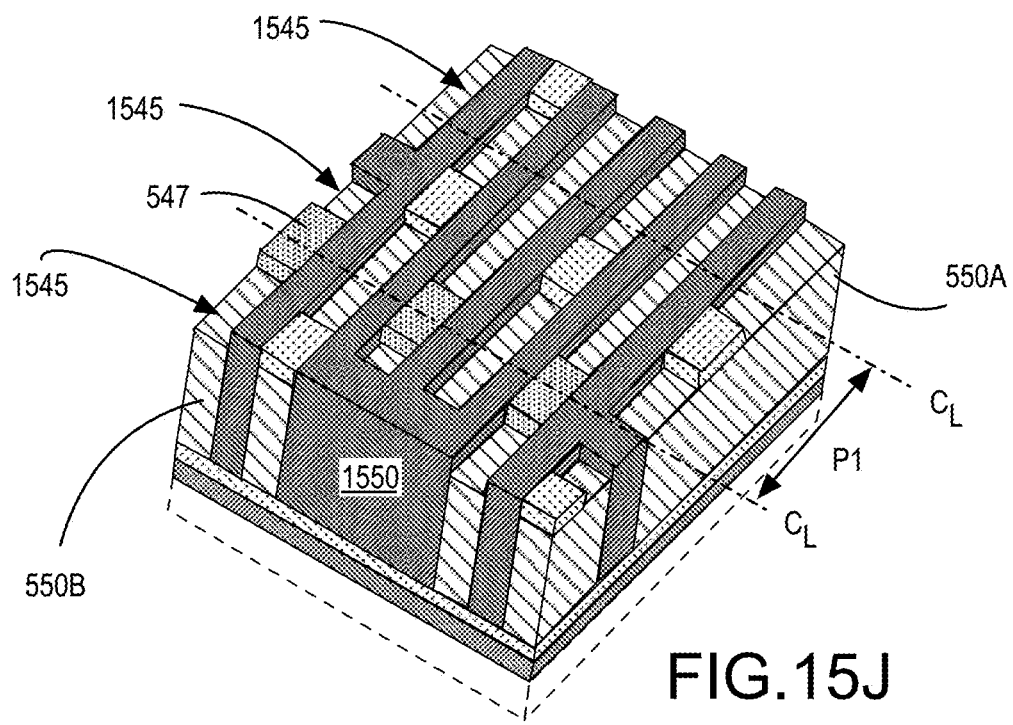
Figure 15K:
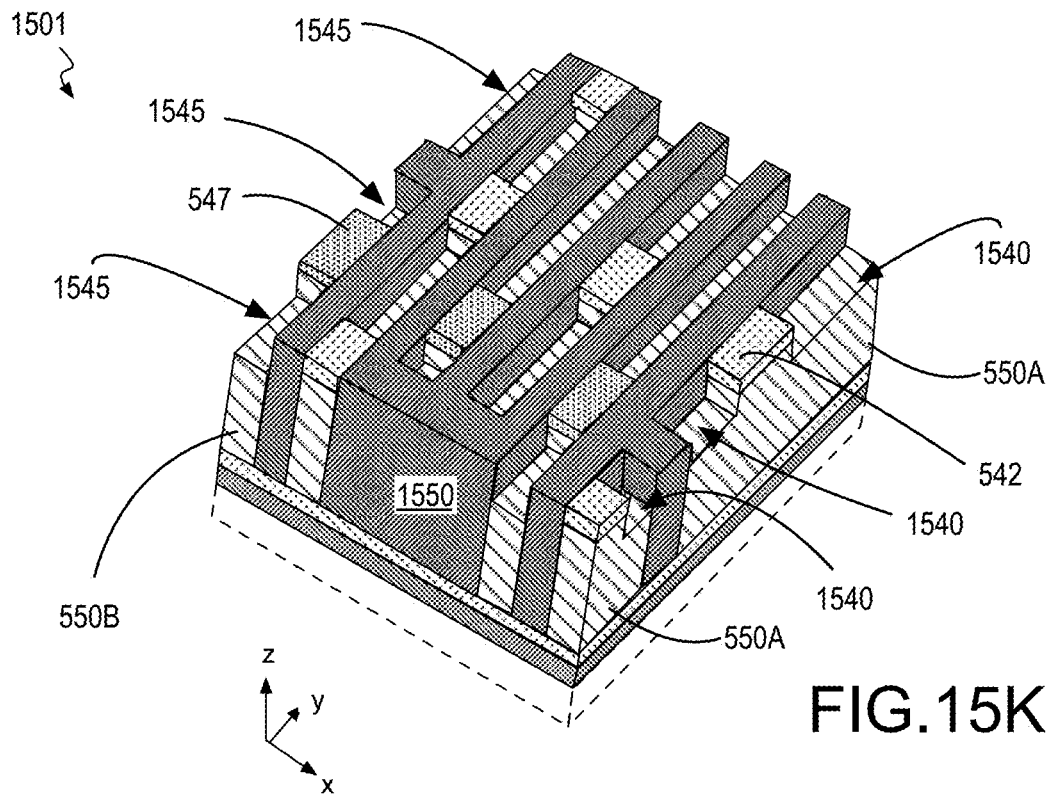

In the example illustrated in FIG. 15I, openings 1540 have been formed by etching portions of colinear cap material features 542, which exposes underlying interconnect line material 325. As shown, the centerlines ($C_L$) of cap material features 542 remaining after their subtractive patterning are on a grid having a fixed pitch P1 in the y-dimension and the pitch P2 in the x-dimension. Such regular grid spacing of the cap material features 542 is indicative of a second grating mask having been used at block 1450. This second grating mask may be oriented substantially orthogonally to the grating mask initially used to form the cap material grating lines. As shown in FIG. 15J, openings 1545 are similarly patterned at block 1460, for example with another selective etch process, to retain colinear cap material features 547 only along centerlines ($C_L$) again having pitch P1. The centerlines of cap material features 547 may be shifted from the centerlines of cap material features 542, for example by an amount such as one-half of P1 as illustrated. However, the centerlines of cap material features 542 and 547 may also be substantially aligned with centerlines of the features deviating only by misregistration associated with the patterning operations at block 1450 and 1460.

Methods 1401 (FIG. 14) continue at block 1470 where the interconnect material is etched. In some embodiments, the interconnect material is only partially etched to reduce the thickness of the interconnect material portions not protected by the cap materials. In some embodiments, the same etch process employed at block 235 is practiced at block 1470, albeit for a shorter duration. For implementations where the interconnect line material is multi-layered, for example including a top via layer material, the etch process employed at block 235 may pattern only the top via layer material, terminating on an underlying etch stop layer (e.g., another metal of different composition). Hence, a slab via may have the same composition as an underlying interconnect line, or may be of a different composition, and an etch stop layer may be intervening between the slab via material and the interconnect line material layers. Block 1470 may therefore define slab vias by removing interconnect line material wherever there is not to be a via. In the example further illustrated in FIG. 15K, openings 1540 and 1545 recess colinear interconnect features 550A and 550B to a z-height below that of portions protected by cap materials 542, 547. For alternative embodiments where interconnect material 325 is multi-layered and includes a top via layer material having a distinct composition, openings 1540 and 1545 recess the top via layer material to define colinear interconnect features 550A and 550B of any z-height.

It should be noted here the via patterns may be more restrictive than is illustrated herein, as a function of the restrictions on interconnect line pitch. For example, metal lines in an interconnect stack of an IC may be unidirectional within each layer, alternating in the x and y directions from one interconnect line level to the next. As such, unidirectional interconnect lines of a potentially fixed grating pitch that are to align with an underlying pattern of vias to form interconnects may necessitate via design rules that enforce a more rigid grid pattern than what is illustrated in the figures.

With slab vias now part of the interconnect structure, methods 1401 continue at block 1475 where one or more additional dielectric materials may be deposited to encapsulate the interconnect lines. A polish or other etch back process is then practiced to expose again the cap materials, which may then be removed through further planarization to expose the slab vias. At block 1475, any dielectric material suitable as an ILD and/or interconnect line barrier material may be deposited by any technique. Methods 1401 are then completed at output 290 where any upper-level interconnect structures may be fabricated to complete the IC according to any techniques.

Figure 15L:
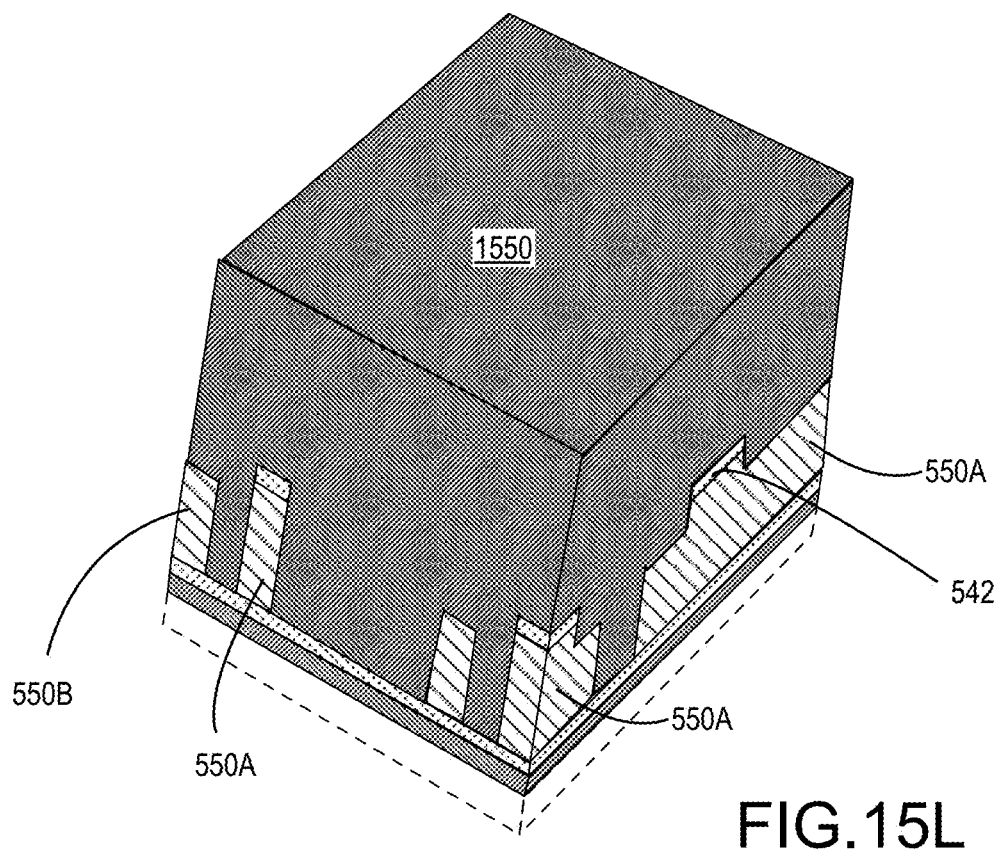
Figure 15M:
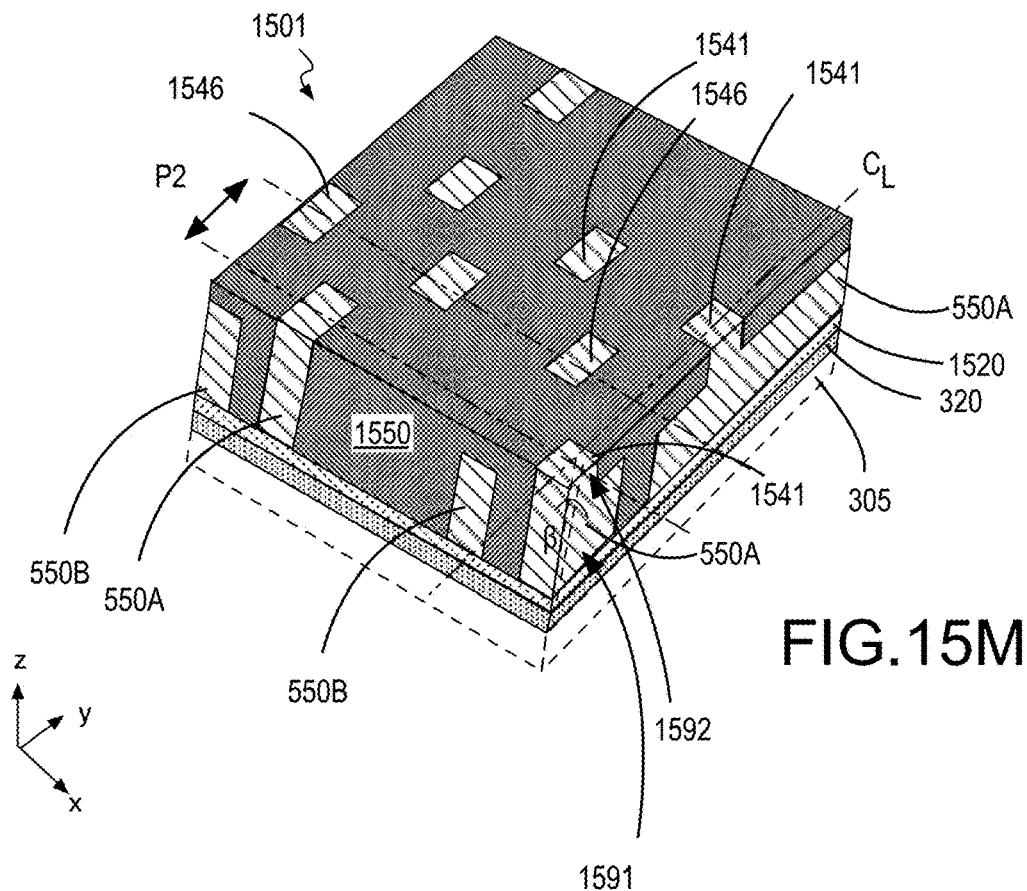
Figure 15N:
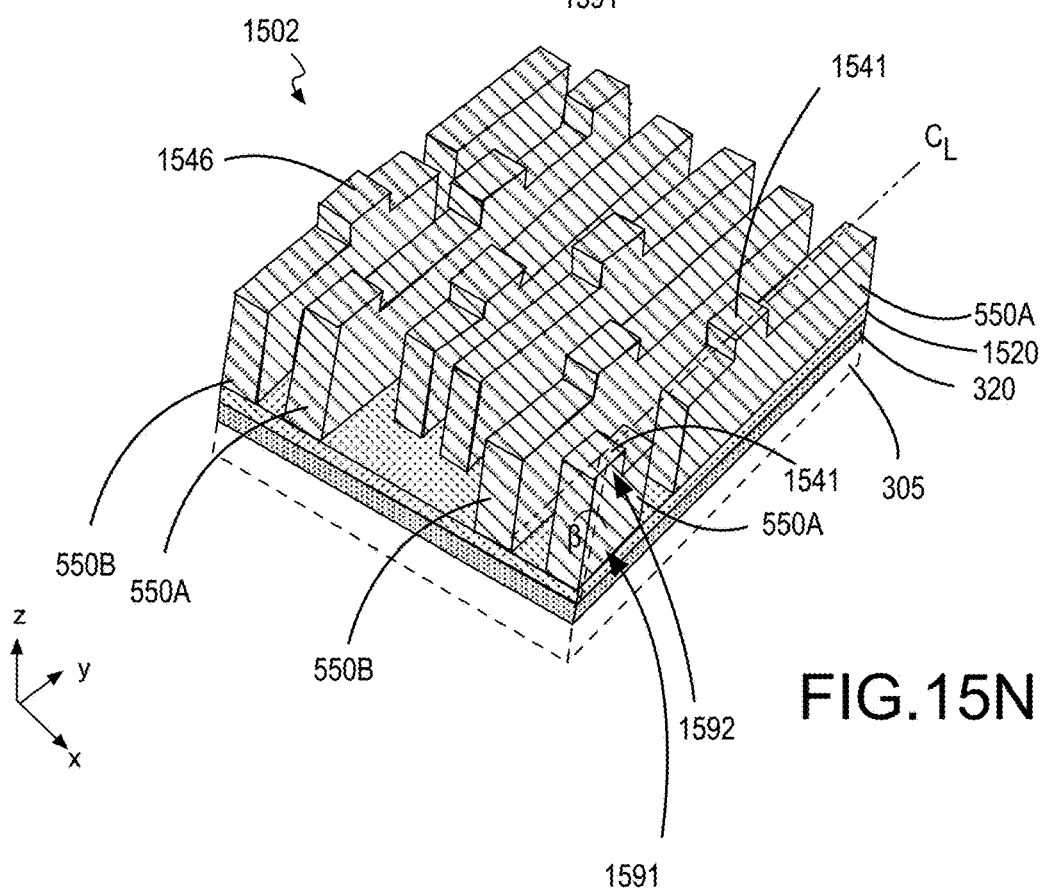

In the example illustrated in FIG. 15L, dielectric material 1550 is over interconnect structure 1501, supplementing the same dielectric material that was previously deposited between interconnect features 550A, 550B. Following a planarization (e.g., CMP), interconnect structure 1501 slab vias 1541 and 1546 are exposed within dielectric material 1550 while interconnect features 550A, 550B are embedded below the surface of dielectric material 1550, as shown in FIG. 15M. If desired, material 1550 may be removed as a sacrificial material, for example as shown in FIG. 15N for an alternative interconnect structure 1502. Except for the absence of dielectric material 1550, interconnect structure 1502 is substantially identical to interconnect structure 1501.

Because slab vias 1541 (and 1546) are defined from an upper portion of interconnect features 550A (or 550B), slab vias 1541 (1546) are perfectly aligned to interconnect features 550A (550B). As shown in FIGS. 15M and 15N, slab vias 1541 and the underlying interconnect features 550A therefore share the same longitudinal centerline CL, with there being no alignment error in the x-dimension between the two features. Such perfect positional alignment between line and via portions of an interconnect structure is one indication of the practice of methods 1401. As further illustrated in FIGS. 15M and 15N, because slab vias 1541 (and 1546) are defined from an upper portion of interconnect features 550A (or 550B), slab vias 1541 (1546) have sidewall slope ß associated with the patterning of interconnect features 550A (550B). Hence, the sidewall slope of vias 1541 (1546) are continuous with the sidewall slope the underlying interconnect features 550A (550B), which in these embodiments are line portions of the interconnect structure integral with the slab vias.

As further shown in FIGS. 15M and 15N, slab vias 1541 and 1546 have rectangular cross-sections along a plane parallel with the x-y plane of substrate 305. The term "slab via" is to descriptively distinguish their planarity and the rectangularity of their cross-section from a damascene via that has non-planar fill material and a cross-section that is not substantially rectangular, but instead then be more like a vertically oriented wire. In the x-dimension, slab vias 1541 are perfectly aligned to colinear features 550A (i.e., share the same centerline), and slab vias 1546 are perfectly aligned to colinear features 550B such that a line sidewall 1591 extending in the longitudinal length direction is parallel to, and continuous with, a via sidewall 1592. As illustrated, there is no discernable lateral (e.g., along x-axis) offset between sidewall 1591 and sidewall 1592 at their interface because sidewall 1591 and sidewall 1592 are both defined by a single etch process (e.g., at block 235 in FIG. 14). The self-aligned nature of via sidewall 1592 results in slab vias 1541 having substantially the same misregistration in the x-dimension (e.g., δX1) as colinear features 550A (and colinear features 550B). Rectangularity of slab vias 1541 is further the result of a substantially orthogonal intersection of a mask edge with sidewall 1591 during via patterning (e.g., at block 1450). Rectangularity of slab vias 1546 is likewise the result of a substantially orthogonal intersection of a mask edge with sidewall 1591 during via patterning (e.g., at block 1460).

In view of the slab via embodiments described above, it is further noted that for embodiments where at least one of the cap materials is a suitable conductor, a partial length of the cap material itself may be retained as a slab via. For example, in the context of methods 1401, the patterning performed at one or both of blocks 1450 and 1460 may be the slab via etch if the corresponding cap material has suitable conductivity (e.g., as a metal, metallic compound, graphene, etc.). For some advantageous embodiments where both the cap materials are metals, block 1470 may be omitted. For such embodiments, FIG. 15J illustrates a multicolored slab via where cap material 542 is a first slab via comprising a first metal, and cap material 547 is a second slab via comprising a second metal. More specifically, vias of alternating first rows of colinear interconnect lines (e.g., 550A) all have a first composition (e.g., W), while vias of alternating second rows of colinear interconnect lines (e.g., 550B) all have a second, different, composition (e.g., Cu). The formation of slab vias through interconnect line etching illustrated in FIGS. 15K and 15L is therefore more generally applicable for a wider variety of cap material compositions that don't further demand good electrical conductivity. For those embodiments where the cap materials are sacrificial, all the slab vias may have substantially the same composition Notably, regardless of whether the cap materials are retained as slab vias or whether they are removed to expose the slab vias, the population of slab vias will have a bimodal distribution of lateral misregistration in the y-dimension that is akin to that of the spaces between colinear lines. The bimodality will again appear as correlated with alternating rows of colinear interconnect lines. A first subset of rows of the colinear interconnect lines will have slab vias (e.g., 1541 in FIG. 15M, 15N) with an x dimension placement error that is a summation of line edge placement error associated with patterning the cap material (e.g., at block 440 in FIG. 14), and the line edge placement error associated with patterning the slab via from a further patterning of the cap material (e.g., at block 1450 in FIG. 14). A second subset of rows of the colinear interconnect lines will have slab vias (e.g., 1546 in FIG. 15M, 15N) with an x dimension placement error that is a summation of line edge placement error associated with patterning another cap material (e.g., at block 445 in FIG. 14) and the line edge placement error associated with patterning the slab via from a further patterning of that cap material (e.g., at block 1460 of methods 1401). Since these patterning operations are split between the two rows of interconnect lines (e.g., features 550A and 550B in FIG. 15M, 15N), the cumulative misregistration of the slab vias (e.g., 1541 and 1546) relative to a lower-level feature of the IC structure can be expected to display a bimodal distribution when each subset of the rows of interconnect lines (e.g., features 550A and 550B) is grouped together.

In further reference to FIG. 15M, every slab via 1541 and 1546 is laterally offset in the x-dimension from a feature of the IC structure by some edge placement error (e.g., δX1), which was determined for all vias 1541 and 1546 by the grating line etch at block 415 (FIG. 14). Slab vias 1541 are laterally offset in the y-dimension from the IC structure by another distance Y+/− a cumulative line edge placement error (e.g., δY2+δY3) associated with the end space etches and via opening etches at blocks 440 and 1450. Although the magnitude of the cumulative line edge placement error will vary in practice, because these patterning operations are not self-aligned to substrate reference structures, the cumulative line edge placement error will have some distribution around a non-zero value. Slab vias 1546 will have a similar, but different cumulative lateral misregistration in the y-dimension relative to an underlying substrate structure as a result of variation in the segmentation and slab via etches of the cap features.

Figure 15O:
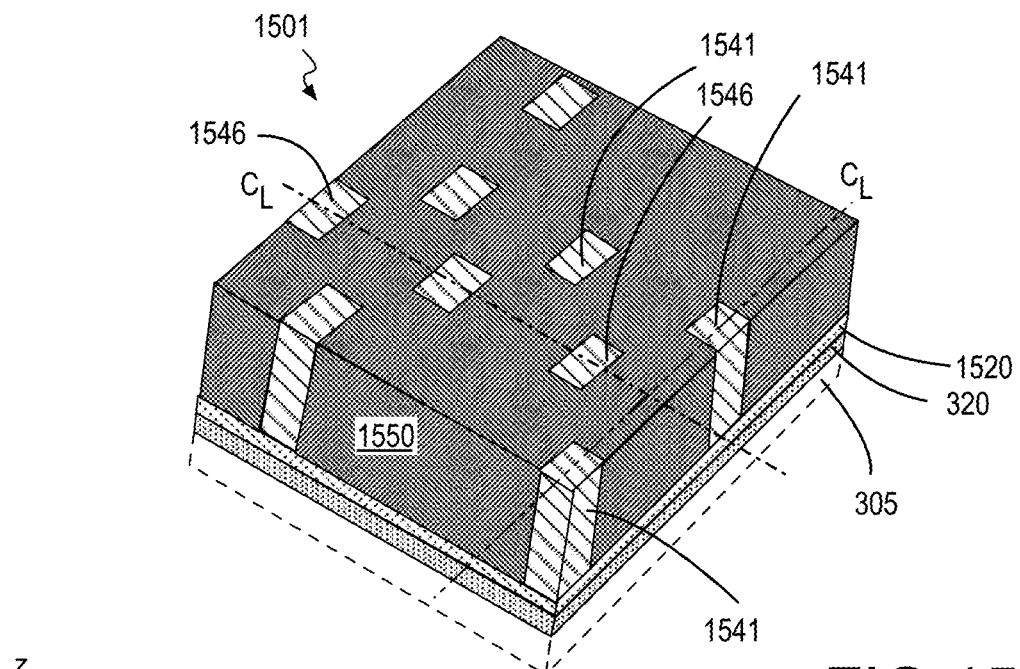
FIGS. 15O and 15P illustrate isometric views of an exemplary IC interconnect structure evolving during the practice of the methods illustrated in FIG. 14, in accordance with some alternative embodiments.
Figure 15P:
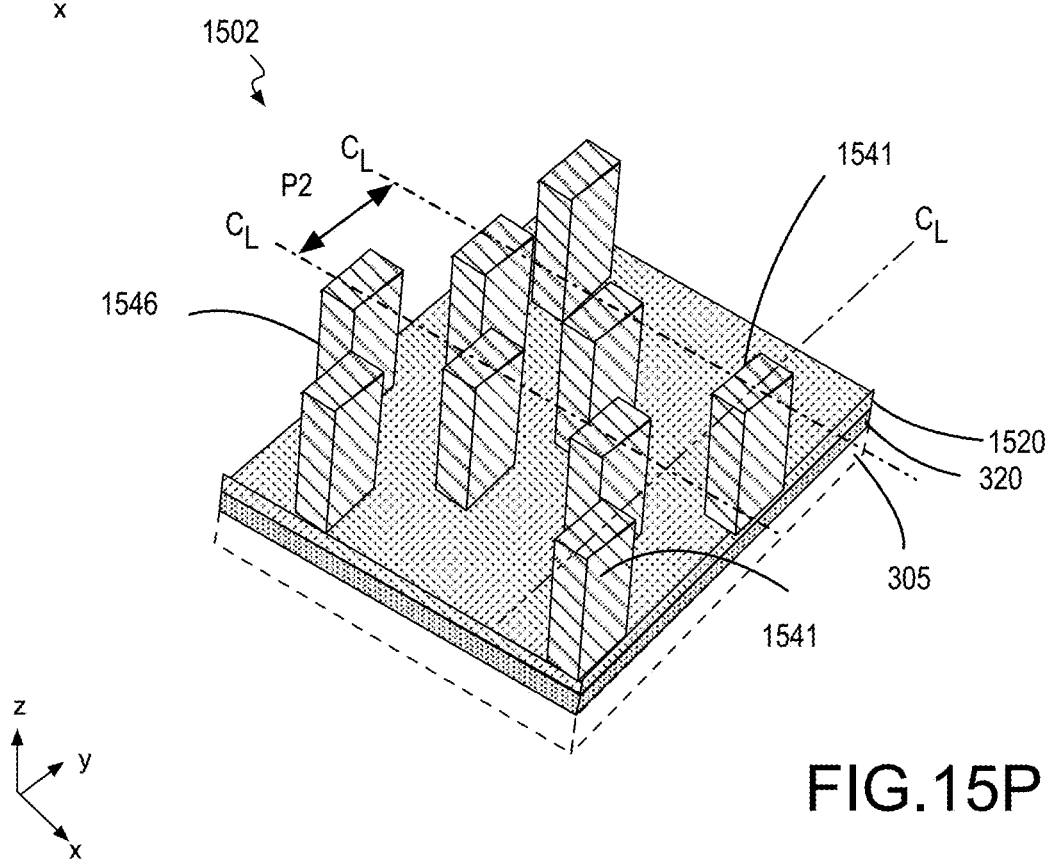

As noted above, a slab via etch need not only pattern a partial thickness of an interconnect feature, but may instead pattern the entire thickness of the interconnect feature. FIGS. 15O and 15P illustrate an example of interconnect structure 1501 where the etch process performed at block 1470 (FIG. 14) completely clears the entire thickness of the interconnect material. As shown, slab vias 1541 and 1546 have the full thickness of the interconnect material and no other portion of interconnect features 550A and 550B is retained. Methods 1401 therefore enlist multiple grating masks and subtractive interconnect patterning operations to fabricate interconnect vias. Relative to interconnect via embodiments described above (e.g., FIG. 5J-5L), the additional patterning operations of methods 1401 may offer one or more advantages, such as reduced via pitch and/or CDs, reduced via misregistration, wider process margin, or less restrictive materials selection.

As also noted above, IC interconnect structures including subtractively patterned features may be electrically isolated with air gaps. The relative permittivity of air or other similar gas is significantly lower than most dielectric materials. As described further below, the various IC interconnect structures described above may be integrated with air gap technology as a means of reducing interconnect capacitance. In contrast to a damascene metallization process, no dielectric material need be subtractively patterned to first form air gaps between interconnect features (lines and/or vias). Air gaps may instead be formed through purely additive processing, for example with the deposition of a non-conformal dielectric material that occludes the gaps or voids generated by subtractively patterning the interconnect lines and/or vias. Through the avoidance of a dielectric etchback, relative to damascene interconnect structures, air gap technology may advantageously induce less damage to subtractively patterned interconnect structures.

Figure 16:
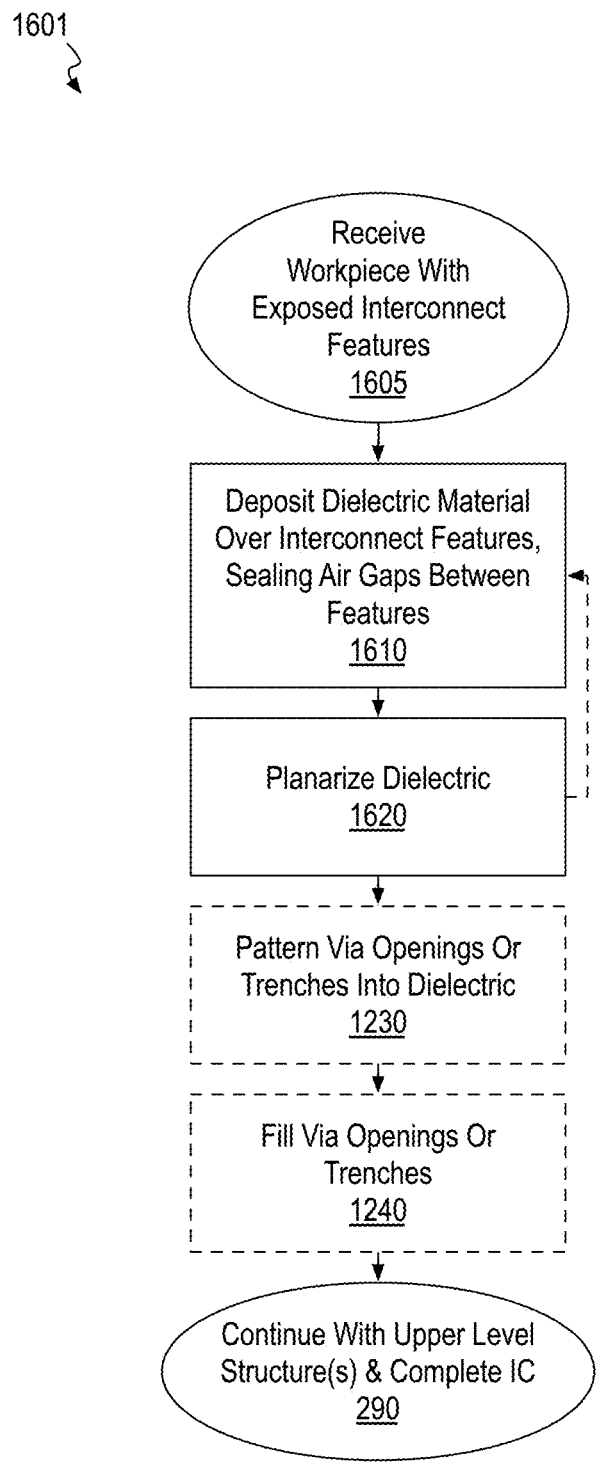
FIG. 16 is a flow diagram illustrated methods for fabricating an IC interconnect structure including subtractively patterned features isolated by air gaps, in accordance with some embodiments.

FIG. 16 is a flow diagram illustrating methods 1601 for fabricating an IC interconnect structure including subtractively patterned interconnect features and air gap isolation, in accordance with some embodiments. Methods 1601 may be incorporated into any of methods 201, 401, 601, 801, 1001, 1201, or 1401, for example. Alternatively, methods 1601 may be incorporated into an alternative method of subtractively patterning interconnect features. As one example, FIG. 17A-17F illustrate cross-sectional views of IC interconnect structure 301 evolving during the practice of the methods 1601. As another example, FIGS. 18A-18F and 18H illustrate isometric views of interconnect structure 501 during the practice of the methods 1601. As another example, FIG. 19A-19C illustrate isometric views of interconnect structure 901 during the practice of the methods 1601.

Figure 17A:
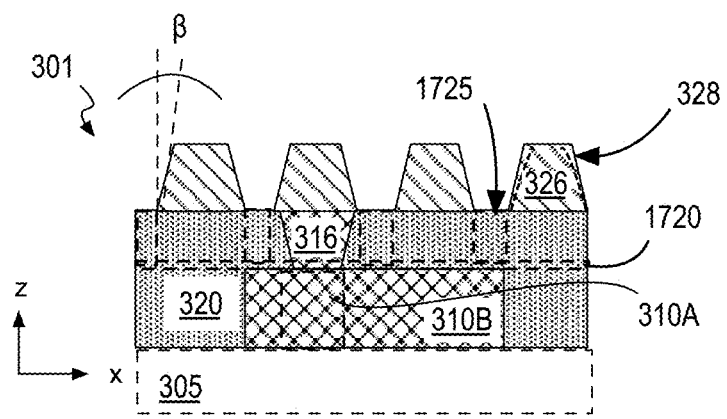
FIGS. 17A, 17B, 17C, 17D and 17E illustrate cross-sectional views of an exemplary IC interconnect structure evolving during the practice of the methods illustrated in FIG. 16, in accordance with some single damascene embodiments.

Methods 1601 begin at input 1605 where a workpiece having an interconnect structure that includes interconnect features with exposed sidewalls is received. The exposed interconnect features may be lines or vias having any of the attributes described above for subtractively patterned interconnect features. For example, as illustrated in FIG. 17A, interconnect structure 301 may be received as an input. In the example of FIG. 17A, a top of interconnect features 326 is exposed. As shown in FIG. 17A, interconnect features 326 have positively sloped sidewalls and/or chamfered top corners 328, substantially as described above. With sidewalls of interconnect features 326 fully exposed following subtractive patterning, no dielectric etch process is needed to open up gaps between adjacent interconnect features 326. However, in some embodiments, as illustrated in dashed line in FIG. 17A, a dielectric etch 1725 may be performed to recess underlying dielectric material 320 from below adjacent interconnect features 326. Dielectric etch 1725 may, for example, be an anisotropic (e.g., fluorocarbon RIE) or isotropic (e.g., 50:1 HF) etch that is self-aligned to interconnect features 326. Dielectric etch 1725 may stop on an etch stop layer 1720 extending over interconnect via 310A or line 310B and/or at a bottom of interconnect feature 316. Etch stop layer 1720 may be any dielectric material suitable as a via etch stop, for example, and/or as a barrier material of interconnect via 310A or line 310B. In some embodiments, etch stop layer 1720 comprises at least one of oxygen, nitrogen, or carbon (e.g., carbon-doped nitride). In further embodiments, etch stop layer 1720 further includes a metal, such as one or more of aluminum, hafnium, or zirconium. In some specific examples, etch stop layer 1720 is aluminum oxide, hafnium oxide. In other embodiments, Dielectric etch 1725 may reduce the effect of fringing capacitance between interconnect features 326 through dielectric material 320.

Figure 18A:
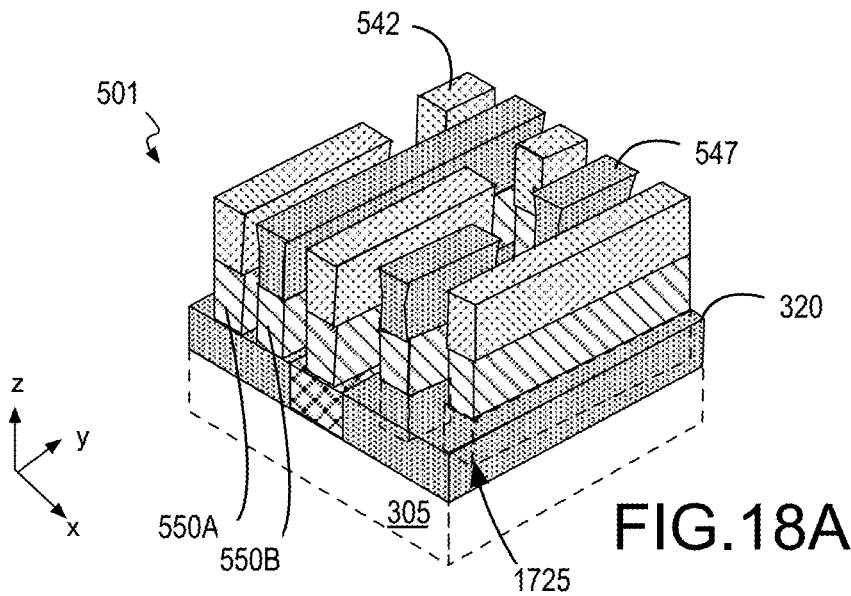
FIGS. 18A, 18B, 18C, 18D, 18E and 18F illustrate isometric sectional views of an exemplary IC interconnect structure evolving during the practice of the methods illustrated in FIG. 16, in accordance with some alternative single-damascene embodiments.

In other embodiments, for example as further illustrated in FIG. 18A for interconnect structure 501, the workpiece received as an input to methods 1601 retains one or more colinear cap material lines 542, 547 over interconnect features 550A, 550B. Although not specifically illustrated, the profile of interconnect features 550A, 550B may have the same attributes (e.g., positive slope) of interconnect features 326. In this example, the thickness of the cap material remaining after subtractive patterning of interconnect features 550A, 550B may be leveraged to increase the vertical (2-dimension) height of an air gap, which can reduce fringing fields through any overlying dielectric material that occludes the air gap. If desired, dielectric etch 1725 may again be performed to recess dielectric material 320 not masked by interconnect features 326. For such embodiments, the larger vertical dimensions of a gap created by the recessed dielectric 320 in combination with the thickness of cap material lines 542, 547 may advantageously further reduce capacitance between interconnect lines 550A, 550B.

Figure 19A:
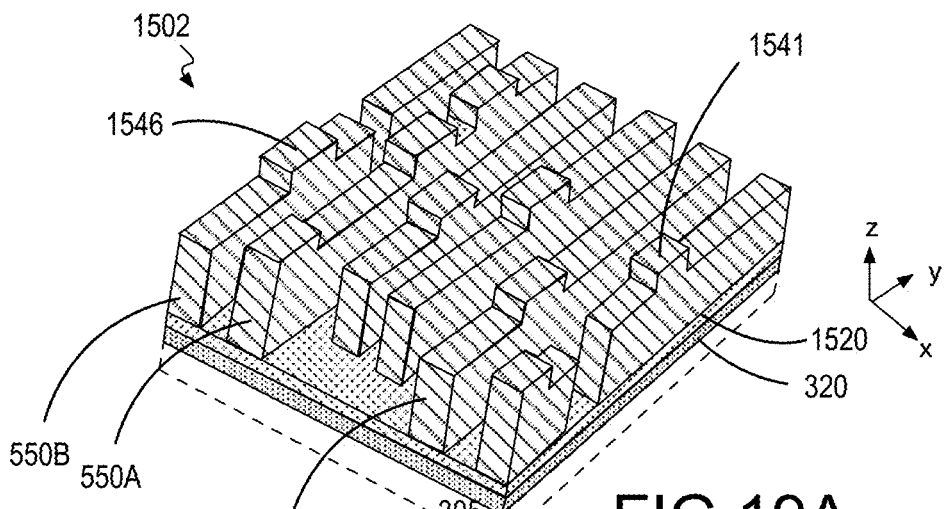
FIGS. 19A, 19B and 19C illustrate isometric sectional views of an exemplary IC interconnect structure evolving during the practice of the methods illustrated in FIG. 16, in accordance with some slab via embodiments.
Figure 19B:
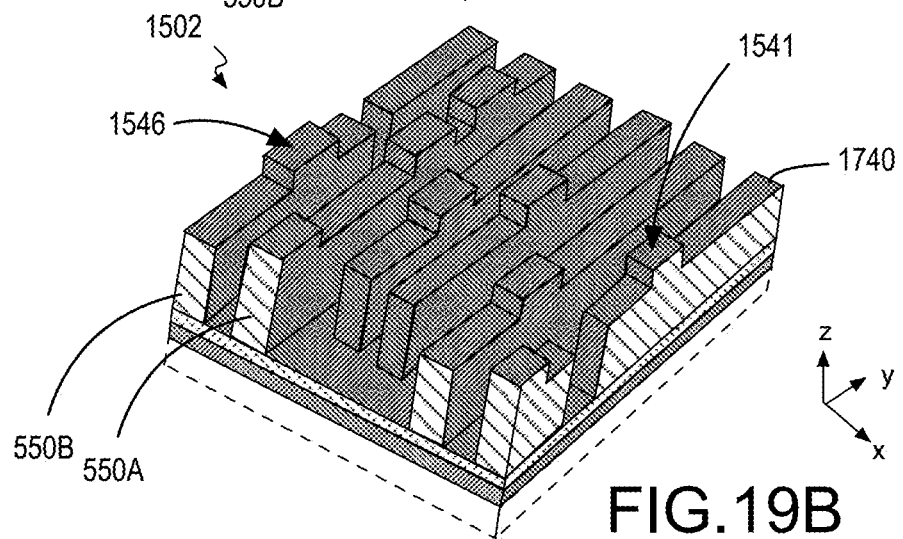
Figure 19C:
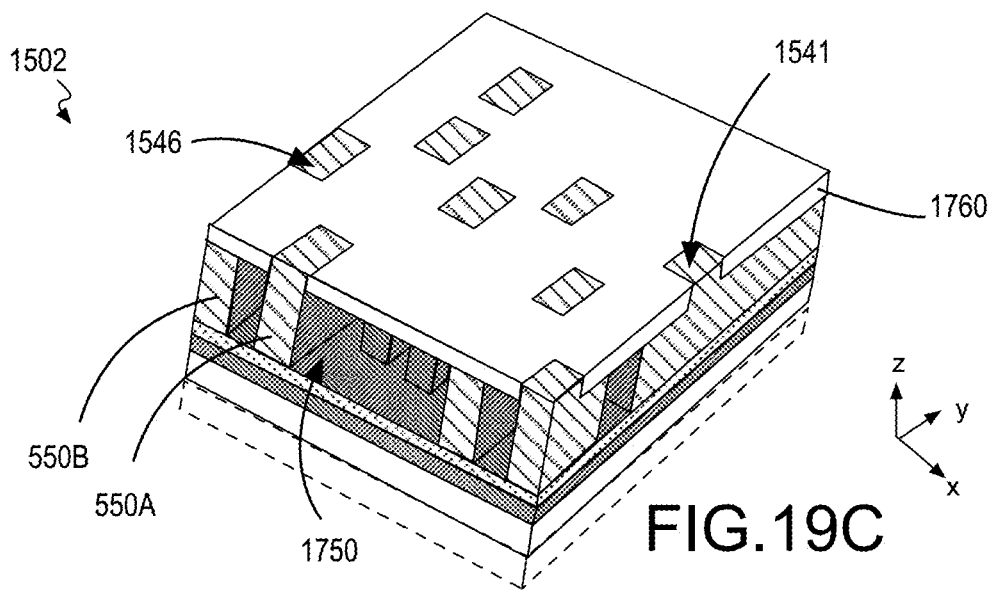

FIG. 19A illustrates other embodiments where a workpiece received at as an input to methods 1601 includes slab vias 1541, 1546 integral with interconnect features 550A, 550B having dimensions suitable as interconnect lines. For such embodiments, between both slab vias 1541, 1546 and interconnect features 550A, 550B, there is a gap which may be retained or partially backfilled to provide air gap isolation between either or both of interconnect lines and vias. Although not depicted in FIG. 19A, as a means of increasing the gap dimensions and further reducing capacitance, a dielectric etch may again be performed to recess regions of etch stop layer dielectric material 1520 and/or dielectric material 320 that are not masked by interconnect features 326.

Methods 1601 (FIG. 16) continue at block 1610 where one or more dielectric materials are deposited over the interconnect features. The dielectric material(s) deposited at block 1610 include at least one non-conformal dielectric layer that seals gaps or voids between the interconnect features. The gaps or voids may include air (e.g., having a relative permittivity of ~1), or some other gas (e.g., N2) that is present in the environment during the deposition at block 1610. Any non-conformal deposition process may be employed at block 1610 to occlude gaps between adjacent interconnect features.

In some embodiments, a conformal dielectric layer is also deposited at block 1610. The conformal dielectric layer is deposited prior to the non-conformal dielectric layer so that it is in direct physical contact with surfaces of the exposed interconnect features, separating those features from the air gap. This conformal dielectric layer may function as an interconnect sealant and/or diffusion barrier material to prevent or mitigate migration and/or oxidation of the interconnect material that might otherwise be induced by a gap occlusion process, or by an exposure to the gas retained within the gap, for example. A conformal dielectric layer may supplement a non-conformal occlusion layer as part of an air gap isolation structure, or not, based at least in part on whether the particular chemical composition of the interconnect features renders them susceptible to migration and/or oxidation.

In some exemplary embodiments, a top surface of the non-conformal dielectric material deposited at block 1610 is planarized at block 1620. Block 1620 may be iterated with block 1610 with multiple deposition processes performed iteratively (i.e., cyclically) in combination with planarization cycles. The cyclical deposition/planarization process may reduce regions of elevated (z-dimension) topography (e.g., over interconnect lines) relative to regions of lower topography (e.g., between interconnect lines) to arrive at a non-conformal dielectric layer that has a substantially planar top surface.

Figure 17B:
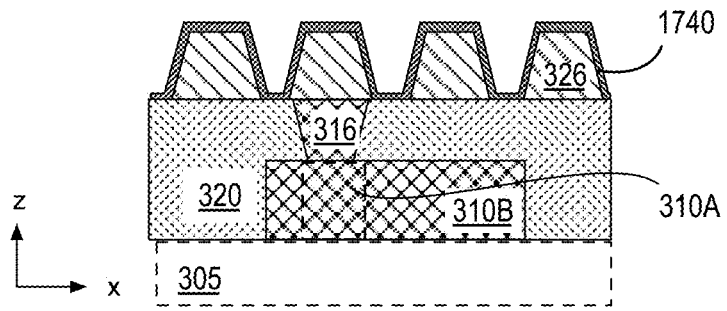
Figure 18B:
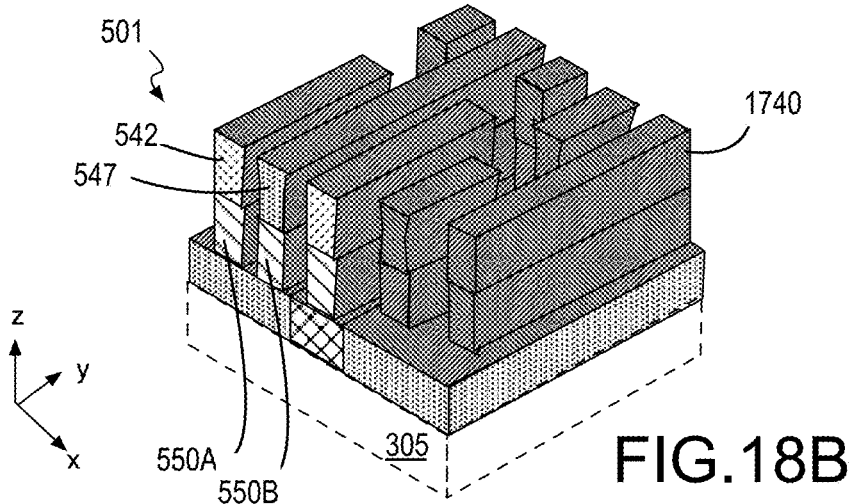

In the example shown in FIG. 17B, interconnect structure 301 includes a conformal dielectric layer 1740 in contact with a top and sidewall of interconnect features 326. Conformal dielectric layer 1740 may include one or more layers that may each include at least one of nitrogen, oxygen, and carbon. For example, conformal dielectric layer 1740 may include silicon nitride, silicon carbide, silicon oxynitride, aluminum oxide, hafnium oxide, zirconium oxide, or other metal oxides amenable to ALD techniques. Conformal dielectric layer 1740 is further illustrated in FIGS. 18B and 19B for interconnect structures 501 and 1502, respectively. As shown in FIG. 18B, in addition to being in physical contact with interconnect features 550A, 550B, conformal dielectric layer 1740 is in physical contact with cap materials 542 and 547. As shown in FIG. 19B, conformal dielectric layer 1740 is contact with both interconnect features 550A, 550B and slab vias 1541, 1546.

Figure 17C:
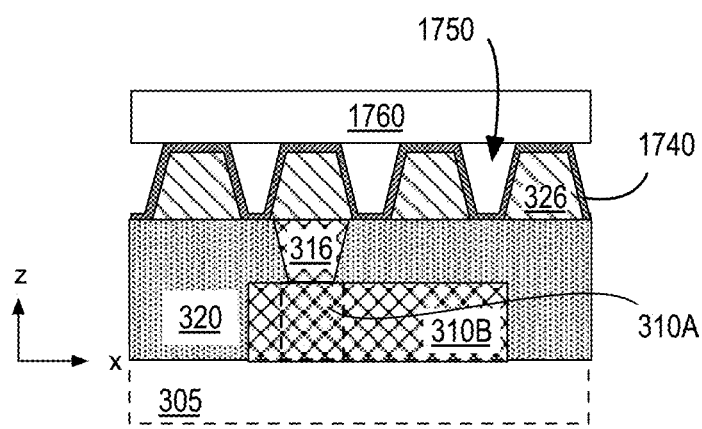

FIG. 17C further illustrates interconnect structure 301 following deposition and planarization of a non-conformal dielectric material 1760, which occludes air gaps 1750. Non-conformal dielectric material 1760 may include any number of layers and may include a low-k dielectric material (e.g., SiOC) or any of SiO, SiON, SiN, hydrogen silsesquioxane, methyl silsesquioxane, polyimide, polynorbornenes, benzocyclobutene, or the like. In the example illustrated, only one material layer is shown. In other examples, the at least two non-conformal dielectric material layers of different chemical composition are deposited. One of these dielectric material layers may further serve as an etch stop layer, for example as further described below.

As shown in FIG. 17C, non-conformal dielectric material 1760 is in physical contact with conformal dielectric material 1740 within high topography regions (e.g., over interconnect features 326). Air gaps 1750 separate non-conformal dielectric material 1760 from conformal dielectric material 1740 within low topography regions (e.g., between interconnect features 326). Air gaps 1750 are therefore completely surrounded by dielectric materials 1740 and 1760. In the example illustrated in FIG. 17C, non-conformal dielectric material 1760 it is exclusively out of (e.g. above) the x-y plane of interconnect features 326. However, in some embodiments a portion of non-conformal dielectric material 1760 is within an x-y plane that also passes through interconnect features 326.

Figure 18C:
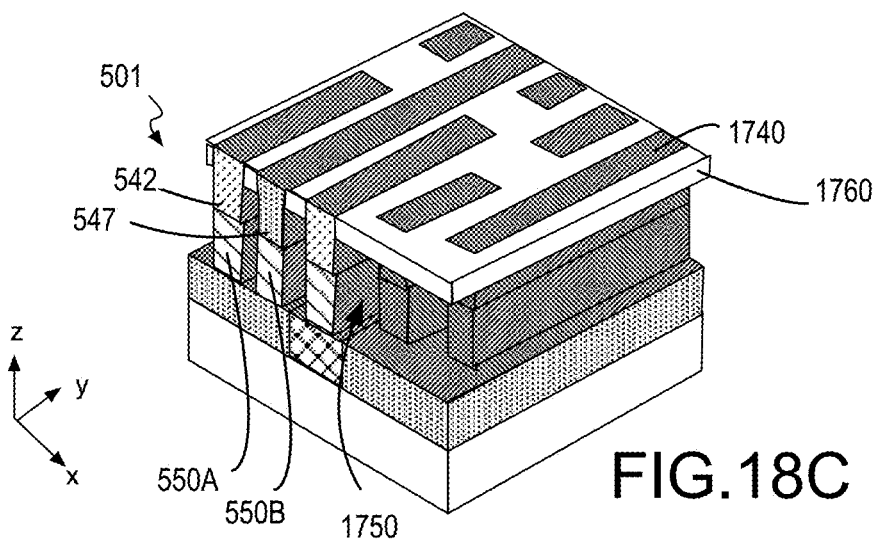

FIG. 18C further illustrates interconnect structure 501 following deposition and planarization of a non-conformal dielectric material 1760. Non-conformal dielectric material 1760 is in physical contact with conformal dielectric material 1740 at only high topography regions. For such embodiments, non-conformal dielectric material 1760 is within the same x-y plane as cap material features 542, 547. For embodiments where non-conformal dielectric material 1760 is sufficiently planarized, cap material features 542, 547 are exposed (i.e. with top surfaces being substantially co-planar with that of non-conformal dielectric material 1760). For such embodiments, at least one layer of non-conformal dielectric material 1760 may further serve as an etch stop layer for a subsequent via etch, as described further below. Depending on the thickness of cap material features 542, 547 non-conformal dielectric material 1760 may be exclusively within the x-y plane of cap material features 542, 547 (as illustrated in FIG. 18C). Alternatively, a portion of non-conformal dielectric material 1760 may also be within an x-y plane that passes through interconnect lines 550A, 550B.

FIG. 19C illustrates interconnect structure 1502 following deposition and planarization of a non-conformal dielectric material 1760, which occludes air gaps 1750. In this example, non-conformal dielectric material 1760 is in physical contact with conformal dielectric material 1740 within an x-y plane that intersects slab vias 1541, 1546. For embodiments where non-conformal dielectric material 1760 is sufficiently planarized, a surface of slab vias 1541, 1546 may be exposed (i.e. a top surface of the slab vias is substantially planar with a top surface of non-conformal dielectric material 1760), as further shown in FIG. 19C. For such embodiments, at least one layer of non-conformal dielectric material 1760 may serve as an etch stop layer for subtractive patterning of an upper-level interconnect line, as described further below. Depending on the thickness of slab vias 1541, 1546, non-conformal dielectric material 1760 may be exclusively within the x-y plane of slab vias 1541, 1546, as illustrated in FIG. 19C. Alternatively, a portion of non-conformal dielectric material 1760 may also be within an x-y plane that passes through interconnect features 550A, 550B. Hence, air gap 1750 is within x-y planes that pass through interconnect features 550A, 550B, but may not extend through all x-y planes that pass through slab vias 1541, 1546.

Returning to FIG. 16, methods 1601 may continue with the formation of interconnect vias or lines through the non-conformal dielectric material deposited at block 1605. For those embodiments where the workpiece includes slab via, methods 1601 may proceed to output 290 where a next level of interconnect lines may be fabricated as part of an upper-level interconnect structure.

Figure 17D:
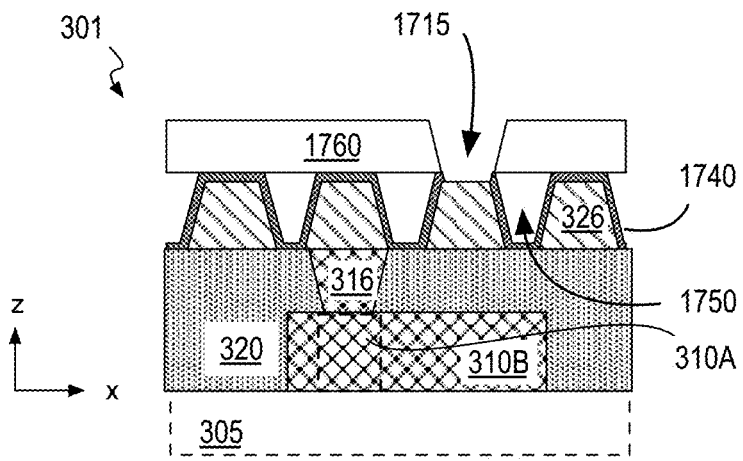
Figure 17E:
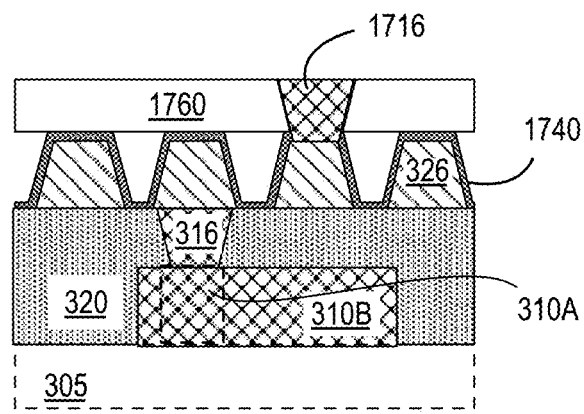
Figure 17F:
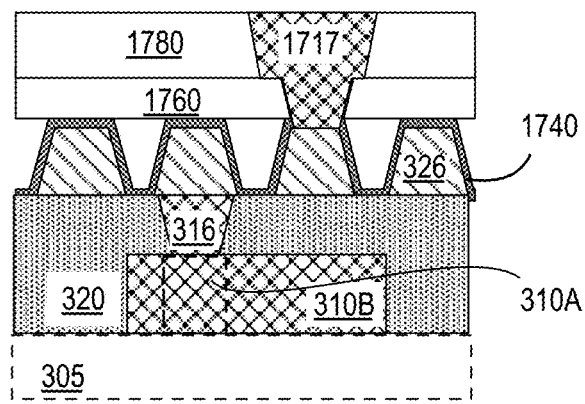
FIG. 17F illustrates a cross-sectional view of an exemplary IC interconnect structure following the practice of the methods illustrated in FIG. 16, in accordance with some alternative dual-damascene embodiments.

In some exemplary embodiments, the formation of interconnect vias or lines through the non-conformal dielectric material comprises a damascene dielectric etch and fill technique where via openings or trenches are patterned into the non-conformal dielectric material at block 1230. The via openings or trenches are then filled with conductive interconnect material at block 1240, for example substantially as described above in the context of methods 1201 (FIG. 12). FIG. 17D illustrates interconnect structure 301 following the patterning of a via opening or trench 1715. Via opening or trench 1715 extends through the thickness of non-conformal dielectric material 1760. Via opening or trench 1715 also extends through the thickness of conformal dielectric material 1740 to expose interconnect features 326. As further illustrated in FIG. 17E, interconnect feature 1716 is substantially complete, with a fill having been planarized with a surface of non-conformal dielectric material 1760. Interconnect feature 1716 may include any of the conductive materials (e.g., metals) described above in the context of interconnect feature 316 (FIG. 3). For example, interconnect feature 1716 may be predominantly Cu, or a Cu alloy. Although a single damascene process is illustrated in FIGS. 17D and 17E, a dual-damascene process may be similarly practiced. For example, as shown in FIG. 17F, an additional dielectric material 1780 may be over non-conformal dielectric material 1760 with trenches into dielectric material 1780 filled concurrently with via openings 1715 to form upper-level dual-damascene line and via feature 1717.

Alignment between interconnect feature 1716 and interconnect features 326 is one challenge in fabricating interconnect structure 301. Misregistration between via opening or trench 1715 (FIG. 17D) may, for example, result in exposing air gap 1750, which will complicate the metal fill.

In some advantageous embodiments therefore, the dielectric material etch is selective to at least a portion of non-conformal dielectric material 1760 so that via openings or trenches, even if significantly misaligned to interconnect features 326, will not break through to air gap 1750. Compositional differences between non-conformal dielectric material 1760 and the cap material that is over the interconnect lines may provide a basis for self-aligning the via openings. For example, at least a last step of a via opening or trench etch may preferentially etch the cap material at a higher rate than the non-conformal dielectric material is removed. The via opening or trench is therefore confined to the transverse width of the cap material to which the underlying subtractively patterned interconnect feature was previously patterned.

Figure 18D:
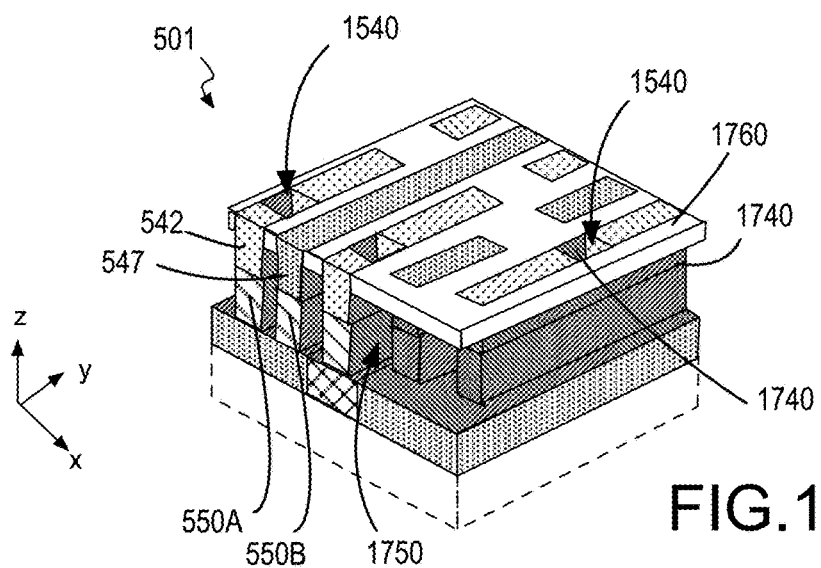

For embodiments where multiple cap materials are present, multiple patterning may be practiced to form via openings or trenches that are self-aligned to individual ones of adjacent interconnect features. Hence, the multiple cap materials described above for double-patterning end spaces of adjacent interconnect features may be further employed for double-patterning via openings or trenches to those adjacent interconnect lines or vias. For example, FIG. 18D illustrates interconnect structure 501 following patterning of a first set of openings 1540. As described above, openings 1540 may be etched selectively to the surrounding material, which in this example is non-conformal dielectric material 1760 and conformal dielectric material 1740. Any lateral misregistration of a mask pattern employed to etch opening 1540 will be corrected by etch selectivity so that opening 1540 is confined to a transverse width no greater than that of cap material features 542. In further embodiments, the via opening etch is also selective to cap material features 542 over conformal dielectric material 1740. Conformal dielectric material 1740 may then be retained as a lateral (e.g., x and y dimensions) barrier between opening 1540 and air gap 1750. Etch selectively between cap material features 542 and cap material features 547 can again ensure opening 1540 exposes interconnect feature 550A without exposing adjacent interconnect feature 550B.

Figure 18E:
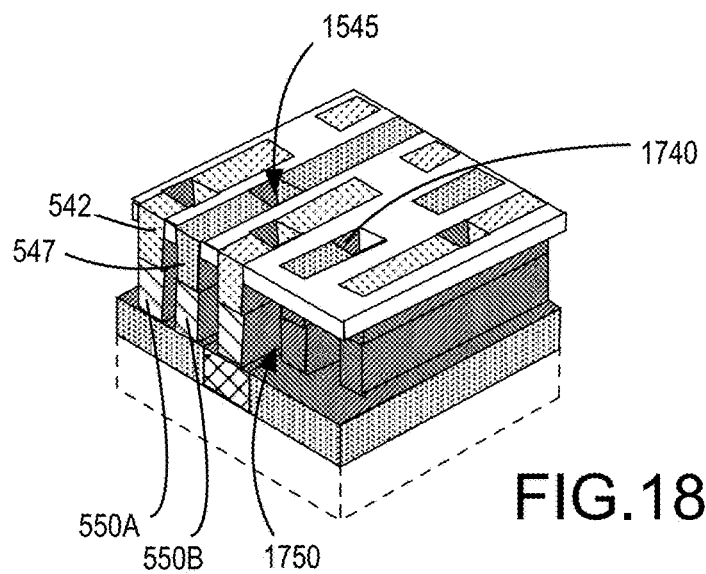
Figure 18F:
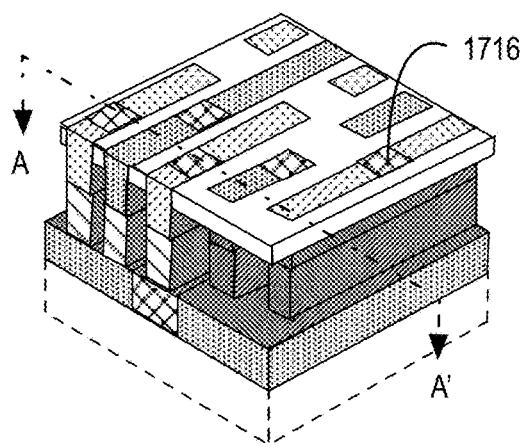
Figure 18G:
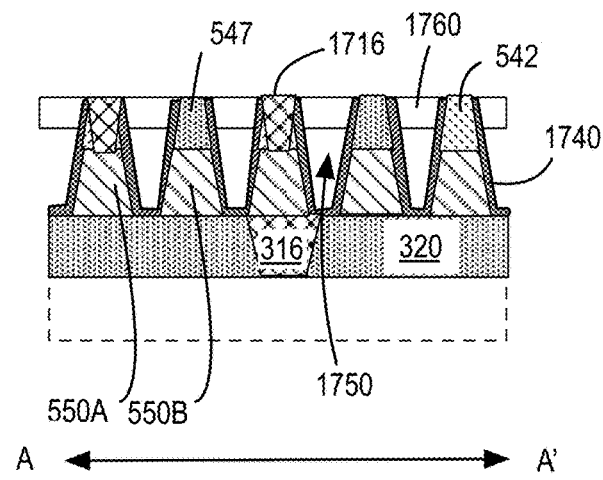
FIG. 18G illustrates a cross-sectional view of the IC interconnect structure shown in FIG. 18F, in accordance with some embodiments.

A second opening patterning process may then be practiced, as further shown in FIG. 18E, to similarly form openings 1545 exposing portions of interconnect features 550B. An etch process selective to cap material features 547 over each of non-conformal dielectric material 1760, cap material features 542, and conformal dielectric material 1740 may reliably pattern via openings without breaking through to air gap 1750. Openings 1540 and 1545 may then be filled and planarized according to any techniques to form interconnect features 1716, which are vias as illustrated in FIG. 18F. A cross-sectional view along the A-A' line illustrated in FIG. 18F is further illustrated in FIG. 18G. As shown in FIG. 18G, the sidewall of vias 1716 are in physical contact with conformal dielectric material 1740. Air gap 1750 is therefore isolated from via 1716 by intervening dielectric material 1740 and/or 1760.

Although a single damascene process is illustrated in FIG. 18D-18F, a dual-damascene process may be similarly practiced. For example, an additional dielectric material may be over the non-conformal dielectric material. Trenches within the additional dielectric material may be filled concurrently with via openings patterned within a bottom of the trench.

Figure 18H:
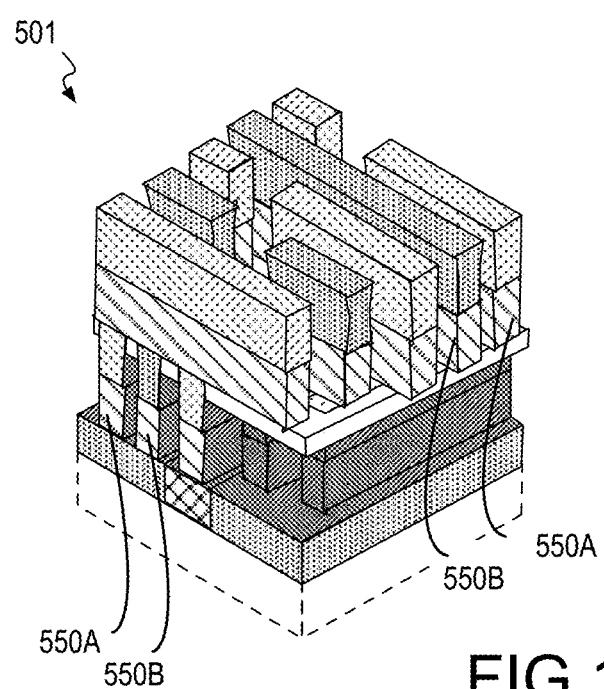
FIG. 18H illustrates an isometric sectional view of an exemplary IC interconnect structure following the practice of the methods illustrated in FIG. 16, in accordance with some embodiments.

Interconnect structure 501, substantially as illustrated in FIG. 18F, may then be further processed (e.g., at output 290 in methods 1601) to include an upper-level of interconnect lines. Upper-level interconnect line fabrication may proceed according to any of methods 401, 801, 1001, 1201 or 1401, for example. FIG. 18H illustrates IC interconnect structure 501 after a second iteration of methods 201 is practiced. As shown, an upper level of interconnect features 550A, 550B have dimensions suitable as interconnect lines that are over the vias in further contact with the lower level of interconnect features 550A, 550B. A second iteration of methods 1601 may then be practiced to air gap isolate the upper-level interconnect lines and fabricated another level of vias. Methods 201 and 1601 may be practiced as two phases of a backend interconnect fabrication cycle that is repeated for any number of backend interconnect levels.

Figure 19D:
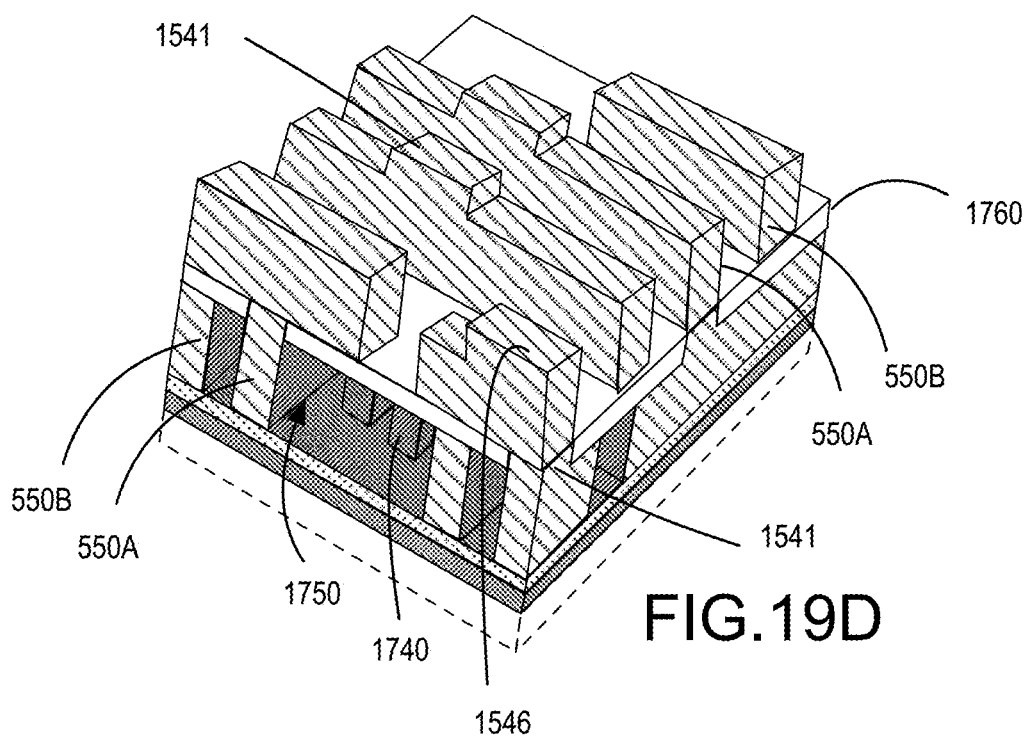
FIG. 19D illustrates an isometric sectional view of an exemplary IC interconnect structure following the practice of the methods illustrated in FIG. 16, in accordance with some slab via embodiments.

As noted above, for embodiments where via patterning and via fill are not practiced as part of methods 1601, the interconnect structure following block 1620 may be substantially complete and ready for the addition of another level of interconnect lines. For example, interconnect structure 1502, as illustrated in FIG. 19D has been further processed through a second iteration of methods 1401 (FIG. 14) to form an upper level of interconnect features 550A, 550B that are over slab vias integral with the lower level of interconnect features 550A, 550B. Accordingly, interconnect structure 1502 further includes upper-level slab vias 1541, 1546. A second iteration of methods 1601 may then be practiced to air gap isolate the upper-level interconnect lines. Methods 1401 and 1601 may also be practiced as two phases of a backend interconnect fabrication cycle that is repeated for any number of backend interconnect levels.

As noted above, interconnect lines may advantageously include a barrier layer, for example where the line composition is susceptible to diffusion/electromigration. In other embodiments where no barrier layer is needed, for example where interconnect line composition is not susceptible to migration, interconnect lines may still benefit from a bottom adhesion layer where the bond between interconnect line material and underlying substrate material (e.g., dielectric) would be weak in absence of an adhesion layer. For example, relative to other transition metals that may be used as a line material, Ru may bond poorly to underlying dielectric material and may therefore benefit from a bottom adhesion layer even if a diffusion barrier is not needed.

For subtractively patterned interconnect lines, interconnect line material layers may include a bottom barrier layer and/or adhesion layer. Additional barrier material may be subsequently deposited upon free sidewall and/or top surfaces of the interconnect lines once patterned. For example, the conformal dielectric material deposited in methods 1601 may, for example, additionally function as an interconnect barrier layer in physical contact with both a top and sidewall of subtractively patterned interconnect lines.

However, the deposition of a bottom barrier and/or adhesion layer upon underlying vias may significantly increase via resistance. Accordingly, in some advantageous embodiments, bottom barrier and/or adhesion material is deposited upon dielectric material preferentially so that little, if any, such material is formed on surfaces of a via. Electrical resistance between the via and an overlying interconnect line may then be lower than if a bottom barrier and/or adhesion material was blanket deposited upon all surfaces including via surfaces. Following the selective deposition of bottom barrier and/or adhesion material, the interconnect line material may be blanket deposited.

Figure 20A:
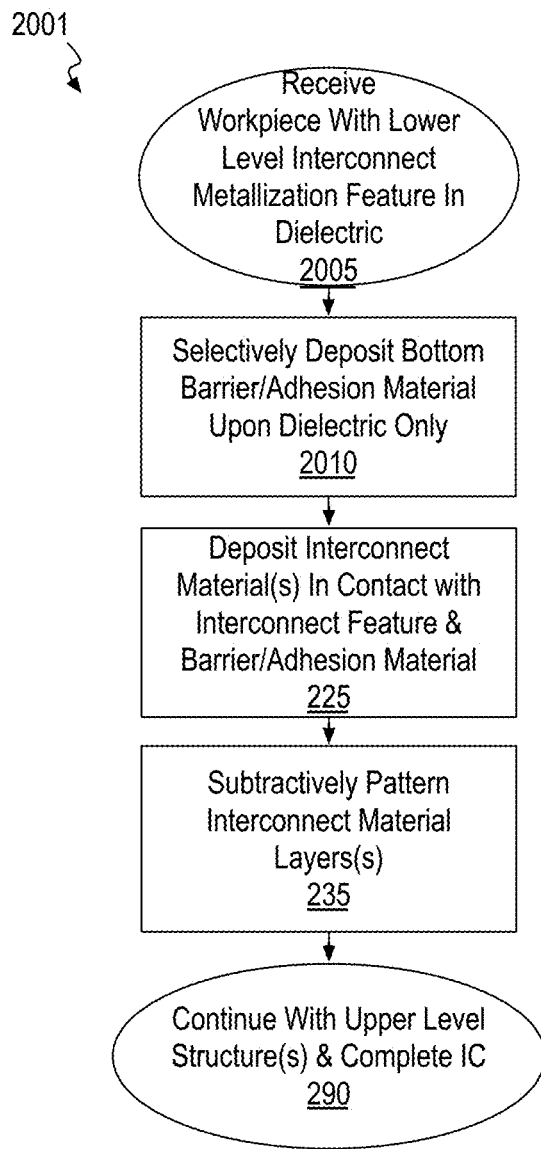
FIG. 20A is a flow diagram illustrating methods for area selective deposition of an interconnect line barrier material of a subtractively patterned IC interconnect structure, in accordance with some embodiments.

FIG. 20A is a flow diagram illustrating methods 2001 for forming interconnect lines over a selectively deposited interconnect line bottom barrier and/or adhesion material, in accordance with some embodiments. Methods 2001 may be incorporated into any of methods 201, 401, 601, 801, 1001, 1201, or 1401, for example. Alternatively, methods 2001 may be incorporated into any other method of subtractive feature patterning suitable for the definition of interconnect lines.

Methods 2001 begin at input 2005 with receipt of a workpiece, such as a semiconductor wafer having a working surface including a lower-level feature, such as a via, embedded within a dielectric material. Such a structure may be generated, for example, by practicing one or more blocks of the methods described above. For example, blocks 210, 215, 220 (e.g., FIG. 2) may be performed upstream of methods 2001. Hence, the interconnect feature composition, as well as the dielectric material composition, may be any of those described above.

At block 2010, one or more processes sensitive to surface termination chemistry of may be employed to deposit an interconnect bottom barrier and/or adhesion material upon the dielectric material surfaces preferentially relative to any exposed interconnect feature surfaces. For such an area-selective deposition, the barrier and/or adhesion layer is to be deposited within growth areas comprising dielectric material, while deposition is retarded or completely prevented within non-growth areas comprising via material.

Figure 21A:
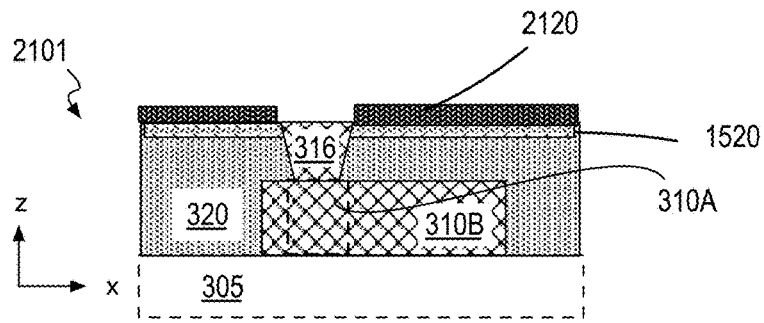
FIGS. 21A, 21B, 21C illustrates cross-sectional views of an interconnect structure evolving during the practice of the methods illustrated in FIG. 20A, in accordance with some embodiments.

FIG. 21A illustrates a cross-sectional view of interconnect structure 2101 that includes an area selective bottom barrier material layer 2110 in direct contact with etch stop layer 1520. In this example, etch stop layer 1520 is compositionally distinct from underlying dielectric material 320. In some specific examples, etch stop layer 1520 comprises a metal and oxygen such as, but not limited to, $HfO_2$, $ZrO_2$, and $Al_2O_3$. Interconnect feature 316 may again have any composition described elsewhere herein, such as a transition metal (e.g., Cu, W, Ru, Co, Mo, W, Ir, Rh, or Pt). A barrier/adhesion material layer 2120 is in physical contact with etch stop layer 1520. However, barrier/adhesion material layer 2120 is substantially absent from the exposed surface of interconnect feature 316.

In some embodiments of methods 2001 (FIG. 20A), at block 210 the bottom barrier and/or adhesion layer is selectively deposited by a chemical deposition process (e.g., ALD) following a monolayer self-assembly (SAM) process that renders interconnect feature surfaces less suitable for participating in a reaction with a deposition precursor. Many SAM processes based on heterogeneous surfaces are known. For example, a SAM process may form a monolayer upon hydrophilic surfaces, which are typical for interconnect materials (e.g., metals), preferentially relative to hydrophobic surfaces, which are typical for dielectric materials (e.g., oxides). Following the SAM process, the barrier and/or adhesion material, such as a metal nitride, may be deposited (e.g., by ALD or a liquid phase technique) upon the hydrophobic surfaces while the interconnect material surfaces are passivated by the SAM.

Figure 20B:
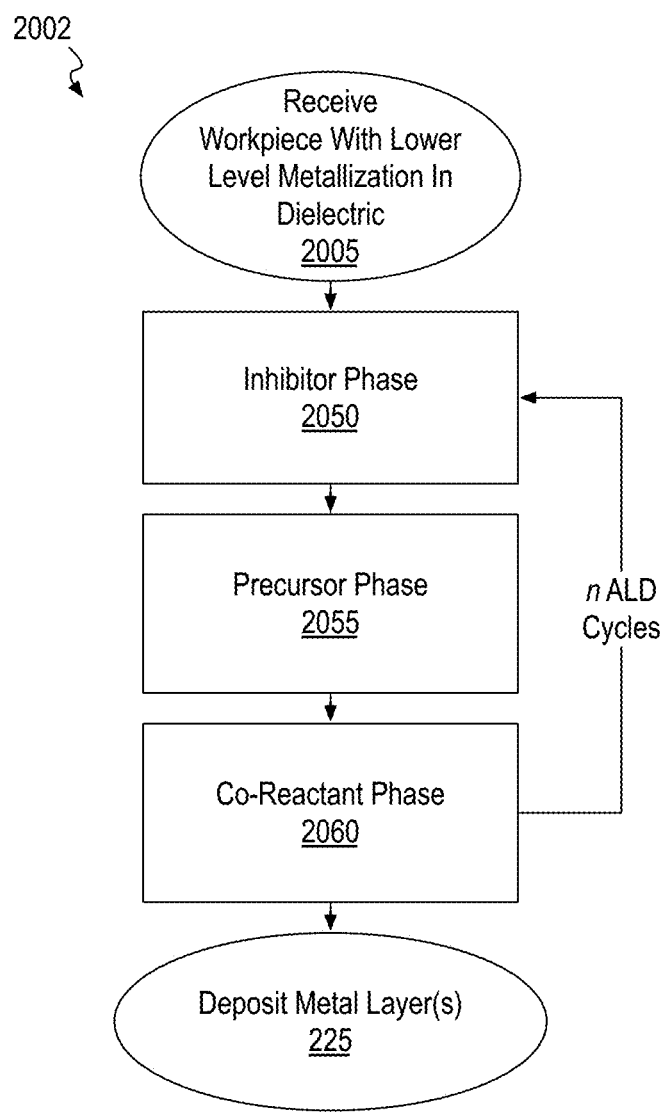
FIG. 20B is a flow diagram illustrated methods for area selective atomic layer deposition, in accordance with some embodiments.

In other embodiments of methods 2001 (FIG. 20A), an area selective ALD process is practiced at block 210 where an inhibitor phase is included in the ALD cycle. FIG. 20B is a flow diagram illustrating methods 2002 for selectively depositing interconnect barrier material with an area selective ALD process, in accordance with some embodiments. Methods 2002 may be practiced at block 2010 of methods 2001, for example as an alternative to a SAM-based technique.

In methods 2002, the workpiece received at input 2005 is exposed to a multi-phased ALD process beginning with an inhibitor phase 2050. During inhibitor phase 2050, via material (e.g., metal) surfaces are preferentially passivated with an inhibitor molecule that will retard the adsorption of a deposition precursor introduced in the subsequent precursor phase 2055. The inhibitor chemistry may vary with implementation as a function of the of via the material present on the workpiece and/or as a function of the precursor that is to be introduced. In some embodiments, where deposition of a barrier and/or adhesion material relies on an electrophilic precursor, an inhibitor molecule introduced during the inhibitor phase may render a metallic interconnect (e.g., via) surface less nucleophilic, which will retard any lewis-base surface reaction with a deposition precursor, thereby inhibiting material deposition.

In one exemplary embodiment, during inhibitor phase 2050, an aromatic molecule, such as an aniline ($C_6H_5NH_2$) derivative, is introduced to the ALD chamber, for example in the vapor phase. Because many aromatic molecules display strong adsorption upon transition metal surfaces, they will deposit upon a metal via surface at a much higher rate than upon certain dielectric material surfaces, particularly metal oxides such as, but not limited to $HfO_2$, $ZrO_2$, and $Al_2O_3$. A duration of inhibitor phase 2050 may be set to ensure a passivation of the interconnect material surface without passivation of the dielectric material surface.

During precursor phase 2055, a precursor of a metal suitable as a barrier and/or adhesion material is introduced into the ALD chamber. In some embodiments, a tantalum precursor, such as, but not limited to, Pentakis(dimethylamido)tantalum, is introduced during precursor phase 2055. As noted above, Ta, and more specifically TaN, can function as a good diffusion barrier of many interconnect line materials. In other embodiments, for example where an adhesion barrier is desired, a titanium precursor, such as, but not limited to, Pentakis(dimethylamido)titanium, is introduced during precursor phase 2055.

With the precursor molecules adsorbed to uninhibited surfaces of the dielectric material, methods 2002 continue with a co-reactant phase 2060. During the co-reactant phase, adsorbed precursor molecules are chemically reacted into a solid, such as a metal nitride. For example, a Ta precursor is reacted with a nitride source, such as $NH_3$, to form TaN. As another example, a Ti precursor is reacted with a nitride source, such as $NH_3$, to form TiN. The co-reactant phase may include a plasma, for example to promote chemical reaction at low temperatures. The reducing environment of the co-reactant phase may also induce reactions with inhibitor molecules present on the via surfaces. For example, carbon may be removed from aromatic carbon molecules during the co-reactant phase, and so methods 2002 may cycle back through inhibitor phase 2050 for each additional one of (n) ALD cycles.

Figure 21B:
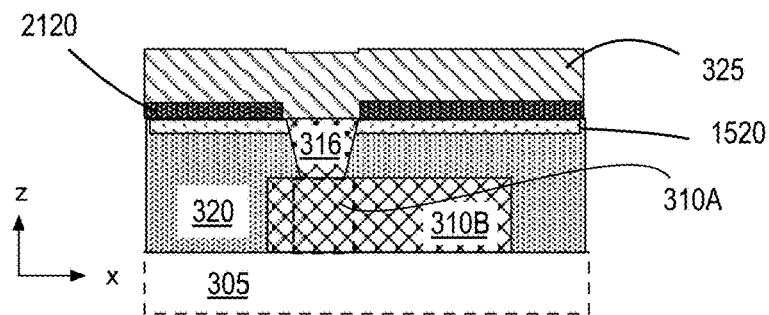
Figure 21C:
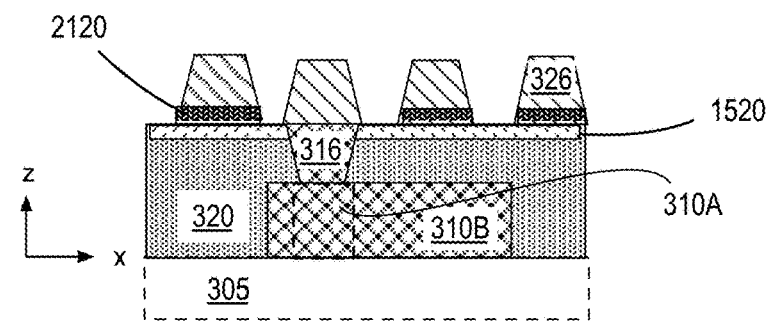

Returning to FIG. 20A with the area-selective barrier/adhesion material layer in place, methods 2001 continue at block 225 where an interconnect material layer is deposited. In the example further illustrated in FIG. 21B, interconnect material layer 325, which may have any of the compositions described elsewhere herein, is in direct physical contact with area selective bottom barrier/adhesion material layer 2120. In the absence of any bottom barrier/adhesion material, interconnect material layer 325 is also in direct physical contact with interconnect feature 316. Both the interconnect material layer(s) and the area-selective bottom barrier/adhesion material layer may then be subtractively patterned at block 235 (FIG. 20A), for example with any suitable etch process(es). As further illustrated in FIG. 21C, the thickness of bottom barrier/adhesion material layer 2120 is etched through to electrically isolated adjacent interconnect features (e.g., lines) and expose etch stop layer 1520. There is no bottom barrier/adhesion material layer 2120 below interconnect features 326 only within the area of interconnect feature 316.

Figure 22:
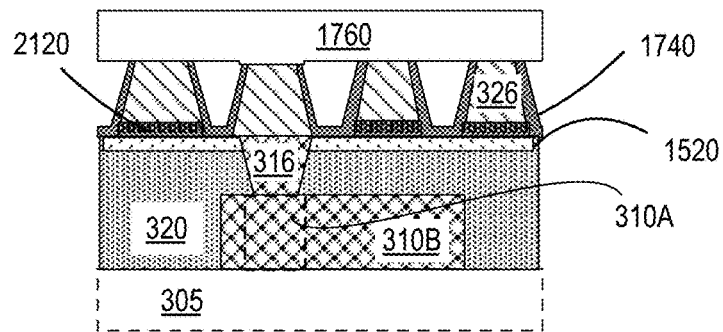
FIG. 22 illustrates a cross-sectional view of an interconnect structure including an area selective bottom barrier and air gap isolation, in accordance with some embodiments.

Any upper-level structures may be fabricated at output 290 to complete methods 2001. In some exemplary embodiments where an interconnect feature is susceptible to migration, an additional barrier material is deposited over free surfaces of the interconnect features to fully enclose the features within barrier material. Any additional barrier material deposited, for example on a sidewall and/or top surface of the interconnect features, may have the same composition as the bottom barrier/adhesion material layer, or may have a different composition. FIG. 22 illustrates an example where the air gap isolation method 1201 is practiced in conjunction with the bottom barrier formation method 200. For such embodiments, conformal dielectric material 1740 may further function as additional sidewall barrier material supplementing bottom barrier/adhesion material layer 2120.

Figure 23A:
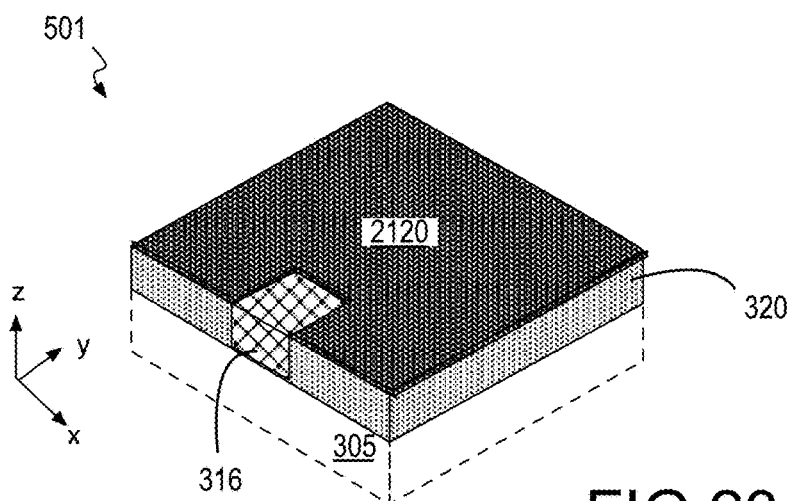
FIGS. 23A and 23B illustrate isometric sectional views of an interconnect structure evolving during the practice of the methods illustrated in FIG. 20A, in accordance with some embodiments.
Figure 23B:
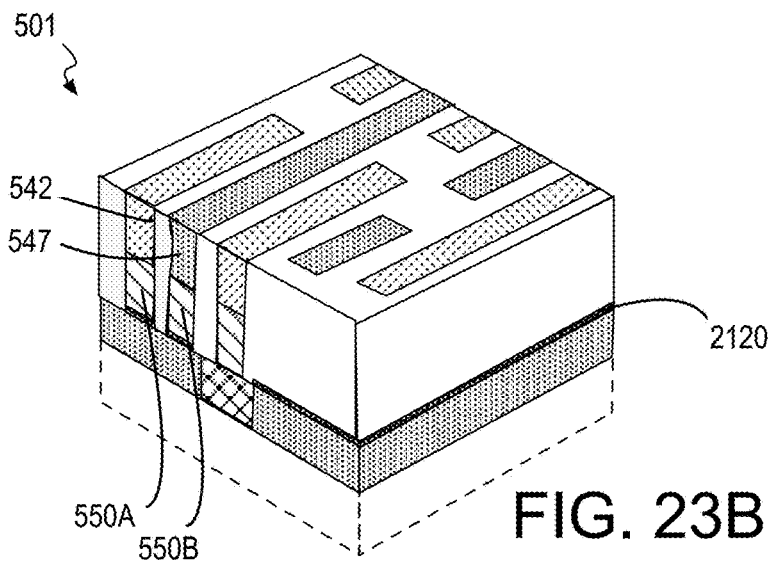
Figure 24:
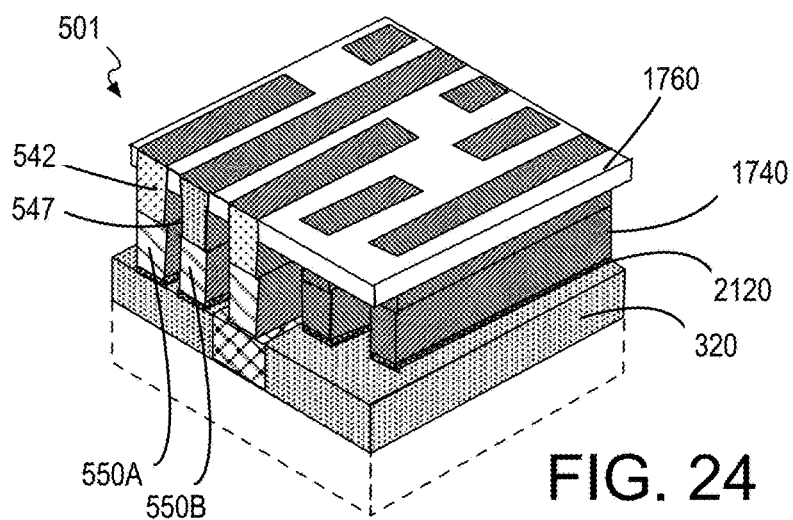
FIG. 24 illustrates an isometric sectional view of an interconnect structure including an area selective bottom barrier and air gap isolation, in accordance with some embodiments.

FIGS. 23A, 23B and 24 further illustrate section isometric views of an exemplary embodiment where an area-selective bottom barrier/adhesion layer is integrated into interconnect structure 501, which further includes multi-color cap material. As shown in FIG. 23A, bottom barrier/adhesion material layer 2120 may be deposited with an area-selective deposition technique, for example according to methods 2001. Colinear lines of cap material 542 and interconnect features 550A interdigitated with colinear lines of cap material 547 and interconnect features 550B may be subtractively patterned over bottom barrier/adhesion material layer 2120 (e.g., substantially as described above for methods 401) to arrive at the interconnect structure illustrated in FIG. 23B. Methods 1601 may also be practiced in conjunction with methods 2001, for example to arrive at the interconnect structure as illustrated in FIG. 24 where conformal barrier layer 1740 also supplements bottom barrier/adhesion material layer 2120.

Figure 25:
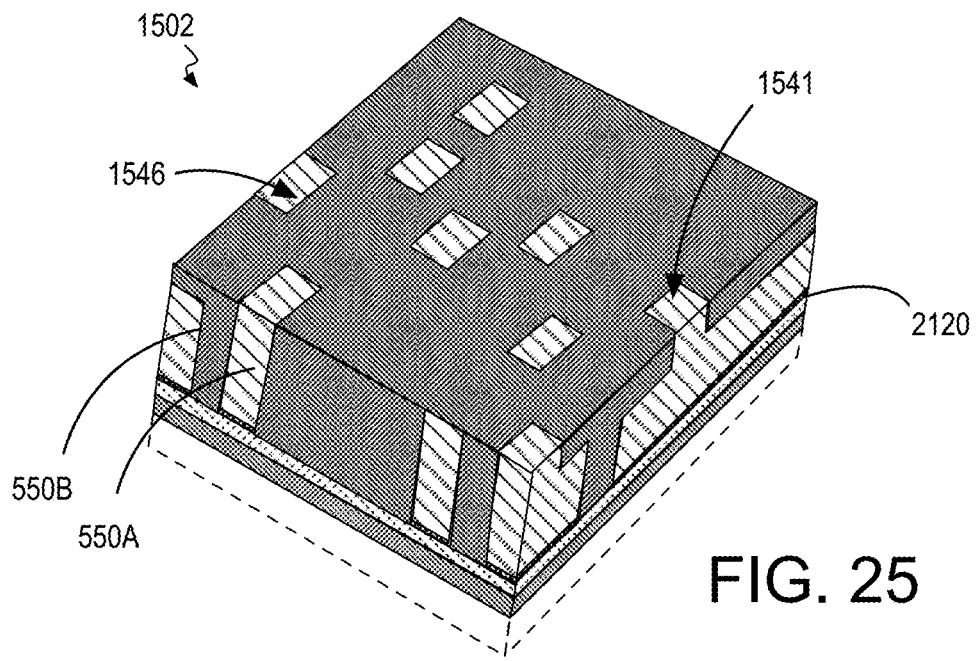
FIG. 25 and FIG. 26 illustrate isometric sectional views of an interconnect structure including an area selective bottom barrier and air gap isolation, in accordance with some embodiments.
Figure 26:
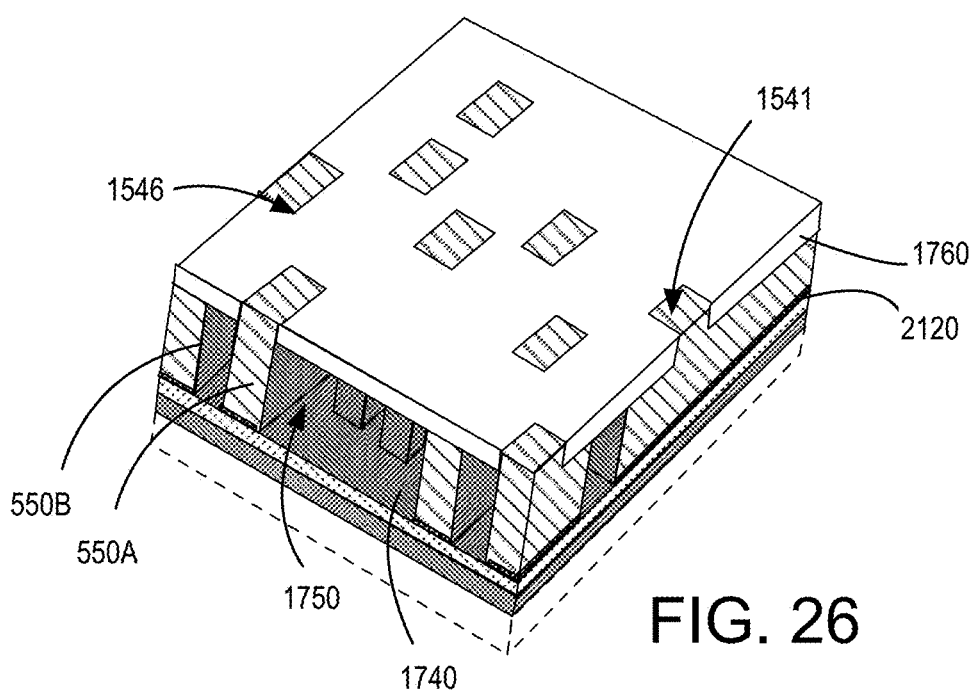

FIG. 25 illustrates another embodiment of interconnect structure 1501 which includes interconnect features 550A, 550B integral with slab vias 1541, 1546 that have been subtractively patterned over bottom barrier/adhesion material layer 2120. Hence, methods 2001 may also be integrated with methods 1401. Methods 1601 may also be practiced in conjunction with methods 2001, for example to arrive at the interconnect structure as illustrated in FIG. 26 where conformal barrier layer 1740 again supplements bottom barrier/adhesion material layer 2120.

Interconnect line passivation materials may be applied after sidewalls of interconnect features are exposed during subtractive patterning. These passivation materials may function as line diffusion barriers and/or as a physical separation between interconnect material and an air gap. Area selective formation techniques may be utilized where the interconnect feature passivation is conductive, for example to avoid electrical shorts between interconnect features. In accordance with some embodiments, the passivation material is a two-dimensional (2D) material that is deposited upon, or otherwise formed within, interconnect features subsequent to their subtractive patterning. 2D materials are atomically thin materials that, despite being so thin, are contiguous and do not suffer from pinholes and other failures associated with reducing the thickness of an amorphous thin film material below some physical threshold.

Figure 27:
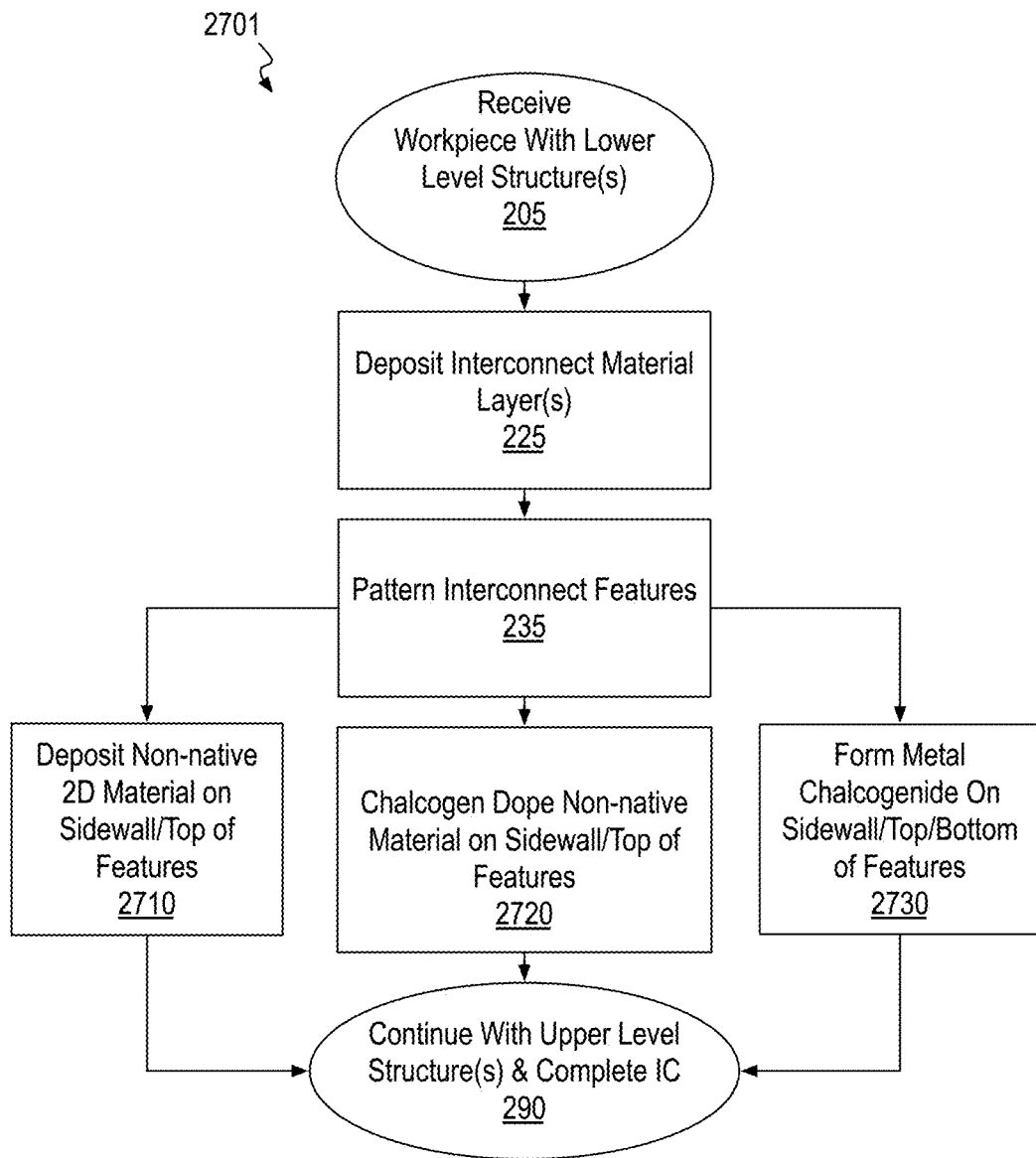
FIG. 27 is a flow diagram illustrating methods for passivating interconnect lines, in accordance with some embodiments.

FIG. 27 is a flow diagram illustrating methods 2701 for passivating interconnect features with area selective techniques, in accordance with some embodiments. Methods 2701 may be incorporated into any of methods 201, 401, 601, 801, 1001, 1201, 1401, 1601, or 2001, for example. Alternatively, methods 2701 may be incorporated into any other method of subtractive line patterning.

Methods 2701 begin at input 205 with receipt of a workpiece, such as a semiconductor wafer, which may have been generated by practicing one or more blocks of any of the methods described above, or by any other alternative technique(s). Methods 2701 continue at blocks 225 and 235 where interconnect material is deposited and subtractively patterned, for example according to any of the techniques described above, or by any other alternative technique(s). While the interconnect material deposited at block 225 may be of any composition, in some exemplary embodiments the composition is one which is susceptible to diffusion or outmigration such that an interconnect barrier material is advantageous. Although methods 2701 may be practiced to form such a barrier material, methods 2701 may also be practiced where there are other advantages to passivating surfaces of interconnect features with 2D materials. For example, formation of a 2D material, such as graphene, may significantly improve the conductivity of an interconnect line. The formation of a 2D material on an interconnect feature may also function as an etch stop layer, protecting the feature from a subsequent patterning process (e.g., an upper-level via etch).

Following the feature patterning at block 235, interconnect features may already include a top barrier and/or a bottom barrier. For example, the interconnect material deposited at block 225 may include multiple material layers that include one or both of a top and bottom barrier material. In other examples, the workpiece received at block 205 may include an area selective barrier or etch stop layer. For embodiments where an interconnect material stack includes one or more of a top and bottom barrier material, methods 2701 may be practiced to passivate the remaining surfaces (e.g., sidewalls) of the interconnect features. In other embodiments, where an interconnect feature lacks one or both of a top and bottom barrier material, methods 2701 may be practiced to passivate all surfaces (and interfaces) of the interconnect feature.

Methods 2701 may proceed along any of three pathways for passivating the interconnect feature. In some embodiments, methods 2701 continue at block 2710 where a non-native 2D material is deposited, or grown, upon an exposed sidewall and/or top of an interconnect feature. The non-native 2D material formed has a composition completely different than that of the interconnect feature upon which the 2D material is deposited, and a three-sided growth will yield an interconnect feature that has a passivation material of a single composition on three of its sides. A barrier material on a forth (bottom) side may then be of a second composition. Block 2710 may be practiced where a 2D material can be deposited or grown directly upon interconnect feature surfaces.

In other embodiments, methods 2701 continue at block 2720 where a non-native material is first deposited or grown upon an exposed sidewall and/or top of an interconnect feature. That non-native material, as a seed or precursor material, is then doped with a chalcogen, to improve barrier properties of the non-native material. Block 2720 may be practiced to achieve a minimal barrier material thickness, for example to improve barrier properties of a non-native material layer at a given thickness.

In other embodiments, methods 2701 continue at block 2730 where a native interconnect passivation is formed from one or more constituents in the interconnect material, for example by reacting a constituent of the interconnect material with a chalcogen dopant. Block 2730 may be practiced to self-passivate an interconnect feature comprising a metal that forms a suitable chalcogenide, thereby converting a portion of the interconnect feature into a passivation layer. Following formation of the 2D material on the interconnect lines by one of blocks 2710, 2720 or 2730, methods 2701 may complete at output 290 with the fabrication of any upper-level structure (e.g., vias, lines, air-gap isolation, etc.).

Figure 28A:
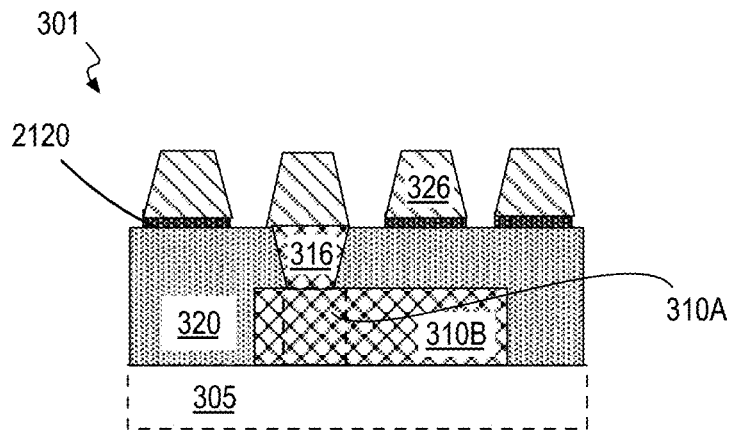
FIG. 28A and FIG. 28B illustrate cross-sectional views of an interconnect structure evolving during the practice of the methods illustrated in FIG. 27, in accordance with some embodiments.

FIG. 28A illustrates a cross-sectional view of interconnect structure 301, which includes interconnect features 326 over dielectric material 320. In this example, area-selective bottom barrier material 2120 is between interconnect features 326 and dielectric material 320, but is absent from the interface of interconnect feature 316 and interconnect line 326. Bottom barrier material 2120 may have been formed by methods 2002, for example, or an alternative technique may have been practiced.

Figure 28B:
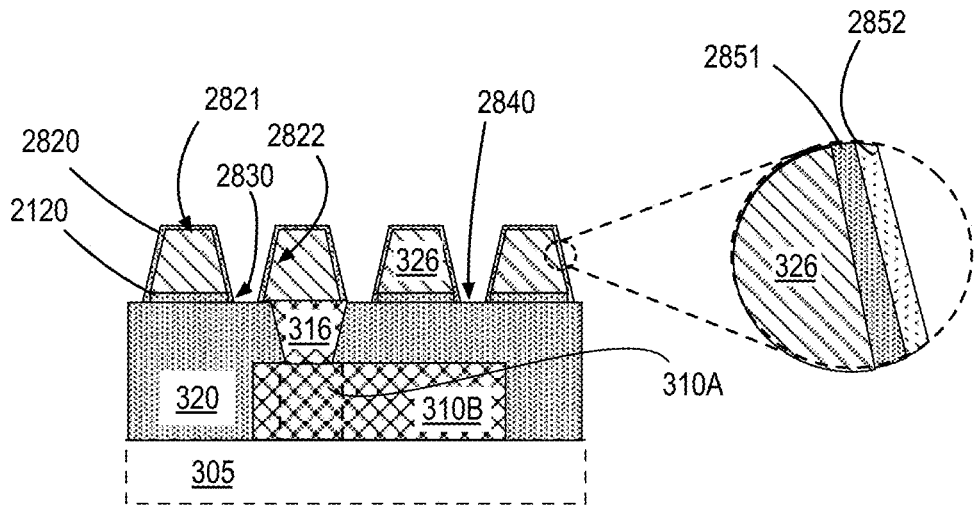

As further illustrated in FIG. 28B, an interconnect passivation material 2820 is in physical contact with both a top surface 2821 and sidewall surface 2822 of interconnect features 326. In accordance with some embodiments, interconnect passivation material 2820 has a thickness of only a few monolayers, for example with a first atomic species in a first monolayer, a second atomic species in a second monolayer, a third atomic species in a third monolayer, etc. More than one atomic species may also be interspersed at different 2D lattice sites within a single monolayer. Although the number of monolayers is not limited to a single monolayer, in accordance with exemplary embodiments herein, interconnect passivation material 2820 has a thickness less than 2 nm, and advantageously less than 1 nm. Interconnect passivation material 2820 may therefore have a thickness of significantly less than 10 monolayers (e.g., two, three, or four monolayers).

In accordance with some embodiments, interconnect passivation material 2820 has crystalline structure (i.e., long range atomic ordering) within a 2D plane of the material monolayer(s). The crystalline structure, along with the atomic species participating in the crystalline structure, may impart interconnect passivation material 2820 with a band gap that renders the material an electrical conductor, semiconductor, or insulator. In some examples, interconnect passivation material 2820 has hexagonal crystal structure. The c-plane may be substantially in the plane of the 2D monolayer(s), for example. Interconnect passivation material 2820 may have inversion symmetry, or not, depending on whether there is asymmetry in the atomic species between adjacent monolayers. Notably, the crystalline structure of interconnect passivation material 2820 in accordance with embodiments herein need not be monocrystalline, but may instead be polycrystalline with discontinuities extending through the monolayers to define grain boundaries where the crystalline order within one grain of interconnect passivation material 2820 is disrupted. In some exemplary embodiments, individual grains within interconnect passivation material 2820 all have the full thickness of the interconnect passivation material 2820 with no two grains being stacked one atop the other. Hence, even when polycrystalline, each grain is two-dimensional, and the multi-grained 1 passivation material remains two-dimensional.

Interconnect passivation material 2820 may have been formed by any of blocks 2710, 2720 or 2730 in methods 2701 (FIG. 27). The chemical composition and/or microstructure of interconnect passivation material 2820 may vary according to the different embodiments of methods 2701. One or more analysis techniques (e.g., XPS, XRD, or TEM) may be employed to characterize interconnect passivation material 2820. For example, the composition and/or microstructure of interconnect passivation material 2820 may be readily apparent with such analysis techniques.

In some embodiments, interconnect passivation material 2820 is graphene. Crystalline graphene may be grown upon exposed surfaces of interconnect lines (e.g., at block 2710) according to a number of techniques with one example being electroless deposition (ED). The composition of interconnect features 326 (FIG. 28B) may be selected as suitable for nucleation of a graphene passivation layer. ED of graphene is possible on interconnect lines comprising predominantly Cu or Ru, for example. Graphene is also suitable as a diffusion barrier of copper interconnect features. During an ED process, one or more redox reactions may be performed in a wet chemical bath to form graphene crystals selectively upon metal nucleation sites with little to no interconnect passivation material 2820 forming on dielectric material 320 between interconnect features 326.

In other embodiments where the composition of interconnect features 326 is not suitable for nucleating graphene, a seed layer (not depicted) is first deposited upon exposed surfaces of interconnect features 326. Graphene is then grown upon the surface of the seed layer. For example, in an embodiment where interconnect features 326 comprise predominantly other than Cu (e.g., Mo), a seed layer of predominantly Cu may be deposited onto interconnect features 326, covering their sidewall surfaces 2822. The seed layer may be selectively deposited on surfaces of interconnect features 326 (e.g., ED or ALD). Alternatively, the seed layer may be unselectively formed with any blanket deposition (e.g., PVD). A blanket seed layer may then be subtractively patterned, for example to remain only on one or both of interconnect sidewall surface 2822 and top surface 2821. In some advantageous embodiments, the seed layer patterning comprises an anisotropic etch that retains the seed layer on interconnect sidewall surface 2822 (e.g., as a spacer), but removes it from spaces 2840 between adjacent interconnect features 326. For embodiments where the seed layer etch does not remove the seed layer from the interconnect top surface 2821 (e.g., where the interconnect line material included a top layer thickness of the seed layer material that becomes even thicker with a subsequent deposition of seed layer material over sidewalls of the interconnect lines), interconnect passivation material 2820 is 3-sided, as illustrated in FIG. 28B. For other embodiments where the seed layer etch does remove the seed layer from interconnect top surface 2821, interconnect passivation material 2820 may be only 2-sided (i.e., only present on a sidewall surfaces 2822).

Once seed layer area has been defined, graphene may then be grown upon the surface of the seed layer. For these embodiments, interconnect passivation material 2820 may have a multi-layered stack structure with graphene being only one of the layers in the stack, and separated from the interconnect features 326 by the seed layer. In the embodiment illustrated in FIG. 28B, interconnect passivation material 2820 is also present on a sidewall 2830 of bottom barrier material 2120. However, depending on the chemical composition of bottom barrier material 2120, graphene may not be present on bottom barrier material sidewall 2830.

In some embodiments, interconnect passivation material 2820 comprises a metal chalcogenide. Similar to graphene, metal chalcogenides may have a crystalline microstructure that, at least in part, contributes to good line barrier properties even at thicknesses below 2 nm (e.g., 1 nm). Constituents of interconnect features 326 (e.g., Cu) may be unable to traverse such a crystalline barrier. Chalcogens include sulfur, selenium or tellurium (oxygen is excluded).

In some exemplary embodiments, interconnect passivation material 2820 comprises at least sulfur, which has an advantageously high solid phase mobility in most interconnect line materials. The metal chalcogenide may be a dichalcogenide ($MX_2$), but need not be a dichalcogenide because a number of oxidation states are possible such that the resulting compound is better characterized as $M_aX_bY_c$, where M is a metal having some atomic ratio with chalcogenides X and/or Y. The metal M may be any of Sc, Ti, V, Cr, Mn, Fc, Co Ni, Cu, Zn, Y, Zr, Nb, Mo, Tc, Ru, Rh, Pd, Ag, Cd, Ln, Hf, Ta, W, Rc, Os, Ir, Pt, Au, for example.

In some metal chalcogenide embodiments (e.g., at block 2720 of methods 2701), the metal chalcogenide is formed on an interconnect feature by first depositing seed or precursor material layer on surfaces of an interconnect feature (e.g., top interconnect surface 2821 and interconnect sidewall surface 2822 in FIG. 28B). That precursor layer is then exposed to a chalcogen precursor. In other embodiments (e.g., at block 2730 of methods 2701), the metal chalcogenide is formed on an interconnect feature by exposing the feature to a chalcogen precursor that introduces the chalcogen onto at least the surface of the interconnect feature. For each of these two embodiments, the workpiece may be heated to over 100° C. (e.g., 125° C., 150° C., 200° C., or 250° C.) for a predetermined time in the presence a precursor gas. The precursor gas may have various compositions, with some examples including $H_2S$, $H_2Se$, $H_2Te$. As these examples can also act as strong reducing agents, they may be combined or replaced with weaker reducing agents/stronger oxidizing agents. For example, in some embodiments $SO_2$ or $SeO_2$ is introduced in combination with, or to the exclusion of, $H_2S$ or $H_2Se$, respectively. Gases lacking oxygen temper the reducing strength somewhat less than those that introduce oxygen. Other gases, such as, $NH_3$, $N_2$, Ar, $N_2O$, or $S_xO_y$, $Se_xO_y$, $Te_xO_y$ with x or y being 1, 2 (e.g., $SO_2$, $SeO_2$) or 3, or $SF_z$, $Se_z$ or $Te_z$ with z either 4 or 6 (e.g., $SF_6$, $TeF_6$) may also be introduced in combination with one or more of $H_2S$ and, $H_2Sc$ and or $H_2Te$.

In some further embodiments, at least a portion of a seed or precursor material (e.g., deposited at block 2720) comprising Ta is converted into a metal chalcogenide. The precursor material may be deposited, for example with an ALD process, and may be co-reacted with another constituent, such as, but not limited to, nitrogen. Above some minimum threshold thickness of around 3-5 nm, TaN is a suitable barrier for interconnect lines. Below this threshold, TaN becomes unable to prevent diffusion of some interconnect line constituents, such as Cu. An amorphous TaN barrier layer is therefore generally not able to scale into 2D material thickness regimes without becoming a discontinuous film (with pinholes, etc.) and losing its barrier properties. In accordance with some embodiments further illustrated in the expand view of FIG. 28, interconnect passivation material 2820 further comprises a TaN seed layer 2852, which advantageously has an initial thicknesses below the minimum threshold thickness (e.g., 2 nm, and even below 1 nm). Seed layer 2852 is then doped with a chalcogen (e.g., S), which the inventors have found to migrate to the seed layer's interface with interconnect features 326, where an intervening metal chalcogenide layer 2851 can form. Metal chalcogenide layer 2851 may advantageously have a thickness below 1 nm (as a 2D layer) with good line diffusion barrier properties. For these embodiments, interconnect passivation material 2820 may again have a multi-layered stack structure with the metal chalcogenide being only one of the layers in the stack, which separates the interconnect features 326 from any unreacted portion of the seed layer.

At lower levels of chalcogen doping, chalcogen concentration within seed layer 2852 segregates to become greater within a metal chalcogenide layer 2851 than within seed layer 2852. At higher levels of chalcogen doping, crystallinity of metal chalcogenide layer 2851 increases as nitrogen is displaced and the material transitions (e.g., from TaN:S to TaSx). At these higher concentrations, the concentrations of chalcogen and nitrogen are distinct from their concentrations in seed layer 2852. The microstructure of metal chalcogenide layer 2851 also becomes distinct from the amorphous seed layer 2852.

Similar to a seed layer employed for graphene growth, a seed layer enlisted as a precursor for a metal chalcogenide reaction may be formed by an area selective deposition (ASD) technique to limit the seed layer only to surfaces of interconnect features 326. Alternatively, the seed layer for metal chalcogenide reaction may be unselectively formed with any blanket deposition technique. A blanket seed layer may be patterned, for example to remain only on one or both of interconnect sidewall surface 2822 and interconnect top surface 2821. Once the area of the seed layer has been defined, the seed layer may be reacted with the chalcogen source to form the intervening metal chalcogenide layer 2851. In embodiments where the seed layer etch does not remove the seed layer from interconnect top surface 2821, (e.g., if the interconnect material includes a top layer thickness of the seed layer material that becomes even thicker with a subsequent deposition of seed layer material over sidewalls of the interconnect lines), interconnect passivation material 2820 is 3-sided, as illustrated in FIG. 28B. For other embodiments where the seed layer etch does remove the seed layer from interconnect top surface 2821, interconnect passivation material 2820 is only 2-sided (i.e., only present on an interconnect sidewall surfaces 2822).

Figure 29:
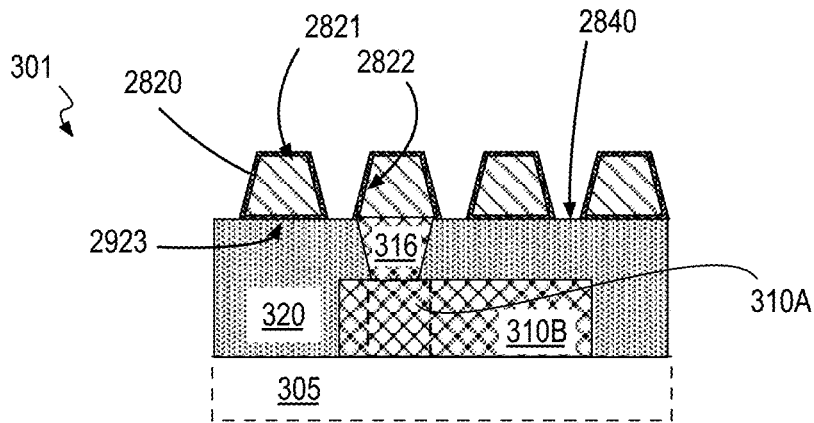
FIG. 29 illustrates a cross-sectional view of an interconnect structure including area selective line passivation material, in accordance with some embodiments.

FIG. 29 further illustrates some alternative embodiments where interconnect passivation material 2820 is a metal chalcogenide natively formed from interconnect features 326 by exposing them to a chalcogen precursor. As for reaction with a seed layer, at higher levels of chalcogen doping, a metal chalcogenide layer of greater crystallinity will form during an anneal as interconnect line material reacts, for example from M:S to $MS_x$. Within regions having these higher concentrations, the microstructure of metal chalcogenide is distinct from that of the interconnect features 326. In some examples where interconnect features 326 are predominantly Cu, passivation 2820 is a Cu chalcogenide, such as, but not limited to $CuS_x$, $CuSe_x$, $CuTe_x$, $CuSe_xS_y$, $CuSe_xTe_y$, etc.). Similar chalcogenides may be formed from other metals described above as being suitable for interconnect features 326 (e.g., Cu, W, Ru, Co, Mo, W, Ir, Rh, Pt, etc.).

In the illustrated example, interconnect passivation material 2820 is present at both the interconnect top surface 2821 and sidewall surface 2822, as well as at the bottom interface 2923. Interconnect passivation material 2820 may form such a bottom barrier because the chalcogen dopant (e.g., S, Se, Te) is able to diffuse through interconnect features 326 and will come to rest in a low energy state at the free surfaces and dielectric material interfaces of interconnect features 326. At sufficient concentration, the chalcogen dopants react (e.g., during thermal anneal) with a constituent of interconnect features 326 to form the native metal chalcogenide passivation material. As further illustrated in FIG. 29, interconnect passivation material 2820 may be absent from the interface with interconnect feature 316 because chalcogen diffusion into and through interconnect feature 316 is expected to be high. The concentration of chalcogen at the interface with interconnect feature 316 will therefore be insufficient to form a metal chalcogenide.

Figure 30:
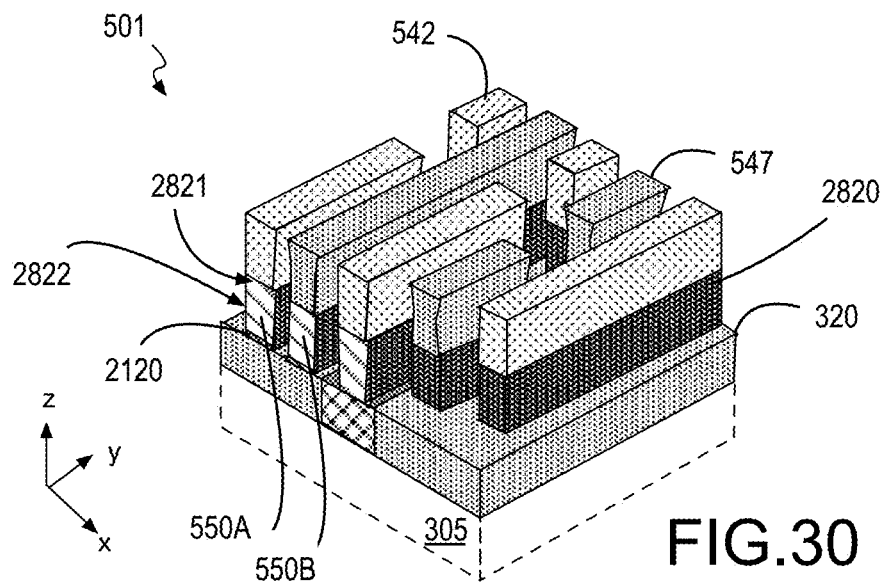
FIG. 30 and FIG. 31 illustrate isometric sectional views of an interconnect structure including line passivation, in accordance with some embodiments.

FIG. 30 further illustrates interconnect structure 501, substantially as described above, with the addition of interconnect passivation material 2820 in accordance with some embodiments. Interconnect structure 501 includes rows of cap material features 542 and 547 in physical contact with top surface 2821 of rows of colinear interconnect features 550A and 550B, respectively. For embodiments where cap material features 542 and 547 are retained, interconnect passivation material 2820 is only on interconnect sidewall surface 2822 (i.e., a 2-sided line passivation implementation). The area-selective bottom barrier material 2120 is between interconnect features 550A and 550B and underlying dielectric 320, for example substantially as described elsewhere herein. In other embodiments, the interconnect material is a non-area selective material stack that includes top and/or bottom barrier materials, which are similarly supplemented by interconnect passivation material 2820 on interconnect sidewall surface 2822. For embodiments where the composition of interconnect features 550A, 550B renders them susceptible to migration phenomena, the combination of bottom barrier material, cap material, and interconnect passivation material may collectively function as interconnect line diffusion barriers.

Figure 31:
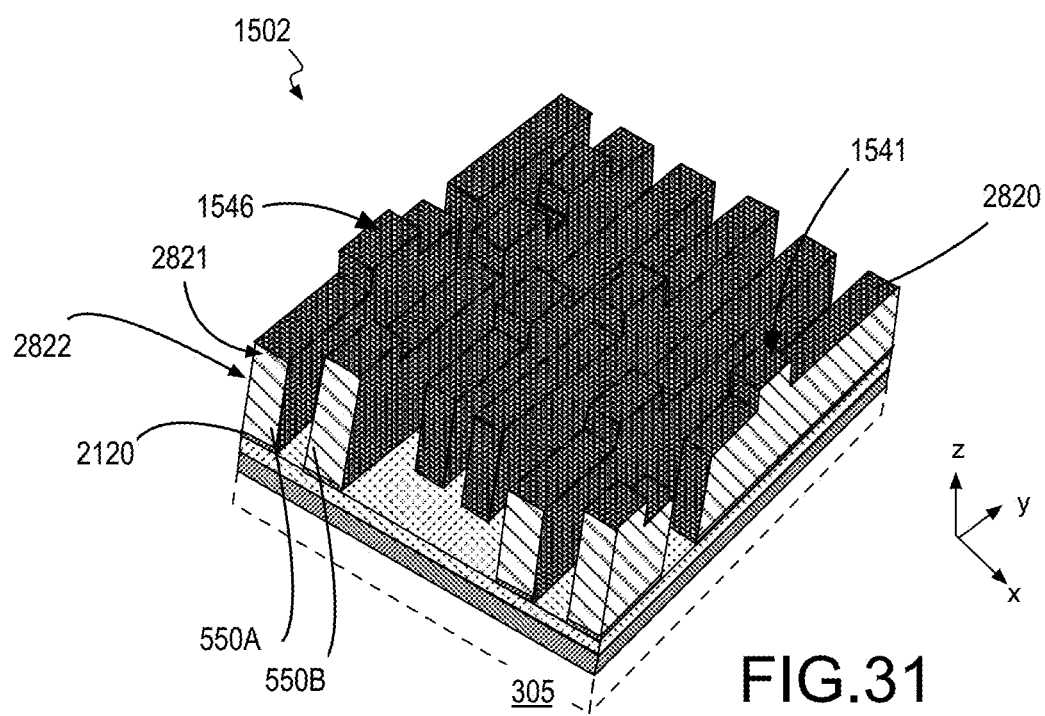

FIG. 31 further illustrates interconnect structure 1502, substantially as described above, with the addition of interconnect passivation material 2820 in accordance with some embodiments. As shown, interconnect passivation material 2820 is on interconnect top surface 2821 and on interconnect sidewall surface 2822. Interconnect passivation material 2820 is also on sidewall surfaces of slab vias 1541, 1546. No interconnect passivation is therefore at the interface between slab vias 1541, 1546 and interconnect features 550A, 550B. In the illustrated example, interconnect passivation material 2820 is a 3-sided passivation integrated with area selective bottom barrier 2120, for example substantially as described above.

Figure 32:
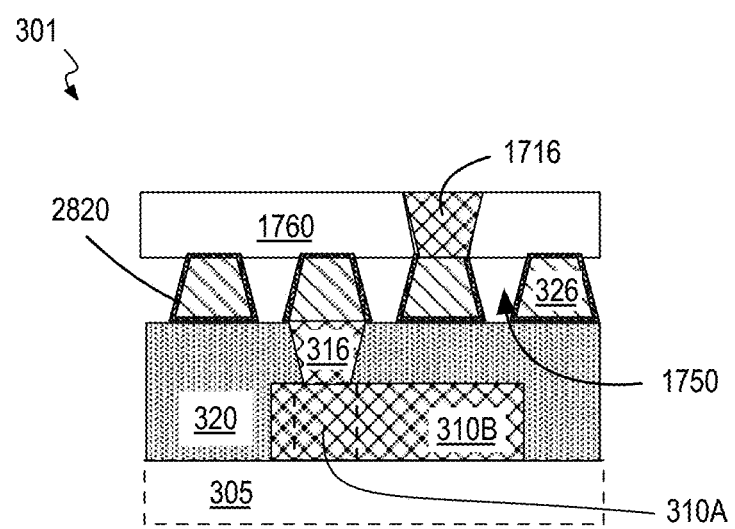
FIG. 32 illustrates a cross-sectional view of an interconnect structure including line passivation material and air gap isolation, in accordance with some embodiments.

Each of the interconnect structures 501 and 1502 may be further integrated with an upper-level structure, which for example includes upper-level interconnect lines that may be interconnected by upper-level vias that pass through cap material features 542, 547, or that may be in direct physical contact with a top surface of slab vias 1546, 1541 (e.g., after interconnect passivation material 2820 is polished or etched back). Each of the interconnect structures 501 and 1502 may also be further integrated with air-gap isolation, for example substantially as described elsewhere herein. Notably, in the presence of interconnect passivation material 2820 a conformal dielectric material in physical contact with surfaces of interconnect features 550A, 550B may not be necessary, simplifying the air gap isolation to only a non-conformal dielectric layer. FIG. 32, for example, further illustrates interconnect structure 301 following both line passivation and air gap isolation methods in accordance with some embodiments. In structure portion 301, interconnect passivation material 2820 is between air gap 1750 and interconnect features 326. Non-conformal dielectric material 1760 is in physical contact with interconnect passivation material 2820.

Interconnect structures including one or more of the structural features described above may be incorporated into any IC circuitry as a portion of any IC chip or die that may be singulated from a workpiece following the completion of any conventional processing not further described herein. Structural features associated with subtractively patterned interconnect lines in accordance with embodiments herein may provide a number of performance and manufacturing advantages, for example as described elsewhere herein. IC circuitry including subtractively patterned interconnect structures in accordance with embodiments herein may, for example, display a lower RC delay and higher overall performance. An IC may also display lower power consumption and lower temperatures for a given level of performance.

Figure 33:
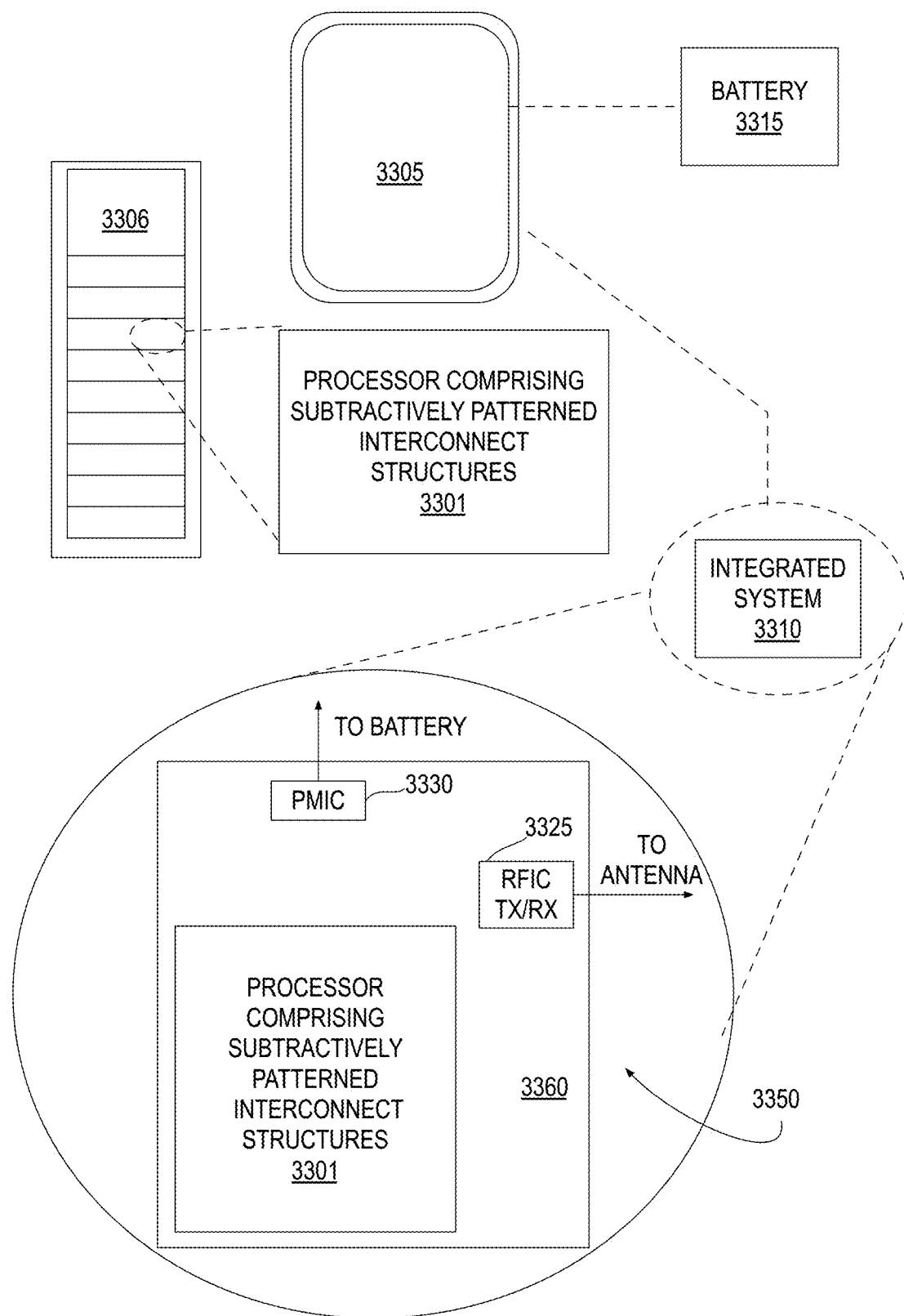
FIG. 33 illustrates a mobile computing platform and a data server machine employing an IC including a subtractively patterned interconnect structure, in accordance with some embodiments.

FIG. 33 illustrates a mobile computing platform 3305 and a data server computing platform 3306 employing an IC including subtractively patterned interconnect structures, for example as described elsewhere herein. The server platform 3306 may be any commercial server, for example including any number of high-performance computing platforms disposed within a rack and networked together for electronic data processing, which in the exemplary embodiment includes a microprocessor 3301 including subtractively patterned interconnect structures, for example as described elsewhere herein.

The mobile computing platform 3305 may be any portable device configured for each of electronic data display, electronic data processing, wireless electronic data transmission, or the like. For example, the mobile computing platform 3305 may be any of a tablet, a smart phone, laptop computer, etc., and may include a display screen (e.g., a capacitive, inductive, resistive, or optical touchscreen), a chip-level or package-level integrated system 3310, and a battery 3315. At least one IC of chip-level or package-level integrated system 3310 includes subtractively patterned interconnect structures, for example as described elsewhere herein. In the example shown in expanded view 3350, integrated system 3310 includes microprocessor 3301 including subtractively interconnect structures, for example as described elsewhere herein. Microprocessor 3350 may be further coupled to a board 3360, a substrate, or an interposer. One or more of a power management integrated circuit (PMIC) 3330, or an RF (wireless) integrated circuit (RFIC) 3325 including a wideband RF (wireless) transmitter and/or receiver (TX/RX) may be further coupled to board 3360.

Functionally, PMIC 3330 may perform battery power regulation, DC-to-DC conversion, etc., and so has an input coupled to battery 3315 and with an output providing a current supply to other functional modules (e.g., microprocessor 3350). As further illustrated, in the exemplary embodiment, RFIC 3325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 34:
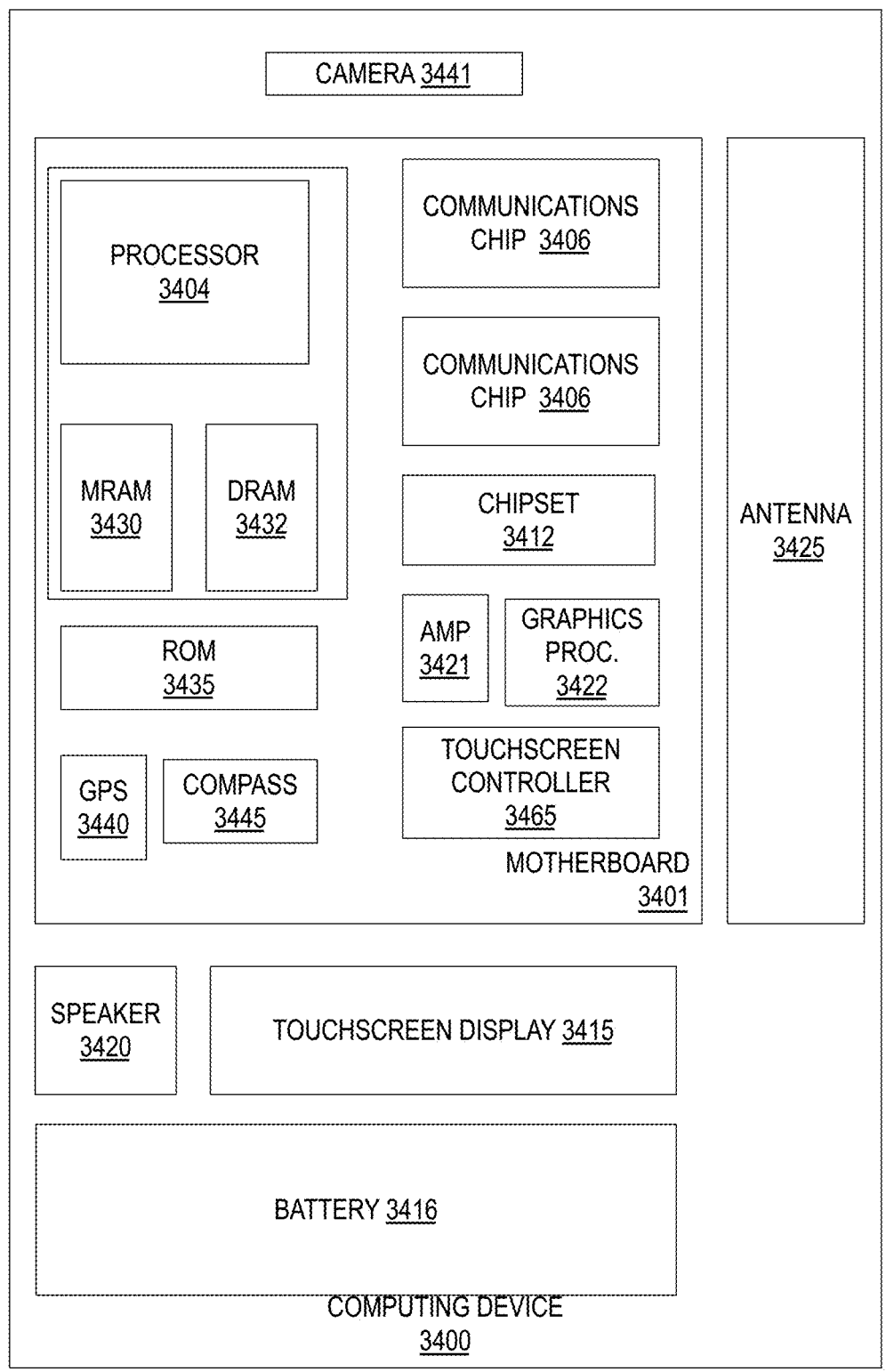
FIG. 34 is a functional block diagram of an electronic computing device, in accordance with some embodiments.

FIG. 34 is a functional block diagram of an electronic computing device 3400, in accordance with an embodiment of the present invention. Computing device 3400 may be found inside platform 3305 or server platform 3306, for example. Device 3400 further includes a motherboard 3402 hosting a number of components, such as, but not limited to, a processor 3404 (e.g., an applications processor). Processor 3404 may be physically and/or electrically coupled to motherboard 3402. In some examples, processor 3404 includes subtractively patterned interconnect structures, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 3406 may also be physically and/or electrically coupled to the motherboard 3402. In further implementations, communication chips 3406 may be part of processor 3404. Depending on its applications, computing device 3400 may include other components that may or may not be physically and electrically coupled to motherboard 3402. These other components include, but are not limited to, volatile memory (e.g., DRAM 3432), non-volatile memory (e.g., ROM 3435), flash memory (e.g., NAND or NOR), magnetic memory (MRAM 3430), a graphics processor 3422, a digital signal processor, a crypto processor, a chipset 3412, an antenna 3425, touchscreen display 3415, touchscreen controller 3465, battery 3416, audio codec, video codec, power amplifier 3421, global positioning system (GPS) device 3440, compass 3445, accelerometer, gyroscope, speaker 3420, camera 3441, and mass storage device (such as hard disk drive, solid-state drive (SSD), compact disk (CD), digital versatile disk (DVD), and so forth), or the like. In some exemplary embodiments, at least one of the functional blocks noted above include subtractively patterned interconnect structures, for example as described elsewhere herein.

Communication chips 3406 may enable wireless communications for the transfer of data to and from the computing device 3400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 3406 may implement any of a number of wireless standards or protocols, including but not limited to those described elsewhere herein. As discussed, computing device 3400 may include a plurality of communication chips 3406. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) structure comprises a substrate comprising a plurality of transistors, and an interconnect structure coupled to the transistors. The interconnect structure comprises rows of first interconnect features, wherein a first end space between an adjacent pair of the first interconnect features has a first misregistration in a first lateral dimension relative to an underlying feature of the IC structure. The interconnect structure comprises rows of second interconnect features coplanar with the first interconnect features. Individual ones of the rows of second interconnect features are between, and parallel with, individual ones of the rows of first interconnect features. A second end space between an adjacent pair of the second interconnect features has a second misregistration in the first lateral dimension relative to the underlying feature of the IC structure. The interconnect structure comprises a dielectric material layer between the first and second interconnect features. At least one of a thickness of the dielectric material layer over a space between the first and second interconnect features is substantially the same as a thickness of the dielectric material adjacent to a sidewall of each of the first and second interconnect features, a top width of individual ones of the first and second interconnect features is smaller than a bottom width of corresponding ones of the first and second interconnect features.

In second examples, for any of the first examples, the top width of individual ones of the first interconnect features is smaller than the bottom width of corresponding ones of the first interconnect features. The top width of individual ones of the second interconnect features is smaller than the bottom width of corresponding ones of the second interconnect features. The first interconnect features comprise a first metal, and the second interconnect features comprise the first metal.

In third examples, for any of the first through second examples, a first cap material is over the first interconnect features. The first cap material has a first composition. A second cap material is over the second interconnect features. The second cap material has a second composition, different than the first composition.

In fourth examples, for any of the third examples the first composition comprises a first dielectric material and the second composition comprises a second dielectric material.

In fifth examples, for any of the fourth examples the first interconnect features are first interconnect lines, the second interconnect features are second interconnect lines. The interconnect structure further comprises a first via over, and in physical contact with, one of the first interconnect lines. The first via extends through the first cap material. The interconnect structure further comprises a second via over, and in physical contact with, one of the second interconnect lines. The second via extends through the second cap material.

In sixth examples, for any of the fifth examples the first via has a third misregistration in the first lateral dimension relative to the underlying structure of the substrate, and the second via has a fourth misregistration in the first lateral dimension relative to the underlying structure of the substrate.

In seventh examples, for any of the third through sixth examples the first composition comprises a second metal, different than the first metal, and the second composition comprises a third metal, different than the first and second metals.

In eighth examples, for any of the first through seventh examples the first metal is at least one of Ru, Co, Mo, W, Ir, Rh, Pt or Cu.

In ninth examples, for any of the first through eighth examples individual ones of the first interconnect features comprise a first interconnect via in contact with a first interconnect line, and individual ones of the second interconnect features comprise a second interconnect via in contact with a second interconnect line.

In tenth examples, for any of the ninth examples a bottom transverse width of the first or second interconnect via is equal to the top transverse width of an underlying one of the first or second interconnect lines.

In eleventh examples, for any of the ninth examples an interface between the first or second interconnect vias and the underlying one of the first or second interconnect lines is substantially rectangular.

In twelfth examples, for any of the ninth examples the first and second vias comprise the first metal.

In thirteenth examples, for any of the eleventh examples, the IC structure further comprises an etch stop layer between the interconnect vias and the interconnect lines, wherein the etch stop layer has a different composition than the interconnect vias.

In fourteenth examples, for any of the eighth examples the first and second interconnect vias comprise a second metal, different than the first metal.

In fifteenth examples, for any of the first through fourteenth examples the first interconnect features comprise first interconnect lines and the substrate comprises first vias under the first interconnect lines. The interconnect structure further comprises second vias over the first interconnect lines.

In sixteenth examples, for any of the fifteenth examples both the first and second vias comprise a second metal.

In seventeenth examples, for any of the fifteenth examples individual ones of the first vias have a top diameter and a bottom diameter, and the top diameter is smaller than the bottom diameter.

In eighteenth examples, for any of the fifteenth examples the first vias comprise a fill metal and a barrier metal on a sidewall of the fill metal.

In nineteenth examples, for any of the eighteenth examples the barrier metal is absent from sidewalls of the first interconnect lines.

In twentieth examples, for any of the fifteenth examples the first interconnect lines are over a substrate dielectric material, and at least one of the first vias or second vias extend through the substrate dielectric material and are in contact with an end of one of the first interconnect lines.

In twenty-first examples, for any of the ninth examples the first and second interconnect lines are over a first dielectric material, and a second dielectric material is between a sidewall of the vias and an adjacent sidewall of the first dielectric material.

In twenty-second examples, for any of the first through twenty-first examples both the first interconnect features and the second interconnect features have a same misregistration within a second dimension, orthogonal to the first dimension, relative to the underlying feature of the IC structure.

In twenty-third examples, for any of the first through twenty-second examples the IC structure further comprises a dielectric material in contact with a sidewall of the first cap material and the first interconnect features, and in contact with a sidewall of the second cap material and the second interconnect features.

In twenty-fourth examples, for any of the first through twenty-third examples the first interconnect features are first vias and the second interconnect features are second vias.

In twenty-fifth examples, an integrated circuit (IC) structure comprises a substrate comprising a plurality of transistors, and an interconnect structure coupled to the transistors. The interconnect structure comprises a via and a dielectric material adjacent to the via. The interconnect structure comprises a line in direct physical contact with the via, wherein the line extends over the dielectric, and wherein a top width of the line is smaller than a bottom width of the line. The interconnect structure further comprises a bottom barrier material between the line and the dielectric material.

In twenty-sixth examples, for any of the twenty-fifth examples the via has a first chemical composition and the line has a second composition, different than the first chemical composition.

In twenty-seventh examples, for any of the twenty-fifth through twenty-sixth examples the bottom barrier material comprises Ta and N.

In twenty-eighth examples, for any of the twenty-fifth through twenty-seventh examples the IC structure further comprises a sidewall barrier material in physical contact with a sidewall of the line. The sidewall barrier material has a different composition than the bottom barrier material.

In twenty-ninth examples, for any of the twenty-eighth examples the sidewall barrier material is in physical contact with a top of the line.

In thirtieth examples, for any of the twenty-eighth through twenty-ninth examples the sidewall barrier material comprises graphene, a metal chalcogenide, a metal oxide, a metallic compound comprising predominantly one of Ta, Co, or Ru, or a dielectric comprising silicon and at least one of nitrogen, or oxygen.

In thirty-first examples, for any of the twenty-eighth examples the line is a first line and the structure further comprises a second line adjacent to the first line, and a second dielectric material over the first line and over the second line, wherein the second dielectric material spans a void between the first line and the second line.

In thirty-second examples, for any of the twenty-eighth examples the second dielectric material is between the void and a sidewall of the first and second lines.

In thirty-third examples, an integrated circuit (IC) structure comprises a substrate comprising a plurality of transistors, and an interconnect structure coupled to the transistors. The interconnect structure comprises a via and a dielectric material adjacent to the via, and a line in direct physical contact with the via. The line extends over the dielectric. A top width of the line is smaller than a bottom width of the line. The interconnect structure comprises a barrier material on a sidewall of the line and between the line and the dielectric material. The barrier material comprises graphene or a metal chalcogenide.

In thirty-fourth examples, for any of the thirty-third examples the barrier material is also on a top of the line.

In thirty-fifth examples, for any of the thirty-third through thirty-fourth examples the metallization line comprises at least one of Cu, W, Ru, Co, Mo, W, Ir, Rh, or Pt.

In thirty-sixth examples, for any of the thirty-fifth examples the barrier material comprises the Cu, W, Ru, Co, Mo, W, Ir, Rh, or Pt and at least one chalcogen.

In thirty-seventh examples, for any of the thirty-third through thirty-sixth examples the via has a different composition than the line.

In thirty-eighth examples, for any of the thirty-third through thirty-seventh examples the IC structure further comprises a bottom barrier material, wherein the bottom barrier material has a different composition than the sidewall barrier material.

In thirty-ninth examples, for any of the thirty-eighth examples the sidewall barrier material comprises graphene and the bottom barrier material comprises a metal chalcogenide, a metal oxide, a metallic compound comprising predominantly one of Ta, Co, or Ru, or a dielectric comprising silicon and at least one of nitrogen, or oxygen.

In fortieth examples, a computer platform comprises a power supply, and the IC structure of any one of first through thirty-ninth examples coupled to the power supply.

In forty-first examples, a method of forming an integrated circuit (IC) interconnect structure comprises depositing a metal over a substrate, and forming first lines over the metal. The first lines have a first composition. The method comprises forming second lines over the metal, and between individual ones of the first lines. The second lines have a second composition, different than the first composition. The method comprises segmenting individual ones of the first lines into a plurality of colinear first features, and segmenting individual ones of the second lines into a plurality of colinear second features. The method comprises segmenting colinear first interconnect features by removing the metal exposed between adjacent ends of the first features, and segmenting colinear second interconnect features by removing the metal exposed between adjacent ends of the second features. The method comprises separating the first interconnect features from the second interconnect features by removing the metal exposed between the colinear first features and the colinear second features, and depositing a dielectric material over the first and second interconnect features.

In forty-second examples, for any of the forty-first examples adjacent first ends of a pair of the colinear first interconnect features are spaced apart by a first end spacing, and adjacent second ends of a pair of the colinear second interconnect features are spaced apart by a second end spacing.

In forty-third examples, for any of the forty-second examples the first end spacing is laterally offset from the second end spacing and at least one of the first ends is adjacent to a portion of one of the pair of colinear second interconnect features.

In forty-fourth examples, for any of the forty-first through forty-third examples the segmenting of at least one of the first or second features is subsequent to the separating of the first interconnect features from the second interconnect features.

In forty-fifth examples, for any of the forty-first through forty-fourth examples the separating of the colinear first interconnect features from the colinear second interconnect features is subsequent to the segmenting of at least one of the first or second features.

In forty-sixth examples, for any of the forty-first through forty-fifth examples the segmenting of the first lines comprises a first lithographic patterning of a first cap material, the first lithographic patterning associated with a first misregistration to an underlying structure of the substrate. The segmenting of the second lines comprises a second lithographic patterning of a second cap material, the second lithographic patterning associated with a second misregistration to the underlying structure of the substrate.

In forty-seventh examples, for any of the forty-sixth examples the segmenting of the first features further comprises etching through a portion of the first cap material defined by the first lithographic patterning, and the segmenting of the second features further comprises etching through a portion of the second cap material defined by the second lithographic patterning.

In forty-eighth examples, for any of the forty-first through forty-seventh examples removing the metal comprises etching the metal with an etch process that narrows a top transverse width of individual ones of the first and second interconnect features relative to a bottom transverse width of corresponding ones of the first and second interconnect features.

In forty-ninth examples, for forty-first through forty-eighth examples the first composition comprises a first dielectric material and the second composition comprises a second dielectric material.

In fiftieth examples, for any of the forty-first through forty-ninth examples the first interconnect features are first interconnect lines, the second interconnect features are second interconnect lines, and the method further comprises forming first via by recessing a portion of the metal adjacent to the first via in at least one of the colinear first interconnect lines. The method further comprises forming second via by recessing a portion of the metal adjacent to the second first via in at least one of the colinear second interconnect lines.

In fifty-first examples, for any of the fiftieth examples the method comprises exposing the first via by removing the first features to expose a second portion of the metal in at least one of the first interconnect lines, and exposing the second via by removing the colinear second features to expose a second portion of the metal in at least one of the colinear second interconnect lines.

In fifty-second examples, for any of the forty-first examples the first interconnect features are first interconnect lines, the second interconnect features are second interconnect lines, the first composition comprises a second metal, different than the first metal, and the second composition comprises a third metal, different than the first and second metals. The method further comprises etching a portion of the first lines to form a first via over at least one of the first interconnect lines, and etching a portion of the second lines to form a second via over at least one of the colinear second interconnect lines.

In fifty-third examples, for any of the fifty-second examples the method comprises depositing a dielectric material over the colinear first interconnect lines and adjacent to a sidewall of the first via, and over the colinear second interconnect lines and adjacent to a sidewall of the second via. The method comprises planarizing the dielectric material with the first via and with the second via.

In fifty-fourth examples, for any of the forty-first examples forming the first lines over the metal further comprises depositing a first material having the first composition over the metal, and patterning the first lines with a first lithographic process. Forming the second lines comprises forming spacers on opposite sidewalls of the first lines, depositing a second material having the second composition between adjacent ones of the spacers, and removing the spacers.

In fifty-fifth examples, for any of the forty-first examples the method comprises forming at least one of a second metal, graphene, a metal chalcogenide, a metal oxide, or a dielectric compound in contact with a sidewall of each of the first and second interconnect features.

In fifty-sixth examples, for any of the fifty-fifth examples the method comprises depositing the second metal, and wherein the second metal comprises at least one of Al, Ti, W, Mn, Zn, Ta, or Co.

In fifty-seventh examples, for any of the fifty-fifth examples the method comprises depositing the dielectric compound, and wherein the dielectric compound comprises at least one of silicon, nitrogen or oxygen.

In fifty-eighth examples, for any of the fifty-fifth examples the method comprises planarizing a dielectric material between the first and second interconnect features.

In fifty-ninth examples, for any of the forty-first examples depositing the metal comprises depositing at least one of Cu, W, Ru, Co, Mo, W, Ir, Rh, or Pt.

In sixtieth examples, for any of the fifty-ninth examples depositing the metal further comprises depositing an adhesion layer onto the substrate, the adhesion layer comprising at least one of Ti, W, Mo, or Ta.

In sixty-first examples, for any of the forty-first examples at least one of the first and second compositions comprise at least one of a second metal, a dielectric material, a metal chalcogenide, or graphene.

In sixty-second examples, for any of the forty-first examples the method further comprises depositing a mask material between adjacent ones the first colinear features, and between adjacent ones of the second colinear features. The method comprises patterning the mask material to expose the metal below at least one of the adjacent ones of the first or second colinear features. The method comprises exposing a lower level line by etching a via opening through the metal and through a substrate dielectric material that is below the metal. The method comprises depositing a metal into the via opening, the metal coupled to the lower level line and in physical contact with a sidewall of at least one of the first interconnect features or the second interconnect features.

In sixty-third examples, for any of the forty-first examples the method comprises forming a sidewall barrier material in physical contact with a sidewall of the colinear first interconnect features and in physical contact with a sidewall of the colinear second interconnect features.

In sixty-forth examples, for any of the sixty-third examples forming the sidewall barrier material further comprises depositing at least one of graphene, metal chalcogenide, metal oxide, a metallic compound comprising predominantly one of Ta, Co, or Ru, or a dielectric comprising silicon and at least one of nitrogen, or oxygen.

In sixty-fifth examples, for any of sixty-third examples forming the sidewall barrier material further comprises doping the metal with a chalcogen.

In sixty-sixth examples, for any of the sixty-third examples the method further comprises depositing a bottom barrier material prior to depositing the metal, and depositing of the metal in physical contact with the bottom barrier material.

In sixty-seventh examples, for any of the sixty-sixth example the bottom barrier material has a different composition than the sidewall barrier material.

In sixty-eighth examples, for any of the sixty-sixth examples the depositing of the bottom barrier material further comprises an area selective deposition process that forms the bottom barrier material on dielectric material surfaces at a higher rate than over metallic material surfaces.

In sixty-ninth examples for any of the sixty-eighth examples the deposition process comprises an atomic layer deposition cycle further comprising reacting metallic material surfaces with an inhibitor, reacting dielectric surfaces with a metallic precursor, and reacting the metallic precursor with a co-reactant to form metallic material.

In seventieth examples, for any of the sixty-ninth examples the metallic material comprises Ta and N.

In seventy-first examples, a method of forming an integrated circuit (IC) interconnect structure comprises receiving a substrate comprising a plurality of transistors and a dielectric material over the transistors. The method comprises etching a via opening into a dielectric material. The method comprises forming a via by depositing a conductive material into the via opening. The method comprises planarizing a top surface of the via. The method comprises depositing a metal layer over the substrate. The method comprises subtractively patterning the metal layer into a plurality of interconnect lines. One of the interconnect lines is in physical contact with the via.

In seventy-second examples, for any of the seventy-first examples the metal layer is deposited over the via and patterning the metal layer exposes a portion of the dielectric material between the interconnect lines.

In seventy-third examples, for any of the seventy-first through seventy-second examples subtractively patterning the features further comprises etching the metal layer into a first line in contact with the via, and a second line in contact with the via. Patterning the features further comprises etching through a portion of the via not covered by the first and second lines to bifurcate the via into a first via and a second via. The first via is in contact with the first line, but not in contact with the second line, and the second via is in contact with the second line, but not in contact with the first line.

In seventy-fourth examples, for any of the seventy-first examples the method further comprises depositing a first cap material over the metal layer, depositing a second cap material over the metal layer, subtractively defining first lines in the first cap material, subtractively defining second lines in the second cap material, and etching the metal layer into a first line under the first cap material, and a second line under the second cap material.

In seventy-fifth examples, for any of the seventy-first examples the method further comprises depositing at least one of a second metal, graphene, a chalcogen, or a dielectric compound in contact with a sidewall of each of the first and second lines.

In seventy-sixth examples, for any of the seventy-first through seventy-fifth examples the method comprises planarizing a dielectric material between the first and second lines.

In seventy-seventh examples, for any of the seventy-first through seventy-sixth examples depositing the metal layer comprises depositing at least one of Cu, W, Ru, Co, Mo, W, Ir, Rh, or Pt.

In seventy-eighth examples, for any of the seventy-seventh examples depositing the metal further comprises depositing an adhesion layer onto the substrate, the adhesion layer comprising at least one of Ti, W, Mo, Ta.

In seventy-ninth examples, for any of the seventy-first through seventy-eighth examples the patterning of the metal layer is performed prior to etching the via opening, and the method further comprises depositing the dielectric material over the first and second lines, and etching the via opening further comprises exposing a portion of the first and second lines.

In eightieth examples, a method of forming an integrated circuit (IC), the method comprises receiving a substrate comprising a via and a dielectric material adjacent to the via, and forming a bottom barrier material upon the dielectric material without forming the bottom barrier material on the via. The method comprises depositing a metal layer in contact with the via and the bottom barrier material, and subtractively patterning the metal layer into a plurality of interconnect lines, wherein one of the interconnect lines is in physical contact with the via.

In eighty-first examples, for any of the eightieth examples forming the bottom barrier material further comprises reacting an exposed surface of the via with an inhibitor, reacting a surface of the dielectric material with a metallic precursor to deposit a barrier metal, and reacting the barrier metal with a co-reactant to form a metallic compound in contact with the dielectric material.

In eighty-second examples, for any of the eighty-first examples the barrier metal is Ta and the metallic compound is TaN.

In eighty-third examples, for any of the eighty-first through eighty-second examples the inhibitor comprises an aniline derivative.

In eighty-fourth examples, a method of forming an integrated circuit (IC) comprises receiving a substrate comprising a via and a dielectric material adjacent to the via, depositing a metal in contact with the via and over the dielectric material, and subtractively patterning the metal into a plurality of interconnect lines. One of the interconnect lines is in physical contact with the via. The method comprises forming a sidewall barrier material in physical contact with a sidewall of the interconnect lines. Forming the sidewall barrier material further comprises reacting the metal with a chalcogen, or depositing a barrier metal over the sidewall of the interconnect lines and reacting that barrier metal with a chalcogen.

In eighty-fifth examples, for any of the eighty-fourth examples the metal comprises Cu and reacting the metal with the chalcogen further comprises forming $Cu_xS$ as the sidewall barrier.

In eighty-sixth examples, for any of the eighty-fourth through eighty-fifth examples forming the sidewall barrier material further comprises depositing Ta and doping the Ta with the chalcogen.

In eighty-seventh examples, for any of the eighty-fourth through eighty-sixth examples the metal comprises Cu.

In eighty-eighth examples, a method of forming an integrated circuit (IC) comprises receiving a substrate comprising via and a dielectric material adjacent to the via. The method comprises depositing a metal in contact with the via and over the dielectric material, subtractively patterning the metal into a plurality of interconnect lines. One of the interconnect lines is in physical contact with the via and extends over the dielectric material. The method comprises forming a sidewall barrier material in physical contact with a sidewall of the interconnect lines. Forming the sidewall barrier material further comprises depositing graphene on the sidewall of the interconnect lines without depositing the graphene on a surface of the dielectric material.

In eighty-ninth examples, for any of the eighty-eighth examples the metal comprises at least one of Cu, W, Ru, Co, Mo, W, Ir, Rh, or Pt.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) structure comprising:
a plurality of transistors; and
an interconnect structure coupled to the transistors, wherein the interconnect structure comprises:
a via and a dielectric material adjacent to the via;
a line in direct physical contact with the via, wherein the line extends over the dielectric material, and wherein a top width of the line is smaller than a bottom width of the line, wherein the via has a first chemical composition and the line has a second composition, different than the first chemical composition; and
a bottom barrier material between the line and the dielectric material.

2. The IC structure of claim 1, wherein the line comprises at least a first of Cu, W, Ru, Co, Mo, W, Ir, Rh, or Pt, and wherein the via comprises at least a second of Ru, Co, Mo, W, Ir, Rh, Pt, Al or Cu.

3. The IC structure of claim 1, wherein the bottom barrier material comprises Ta and N.

4. The IC structure of claim 1, further comprising a sidewall barrier material in physical contact with a sidewall of the line, wherein the sidewall barrier material has a different composition than the bottom barrier material.

5. The IC structure of claim 4, wherein the sidewall barrier material is over, and, in physical contact with, a top of the line.

6. The IC structure of claim 4, wherein the sidewall barrier material comprises graphene, a metal chalcogenide, a metal oxide, a metallic compound comprising predominantly one of Ta, Co, or Ru, or a dielectric comprising silicon and at least one of nitrogen, or oxygen.

7. The IC structure of claim 4, wherein the line is a first line, the IC structure further comprises a second line adjacent to the first line, and the IC structure further comprises a second dielectric material over the first line and over the second line, wherein the second dielectric material has a different composition than the sidewall barrier material.

8. The IC structure of claim 7, wherein the second dielectric material spans a void between the sidewall barrier material on the sidewall of the first line and the sidewall barrier material on a sidewall of the second line.

9. The IC structure of claim 8, wherein the second dielectric material is between the void and the sidewall of the first line and the sidewall of the second line.

10. The IC structure of claim 1, further comprising a cap material on a top of the line, wherein the cap material has a different composition than the bottom barrier material.

11. The IC structure of claim 10, wherein the line is a first line and the cap material is a first cap material, the IC structure further comprises a second line, adjacent to the first line, and the IC structure further comprises a second cap material on the second line, wherein the first cap material has a first composition and the second cap material has a second composition, different than the first composition.

12. The IC structure of claim 10, further comprising a sidewall barrier material in physical contact with a sidewall of the line and in physical contact with a sidewall of the cap material.

13. An integrated circuit (IC) structure comprising:
a plurality of transistors; and
an interconnect structure coupled to the transistors, wherein the interconnect structure comprises:
a line extending a length in a first direction, wherein a first portion of the line is under a dielectric material; and
a via adjacent to the dielectric material and comprising a second portion of the line that is taller than the first portion of the line, wherein a top width of the via is smaller than a bottom width of the line that comprises a bottom barrier material.

14. The IC structure of claim 13, further comprising a sidewall barrier material in physical contact with a sidewall of the line, wherein the sidewall barrier material has a different composition than the bottom barrier material.

15. The IC structure of claim 14, wherein the bottom barrier material comprises Ta and N, and wherein the sidewall barrier material comprises graphene, a metal chalcogenide, a metal oxide, a metallic compound comprising predominantly one of Ta, Co, or Ru, or a dielectric comprising silicon and at least one of nitrogen, or oxygen.

16. The IC structure of claim 14, wherein the sidewall barrier material is in physical contact with a sidewall of the line.

17. The IC structure of claim 16, wherein the sidewall barrier material is over, and, in physical contact with the first portion of the line but absent from a top surface of the via.

18. A method, comprising:
- receiving a workpiece with a lower level interconnect metallization feature coplanar with an adjacent dielectric material;
- depositing a bottom barrier material layer upon the dielectric material;
- depositing an interconnect material layer over the lower level interconnect metallization feature and in physical contact with the bottom barrier material layer; and
- subtractively patterning the interconnect material layer and the bottom barrier material layer into an interconnect metallization line.

19. The method of claim 18, the method further comprising depositing a sidewall barrier material upon sidewalls of the interconnect metallization line and over the dielectric material.

* * * * *